United States Patent [19]
Mori et al.

[11] Patent Number: 5,585,309
[45] Date of Patent: Dec. 17, 1996

[54] METHOD OF MAKING SEMICONDUCTOR LASER

[75] Inventors: Kenzo Mori; Tadashi Kimura; Yoshitatu Kawama; Nobuaki Kaneno; Tatuya Kimura; Yuji Okura; Hitoshi Tada, all of Itami, Japan

[73] Assignee: Mitsubishi Denki Kabushiki Kaisha, Tokyo, Japan

[21] Appl. No.: 327,841

[22] Filed: Oct. 17, 1994

Related U.S. Application Data

[62] Division of Ser. No. 58,366, May 10, 1993, Pat. No. 5,390,205.

[30] Foreign Application Priority Data

| May 14, 1992 | [JP] | Japan | 4-148679 |
| Jun. 10, 1992 | [JP] | Japan | 4-177483 |
| Feb. 4, 1993 | [JP] | Japan | 5-017185 |
| Apr. 28, 1993 | [JP] | Japan | 5-102083 |

[51] Int. Cl.$^6$ .................................................. H01L 21/20
[52] U.S. Cl. ............................... 437/129; 148/DIG. 95
[58] Field of Search ......................... 437/129; 148/DIG. 95

[56] References Cited

U.S. PATENT DOCUMENTS

| 4,730,329 | 3/1988 | Yoshida et al. | 372/46 |
| 4,731,791 | 3/1988 | Wilson | 372/48 |
| 4,779,282 | 10/1988 | Ng | 372/46 |
| 4,799,227 | 1/1989 | Kaneiwa et al. | 372/46 |
| 4,972,238 | 11/1990 | Tanaka | 357/17 |
| 4,984,244 | 1/1991 | Yamamoto et al. | 372/461 |

FOREIGN PATENT DOCUMENTS

| 0083697 | 7/1983 | European Pat. Off. |
| 0111650 | 6/1984 | European Pat. Off. |
| 0190737 | 8/1986 | European Pat. Off. |
| 0308017 | 3/1989 | European Pat. Off. |
| 0321294 | 6/1989 | European Pat. Off. |
| 0359542 | 3/1990 | European Pat. Off. |
| 0413567 | 2/1991 | European Pat. Off. |
| 0473443 | 3/1992 | European Pat. Off. |
| 2156584 | 10/1985 | United Kingdom |
| 2200247 | 7/1988 | United Kingdom |

*Primary Examiner*—R. Bruce Breneman
*Assistant Examiner*—Linda J. Fleck
*Attorney, Agent, or Firm*—Leydig, Voit & Mayer

[57] ABSTRACT

A method for fabricating a semiconductor laser includes forming a double heterojunction structure on a first conductivity type semiconductor substrate; forming the double heterojunction structure into a stripe mesa shape by selective etching; successively growing a first conductivity type layer, a second conductivity type current blocking layer, and a first conductivity type current blocking layer on opposite sides of the mesa to embed the mesa; and adding an impurity from a surface of the first conductivity type current blocking layer to form impurity doped regions that electrically separate the second conductivity type current blocking layer from an upper part of the mesa at opposite sides of the mesa.

8 Claims, 43 Drawing Sheets first unavailable current second unavailable current leak path width   203  202   first unavailable current path 203  202   second unavailable current path second unavailable current path

METHOD OF MAKING SEMICONDUCTOR LASER

This disclosure is a division of application Ser. No. 08/058,366, filed May 10, 1993, now U.S. Pat. No. 5,390,205.

FIELD OF THE INVENTION

The present invention relates to a semiconductor laser having an improved current concentration structure. The invention also relates to a method for fabricating the semiconductor laser with a high yield.

BACKGROUND OF THE INVENTION

FIG. 45 is a sectional view illustrating a part of a prior art InP DCBH (Double-Channel Buried-Heterostructure) semiconductor laser disclosed in, for example, Electronics Letters, Vol.24, No.24, pp.1500–1501 (1988). In the Figure, reference numeral 201 designates a p type InP substrate. A p type InP lower cladding layer 202 is disposed on the p type InP substrate. An undoped InGaAsP active layer 203 is disposed on the p type InP cladding layer 202. An n type InP first upper cladding layer 204 is disposed on the active layer 203. A stripe shape mesa is formed by selectively etching the InP substrate 201, the p type InP cladding layer 202, the InGaAsP active layer 203, and the n type InP first upper cladding layer 204. A p type InP layer 205 is disposed on opposite sides of the mesa. An n type InP current blocking layer 206 is disposed on the p type InP layer 205. A p type InP current blocking layer 207 is disposed on the n type InP current blocking layer 206 and on portions of the p type InP layer 205. An n type InP second upper cladding layer 208 is disposed on the n type InP first upper cladding layer 204 and on the p type InP current blocking layer 207. An n type InGaAsP contact layer 209 is disposed on the n type InP second upper cladding layer 208. An n side electrode 211 is disposed on the n type InGaAsP contact layer 209, and a p side electrode 210 is disposed on the rear surface of the p type InP substrate 201. Although the semiconductor laser disclosed in this literature includes a light guide layer having a diffraction grating on the active layer, the light guide layer is omitted in FIG. 45.

FIGS. 46(a)–46(d) are perspective views illustrating process steps of fabricating the optical waveguide of the semiconductor laser shown in FIG. 45. In the Figures, the same reference numerals as in FIG. 45 designate the same or corresponding parts.

Initially, as illustrated in FIG. 46(a), there are successively grown on the p type InP substrate 201 with a {100} surface orientation, the p type InP layer 202 about 1 μm thick, the InGaAsP active layer 203 about 0.1 μm thick, and the n type InP first upper cladding layer 204 about 1 μm thick. Preferably, these layers are grown by metal organic chemical vapor deposition (MOCVD).

Then, a negative photoresist 215 is deposited on the n type InP first upper cladding layer 204 and patterned by photolithography, forming a stripe pattern extending along a <011> direction and having a width of about 6 μm (FIG. 46(b)). Since an oxide film is deposited on the surface of the n type InP first upper cladding layer 204 after the crystal growth, the deposition of the photoresist 215 should be carried out after removing the oxide film from the surface using hydrofluoric acid.

Using the stripe pattern 215 as a mask, the wafer is etched until the etching front reaches into the substrate 201, forming a ridge-shaped optical waveguide with 1–2 μm wide active layer 202 (FIG. 46(c)). Preferably, a mixture of bromine ($Br_2$) and methanol ($CH_3OH$) is employed as an etchant.

After removing the photoresist pattern 215, the p type InP layer 205, the n type InP current blocking layer 206, and the p type InP current blocking layer 207 are successively epitaxially grown on the substrate 201 contacting opposite sides of the optical waveguide (FIG. 46(d)). Preferably, these layers are grown by liquid phase epitaxy (LPE).

Thereafter, the n type InP second upper cladding layer 208 and the n type InGaAsP contact layer 209 are successively epitaxially grown over the entire surface of the wafer. To complete the laser structure of FIG. 45, the p side electrode 210 and the n side electrode 211 are formed on the rear surface of the substrate 201 and on the contact layer 209, respectively.

FIGS. 47(a)–47(d) are perspective views illustrating improved process steps of fabricating the laser structure of FIG. 45 in which unwanted growth of the p type InP current blocking layer on the ridge structure, that is likely to occur in the process steps of FIGS. 46(a)–46(d), is prevented.

In this method, after successively growing the p type InP buffer layer 202, the InGaAsP active layer 203, and the n type InP cladding layer 204 on the p type InP substrate 201 (FIG. 47(a)), an $SiO_2$ film 216 is deposited on the wafer by sputtering or the like and patterned in a stripe shape extending along the <011> direction (FIG. 47(b)). Then, using the $SiO_2$ pattern 216 as a mask, the stripe shape ridge is formed along the <011> direction using the same etchant as described above (FIG. 47(c)).

Thereafter, using the $SiO_2$ pattern 216 as a mask, the p type InP layer 205, the n type InP current blocking layer 206, and the p type InP current blocking layer 207 are successively grown on regions of the wafer that are not masked with the $SiO_2$ pattern 216 (FIG. 47(d)).

After removing the $SiO_2$ mask 216 with hydrogen fluoride, the n type InP second upper cladding layer 208 and the n type InGaAsP contact layer 209 are successively epitaxially grown over the entire surface of the wafer. To complete the laser structure of FIG. 45, the p side electrode 210 and the n side electrode 211 are formed on the rear surface of the substrate 201 and on the contact layer 209, respectively.

A description is given of the operation.

When a forward bias voltage is applied across the electrodes 210 and 211, a current flows between the electrodes, and electrons and holes are injected into the InGaAsP active layer 203 from the n type InP upper cladding layer 204 and the p type InP lower cladding layer 202, respectively. The electrons and holes injected into the active layer 203 recombine to produce light, resulting in laser oscillation. Since the p type InP layer 205, the n type InP current blocking layer 206, and the p type InP current blocking layer 207 are present on opposite sides of the ridge structure, the InGaAsP active layer 203 is buried with InP having a refractive index smaller than that of InGaAsP, so that the light generated in the active layer 203 is effectively confined in the active layer 203. In addition, since a reverse bias junction is produced by the n type InP current blocking layer 206 and the p type InP current blocking layer 207 at opposite sides of the ridge structure, the current flow path is narrowed and the charge carriers are injected into the active layer 203 with high efficiency.

In the laser structure shown in FIG. 45, however, a reactive current path (first reactive current path) is formed only by the forward biased junction across the p type InP substrate 201, the n type InP layer 205, and the p type InP cladding layer 204. In this case, all of the current injected into the laser does not flow into the InGaAsP active layer 203, but a part of the current flows through the first reactive current path and does not contribute the laser oscillation. The reactive current adversely affects the oscillation threshold, the maximum output, and the temperature characteristics of the laser device. The amount of the reactive current flow depends on the resistance of the first reactive current path. Therefore, in order to attain a semiconductor laser with less reactive current and improved characteristics, it is necessary to increase the resistance of the first reactive current path by narrowing the width of the first reactive current path. The narrow width of the reactive current path is achieved by reducing the thickness of the p type InP layer 205 on opposite sides of the active layer 203, i.e., by reducing the space between the active layer 203 and the n type InP current blocking layer 206.

If the n type InP current blocking layer 206 is in contact with the n type InP cladding layer 204, a second reactive current path is formed by the forward biased junction across the p type InP substrate 201, the n type InP current blocking layer 206, and the n type InP cladding layer 204 as shown in FIG. 49, in addition to the first reactive current path. The unwanted contact between the n type InP current blocking layer 206 and the n type InP cladding layer 204 occurs when the thickness of the p type InP layer 205 on the upper side surface of the ridge is thin. If the thickness of the p type InP layer 205 on opposite sides of the active layer 203 is reduced to reduce the resistance of the first reactive current path, on the other hand, the thickness of the InP layer 205 on the upper side portions of the ridge is also reduced, whereby the n type InP current blocking layer 206 is unfavorably in contact with the n type InP cladding layer 204, resulting in the second reactive current path.

Accordingly, in order to attain a semiconductor laser with less reactive current and improved characteristics, it is necessary to precisely control the thickness of the p type InP layer 205 when growing the layer.

However, the LPE method used for the fabrication of the conventional semiconductor laser does not offer good controllability of the layer thicknesses, so that a semiconductor laser with less reactive current and improved characteristics is not achieved by the conventional method.

Although MOCVD offers good controllability of the layer thicknesses in contrast with LPE method, it has been unknown whether the n type InP current blocking layer 206 can be grown without contacting the n type InP cladding layer 204 by MOCVD. Therefore, MOCVD has never been employed for the growth of the layer 206.

In the production method illustrated in FIGS. 47(a)–47(d), when the stripe shape ridge is formed by etching using the $SiO_2$ film 216 as a mask, since the adhesion of the $SiO_2$ film 216 to the upper cladding layer 204 is high, the etching does not proceed in the transverse direction under the $SiO_2$ mask 216, and the upper end part of the ridge is shaped in a reverse mesa with (111)A surfaces at the side walls thereof as shown in FIG. 50. During the LPE process after the etching process, the growth of the p type InP layer 205 does not proceed on the side surfaces of the upper end of the ridge where the (111)A surfaces are present, resulting in the unwanted contact between the n type InP current blocking layer 206 and the n type InP clad layer 204. The unwanted contact causes the second reactive current path. Therefore, a semiconductor laser with improved characteristics is not achieved in this method. In addition, this production method provides unevenness of the grown crystal layer, which adversely affects the subsequent process of forming electrodes or the like, reducing the production yield.

The above-described problems due to the reverse mesa shaped portion with the (111)A surfaces occur also in the production method illustrated in FIGS. 46(a)–46(d) where the ridge structure is formed using the photoresist 215 as a mask.

The cross section of the optical waveguide formed by the etching process shown in FIG. 46(c), which etching process is carried out using the stripe pattern extending along the <011> direction as a mask and the $Br_2$:$CH_3OH$ system solution as an etchant as an etchant, depends on the adhesion of the photoresist to the surface of the n type InP upper clad layer 204. In order to attain the ideal shape of the current blocking layer 205 as shown in FIG. 46(d), the cross section of the optical waveguide formed by the etching process must be in a gently-sloping mesa shape (ordinary mesa shape) as shown in FIG. 46(c). However, this gently-sloping mesa shape is attained when the adhesion of the photoresist to the surface of the upper clad layer 204 is low and the etching proceeds in the transverse direction under the photoresist mask. On the other hand, when the adhesion of the photoresist is high, since the side-etching rate under the photoresist mask is small, the cross section of the optical waveguide is in the reverse-mesa shape as shown in FIG. 50. If the current blocking layers 205, 206, and 207 are epitaxially grown by LPE on the wafer etched as shown in FIG. 50, the growth rate on the side walls of the reverse-mesa portion is low, resulting in the structure of FIG. 51 in which the n type InP current blocking layer 206 is in contact with the n type InP upper cladding layer 204. In this structure, the second reactive current path is formed and the leakage current increases during the laser operation.

FIG. 52 is a sectional view illustrating a prior art semiconductor laser disclosed in, for example, Japanese Published Patent Application No. 63-169088. In the Figure, reference numeral 221 designates a p type InP substrate. A p type InP buffer layer 222 is disposed on the substrate 221. An InGaAsP active layer 223 is disposed on the buffer layer 222. An n type InP first upper cladding layer 224 is disposed on the active layer 223. The first upper cladding layer 224, the active layer 223, and the buffer layer 222 are selectively etched to form a stripe-shaped mesa structure 225. The mesa structure is embedded with a first p type InP layer 226, an n type InP layer 227, and a second p type InP layer 228. An n type InP second upper cladding layer 229 is disposed on the mesa structure and on the second p type InP layer 228.

In production, the buffer layer 222, the active layer 223, and the first upper cladding layer 224 are successively grown on the p type InP substrate 221, and portions of these layers 222, 223, and 224 are formed in a mesa shape by etching. Then, LPE is carried out to embed both sides of the mesa with the first p type InP layer 226, the n type InP layer 227, and the second p type InP layer 228. Finally, the second upper cladding layer 229 is grown over the surface of the wafer to complete the structure of FIG. 52.

A description is given of the operation.

In the laser structure of FIG. 52, when a forward bias voltage is applied across the p type InP substrate 221 and the n type InP upper cladding layer 229, charge carriers, i.e., holes and electrons, are injected into the InGaAsP active layer 223 and recombine to generate light, resulting in laser oscillation. Since the first p type InP layer 226, the n type InP layer 227, and the second p type InP layer 228 are present on opposite sides of the mesa structure, the InGaAsP active layer 223 is embedded with InP having a refractive index smaller than that of InGaAsP, whereby the light generated in the active layer is effectively confined in the active layer 223. In addition, since a reverse bias junction is formed by the n type InP layer 227 and the p type InP layer 228 at opposite sides of the active region, the current path is narrowed and the charge carriers are injected in the active layer 203 with high efficiency.

In the semiconductor laser of FIG. 52, however, since the n type InP first upper cladding layer 224 is in contact with the n type InP layer 227, a second reactive current path 230 is formed across the p type InP substrate 221, the p type InP layer 226, the n type InP layer 227, and the n type InP first upper cladding layer 224. The amount of the current that does not flow into the active layer 223 but flows through the second reactive current path 230 is negligible during the low power operation of the laser because the built-in potential at the heterojunction in the active layer is smaller than the built-in potential at the homojunction in the reactive current path 230. However, it is a serious problem during the high power operation of the laser.

Accordingly, in order to achieve a high power operation of the laser, it is very important to separate the n type InP first upper cladding layer 224 from the n type InP layer 227. A method for achieving this separation is disclosed in Japanese Published Patent Application No. 63-202985. The separation method is illustrated in FIG. 54. In FIG. 54, end portions of the n type InP layers 227 are converted to p type utilizing the mutual diffusion of impurities between the n type InP layer 227 and the p type InP layer 226 or 228. Thus formed p type regions 227' electrically separate the n type InP first upper cladding layer 224 from the n type InP layers 227.

In this method, however, there are limitations in designing the respective layers 226, 227 and 228. In the structure of FIG. 54, the current narrowing structure for effectively injecting current into the active layer 223 is achieved by the p-n-p-n thyristor comprising the first p type InP layer 226, the n type InP layer 227, the second p type InP layer 228, and the n type InP second upper cladding layer 229. In order to realize high power operation in this laser structure, the breakdown voltage of the p-n-p-n thyristor must be high. In order to increase the breakdown voltage of the p-n-p-n thyristor,-the injection of holes from the first p type InP layer 226 into the second p type InP layer 228 has to be suppressed by increasing the carrier concentration of the n type InP layer 227 for combination of holes with electrons in the n type InP layer 227. In the above-described method utilizing the mutual diffusion of impurities, however, if the carrier concentration of the n type InP layer 227 is increased, the carrier concentration of the p type InP layer 226 or 228 has to be increased to convert the end portion of the n type InP layer 227 to p type. When Zn is employed as the p type impurity, it is difficult to obtain the p type carrier concentration higher than $3\times10^{18}$ cm$^{-3}$. Therefore, if the carrier concentration of the n type InP layer 227 is increased, the conversion of the end portion of the n type InP layer 227 to p type is impossible. In addition, if the carrier concentration of the p type InP layer 226 or 228 is increased to convert the end portion of the n type InP layer 227 to p type, the impurity dopant diffuses not only into the n type InP layer 227 but also into the active layer 223, whereby the absorption loss of the light generated in the active layer 223 increases due to free carrier absorption, increasing the oscillation threshold of the laser device.

Accordingly, in the laser structure of FIG. 54, since the carrier concentration of the n type InP layer 227 cannot be sufficiently increased, the breakdown voltage of the p-n-p-n thyristor structure cannot be increased.

In the structure shown in FIG. 55 in which the n type InP layer 227 is separated from the n type InP first upper cladding layer 224, a first reactive current path 231 is formed across the p type InP layer 226 and the n type InP first upper cladding layer 224. Since the resistance of the p type InP is larger than that of the n type InP, the amount of the current flowing through the first reactive current path 231 is less than the amount of the current flowing through the second reactive current path 230 in the laser structure shown in FIG. 53 in which the n type InP layer 227 is in contact with the n type InP first upper cladding layer 224. However, the current flowing through the first reactive current path 231 adversely affects the high output characteristics of the laser. In order to decrease the current flowing through the reactive current path 231, the resistance of the reactive current path 231 should be increased. As means for increasing the resistance, reduction in the carrier concentration of the p type InP layer 226 and reduction in the width 232 of the reactive current path 231 by narrowing the space between the active layer 223 and the n type InP layer 227 are thought of. However, the former is not effective for reducing the reactive current because the built-in potential of the p-n junction formed by the n type InP first upper cladding layer 224 and the p type InP layer 226 is unfavorably reduced. Accordingly, the reduction in the width 232 of the leakage current path is important for attaining high output characteristics of the laser. FIG. 56 illustrates the leakage current path width dependence of maximum output power ($P_{max}$). As shown in the Figure, the high output characteristics of the laser significantly depend on the leakage current path width 232.

FIG. 57 is a perspective view illustrating an InGaAsP buried heterojunction type semiconductor laser using an n type substrate disclosed in, for example, Journal of Lightwave Technology, Vol.7, No. 10, October 1989, p.1515. FIG. 58 is a sectional view of the semiconductor laser of FIG. 57. In these Figures, reference numeral 241 designates an n type InP substrate. An n type InP lower cladding layer 242 having a stripe ridge is disposed on the substrate 241. An undoped InGaAsP active layer 243 is disposed on the stripe ridge of the lower cladding layer 242. A p type InP first upper cladding layer 244 is disposed on the active layer 243. A p type InP current blocking layer 245 is disposed on the lower cladding layer 242 at opposite sides of the ridge. An n type InP current blocking layer 246 is disposed on the p type current blocking layer 245. A p type InP second upper cladding layer 247 is disposed on the p type InP first upper cladding layer 244 and on the n type InP current blocking layer 246. A p type InGaAsP contact layer 248 is disposed on the second upper cladding layer 247. An n side electrode 249 is disposed on the rear surface of the substrate 241, and a p side electrode 250 is disposed on the contact layer 248. Although a lightguide layer including a diffraction grating is disposed on the active layer in the above-described literature, the lightguide layer is omitted in the FIGS. 57 and 58.

A method for fabricating the laser structure is illustrated in FIGS. 59(a)–59(c).

Initially, there are successively grown on the n type InP substrate 241 the n type InP cladding layer 242, the undoped InGaAsP active layer 243, and the p type InP cladding layer 244 by MOCVD, and an SiO$_2$ film 251 is deposited over the p type InP cladding layer 244 by sputtering and patterned in a stripe shape by conventional photolithography (FIG. 59(a)).

Using the SiO$_2$ film 251 as a mask and a Br$_2$:CH$_3$OH solution as an etchant, the wafer is selectively etched as shown in FIG. 59(b). Then, the p type InP current blocking layer 345 and the n type InP current blocking layer 249 are successively grown on the n type InP cladding layer 242 at opposite sides of the mesa structure by MOCVD (FIG. 59(c)).

After removing the SiO$_2$ film 252 with HF, the p type InP cladding layer 247 and the p type InGaAsP contact layer 248 are successively grown on the wafer by MOCVD. The laser structure shown in FIG. 57 is completed by forming the n side electrode 249 and the p side electrode 250 on the rear surface of the substrate 241 and on the contact layer 248, respectively.

A description is given of the operation. When a forward bias voltage is applied across the n type InP substrate 241 and the p type InGaAsP contact layer 248 from the electrodes 249 and 250, respectively, charge carriers, i.e., holes and electrons, are injected into the InGaAsP active layer 243 and recombine to generate light, resulting in laser oscillation. Since both sides of the InGaAsP active layer 243 are embedded with the InP current blocking layers 245 and 246 having the refractive index smaller than that of InGaAsP, light generated in the active layer 243 is effectively confined in the active layer. In addition, since a reverse bias junction is formed by the n type InP layer 227 and the p type InP layer 228 at opposite sides of the active region, the current path is narrowed and the charge carriers are injected in the active layer 203 with high efficiency.

In the conventional method for fabricating the DCBH type semiconductor laser, since LPE that offers poor controllability of the layer thicknesses is employed, semiconductor lasers with less reactive current and improved characteristics are not attained with high reliability.

In the conventional method for fabricating the InP semiconductor lasers, the oxide film formed on the surface of the crystal layer is removed by hydrofluoric acid before the deposition of photoresist. However, the conditions of the oxide films sometimes differ with wafers due to the differences in the time elapsed and the atmosphere after the conclusion of the crystal growth. In addition, the condition of the oxide film formed on a wafer is not uniform in some cases. Therefore, it is difficult to make the crystalline surface uniform with hydrofluoric acid, resulting in uneven adhesion of the photoresist to the crystalline surface that causes an uneven cross section in the waveguide after the etching process. In this case, it is difficult to conduct the subsequent growth of crystal layers to bury the mesa structure with high reproducibility, resulting in poor production yield.

In the conventional buried heterojunction semiconductor laser employing the p type substrate, in order to achieve high output characteristics, the carrier concentration of the n type InP layer 227 should be increased, and the n type InP layer 227 should be close to the active layer 223 and separated from the n type InP first upper cladding layer 224. However, in the conventional method utilizing the mutual diffusion of impurities, the carrier concentration of the n type InP layer 227 cannot be sufficiently increased. In addition, in the crystal growth utilizing LPE, the space between the n type InP layer 227 and the active layer 223 cannot be precisely controlled. As the result, semiconductor lasers with improved characteristics are not achieved with high uniformity and reproducibility.

In the conventional buried heterojunction semiconductor laser employing the n type substrate shown in FIG. 57, since the p type InP cladding layer 244 contacts the p type InP current blocking layer 245, a reactive current path 225 is formed across the p type InP cladding layer 244, the p type InP current blocking layer 245, and the n type InP cladding layer 242 as shown in FIG. 58. The current not flowing into the active layer but flowing through the path 225 may be negligible during the low output operation of the laser because the built-in potential at the heterojunction in the active layer is smaller than the built-in potential of the homojunction in the reactive current path 255. However, the reactive current adversely affects the high output operation of the laser. In the structure of FIG. 58, the p type InP current blocking layer 245 is higher than the active layer 243, and no increase in the resistance of the reactive current path 255 is achieved, resulting in poor characteristics at the high power operation.

SUMMARY OF THE INVENTION

One object of the present invention to provide a high-performance double-channel buried-heterojunction semiconductor laser with reduced reactive current and a method for fabricating the semiconductor laser.

Another object of the present invention is to provide a semiconductor laser with less reactive current and improved characteristics, and a method for fabricating the semiconductor laser.

A further object of the present invention is to provide uniform etching profiles of mesa structures so that subsequent crystal growths are carried out with high reproducibility.

Another object of the present invention is to provide buried-heterojunction semiconductor lasers with improved high output characteristics, which are fabricated with high uniformity of characteristics in a wafer and high reproducibility.

Still another object of the present invention is to provide a buried-heterojunction semiconductor laser employing an n type substrate with less reactive current and improved characteristics, and a method for fabricating the semiconductor laser.

Other objects and advantages of the present invention will become apparent from the detailed description given hereinafter; it should be understood, however, that the detailed description and specific embodiment are given by way of illustration only, since various changes and modifications within the spirit and scope of the invention will become apparent to those skilled in the art from this detailed description.

According to a first aspect of the present invention, a semiconductor laser includes impurity doped regions formed by adding an impurity from the surface of a first conductivity type current blocking layer disposed on opposite sides of a mesa structure. The impurity doped regions electrically separate an upper part of the mesa structure from a second conductivity type current blocking layer. Since the second conductivity type current blocking layer is not in contact with the mesa structure, no leakage current path is formed in the laser structure.

According to a second aspect of the present invention, in a method for fabricating a semiconductor laser, after successively growing a first conductivity type mesa embedding layer, a second conductivity type current blocking layer, and a first conductivity type current blocking layer contacting side walls of a stripe mesa shaped double heterojunction structure, an impurity is added from the surface of the first conductivity current blocking layer to form impurity doped regions that electrically separate the second conductivity type current blocking layer from the upper part of the mesa at opposite sides of the mesa. Therefore, structural defects caused by the undesirable contact between the second conductivity type current blocking layer and the mesa are avoided, increasing the production yield. In addition, since the addition of the impurity is performed using a mask that is used as an etching mask when the double heterojunction structure is formed in the mesa shape, the impurity doped regions are easily formed with high precision.

According to a third aspect of the present invention, a semiconductor laser includes a double heterojunction structure disposed on a first conductivity type semiconductor substrate and including at least an active layer and a second conductivity type semiconductor layer, two parallel stripe grooves penetrating through the second conductivity type semiconductor layer and the active layer and dividing the double heterojunction structure into a stripe-shaped mesa and portions at opposite sides of the mesa, and a first conductivity type semiconductor layer filling the two parallel grooves. The second conductivity type semiconductor layer at opposite sides of the mesa is a part of a current blocking structure. Therefore, a high-performance semiconductor laser, in which the width of the leakage current path does not depend on the mesa embedding growth, is achieved with high reliability.

According to a fourth aspect of the present invention, in a method for fabricating a semiconductor laser, at least an active layer and a second conductivity type first semiconductor layer are successively grown on a first conductivity type semiconductor substrate to form a double heterojunction structure. Then, two parallel stripe grooves are formed penetrating through the first semiconductor layer and the active layer. These grooves divide the double heterojunction structure into a stripe-shaped mesa and portions at opposite sides of the mesa. Thereafter, a first conductivity type second semiconductor layer is formed on the surface of the wafer except for the top surface of the mesa, and a second conductivity type third semiconductor layer is formed on the surface of the wafer including the top surface of the mesa. In this structure, since the widths of leakage current paths depend on the widths of the two stripe grooves at the position of the active layer, a semiconductor laser with improved characteristics is achieved with high reliability.

According to a fifth aspect of the present invention, in a method for fabricating a semiconductor laser, at least an active layer, a second conductivity type first semiconductor layer, and a first conductivity type second semiconductor layer are successively grown on a first conductivity type semiconductor substrate with a {100} surface orientation. Then, a first stripe groove along a <01$\bar{1}$> direction is formed penetrating through the second semiconductor layer to expose the surface of the first semiconductor layer. Thereafter, second and third stripe grooves along the <01$\bar{1}$> direction are formed at opposite sides of the first groove, penetrating through the first semiconductor layer and the active layer. The second and third stripe grooves divide the active layer and the first and second semiconductor layers into a stripe shape mesa and portions at opposite sides of the mesa. Then, a first conductivity type third semiconductor layer is formed in the second and third stripe grooves, and a second conductivity type fourth semiconductor layer is formed on the stripe mesa, on the third semiconductor layer, and on the second semiconductor layer. In this method, since the widths of the leakage current paths depend on the widths of the second and third stripe grooves at the position of the active layer, a semiconductor laser with improved characteristics is achieved with high reliability.

According to a sixth aspect of the present invention, a semiconductor laser includes a stripe mesa shaped double heterojunction structure including a first conductivity type cladding layer, an active layer, and a second conductivity type cladding layer which are successively grown on a first conductivity type substrate. The opposite side walls of the mesa-shaped double heterojunction structure are non-growth surfaces on which no crystal growth proceeds. The laser further includes a second conductivity type current blocking layer with a planar surface, disposed on the surface of the substrate and contacting opposite side walls of the double heterojunction structure. In this structure, the width of the leakage current path is easily controlled during the formation process.

According to a seventh aspect of the present invention, in a method for fabricating a semiconductor laser, initially, a stripe shape mesa including an active layer, extending along a <01$\bar{1}$> direction, and having a trapezoidal cross section is formed on a (100) surface of a first conductivity type semiconductor substrate. The stripe shape mesa is surrounded by the {100} surface and {111}B surfaces. Then, a second conductivity type current blocking layer is grown parallel to the {100} surface of the substrate at opposite sides of the stripe shape mesa. In this structure, even if the space between the second conductivity type semiconductor layer and the active layer is reduced, the second conductivity type semiconductor layer does not contact the active layer, whereby the width of the leakage current path is easily controlled. The stripe shape mesa is formed by successively growing a first conductivity type semiconductor layer, an active layer, and a second conductivity type semiconductor layer using a selective growth mask formed on the substrate and having a stripe shape window along the <01$\bar{1}$> direction. In this method, the laser structure is achieved by two crystal growths, improving producibility.

According to an eighth embodiment of the present invention, in a method for fabricating a semiconductor laser, a plurality of semiconductor layers of a double heterojunction structure are grown on a semiconductor substrate and, subsequently, a dummy layer is grown on the double heterojunction structure. The dummy layer is removed by etching to expose the surface of the uppermost layer. The exposed surface is treated with hydrofluoric acid and, directly after the treatment, a photoresist is deposited on the surface. In this method, since a uniform surface is attained before the deposition of the photoresist, the adhesion of the photoresist to the surface of the uppermost crystal layer is uniform, resulting in a uniform etching profile that provides good reproducibility in the subsequent mesa embedding growth.

According to a ninth embodiment of the present invention, a semiconductor laser includes a p type semiconductor mesa embedding layer disposed on opposite sides of a stripe shape mesa with an active layer and having a (111)B surface at opposite sides of an upper part of the stripe shape mesa, and an n type semiconductor mesa embedding layer disposed on the p type semiconductor mesa embedding layer without contacting an n type semiconductor layer on the active layer. In this structure, the n type semiconductor layer at the opposite sides of the active layer is separated from the n type semiconductor layer on the active layer, resulting in improved laser characteristics with less reactive current during high power operation of the laser.

According to a tenth aspect of the present invention, in a method for fabricating a semiconductor laser, n type semiconductor layers disposed on opposite sides of an active layer are separated from an n type semiconductor layer disposed on the active layer using MOCVD that offers good controllability of layer thicknesses and using surface orientation growth rate dependence. Therefore, the width of the reactive current path is controlled with high uniformity and reproducibility, resulting in a semiconductor laser with improved characteristics.

According to an eleventh embodiment of the present invention, a semiconductor laser includes a stripe shape mesa comprising a plurality of semiconductor layers, including an active layer, successively grown on an n type semiconductor substrate, and a p type semiconductor layer disposed contacting opposite sides of the mesa structure and having a crystal surface at opposite sides of the active layer. The crystal surface forms an angle with the plane surface of the mesa, which angle is larger than an angle formed between a (111)B surface of the p type semiconductor layer and the plane surface of the mesa and smaller than 90°. As a result, a buried heterojunction semiconductor laser is achieved with reduced width of the p type semiconductor mesa embedding layer at opposite sides of the mesa, reduced reactive current at high power operation of the laser, and improved characteristics.

According to a twelfth embodiment of the present invention, in a method for fabricating a semiconductor laser, a plurality of semiconductor layers including an active layer are grown on an n type semiconductor substrate with a (100) or almost (100) surface orientation, the semiconductor layers are formed in a stripe mesa shape along a <110> direction, and a p type semiconductor layer is grown on opposite sides of the mesa structure by MOCVD. The p type semiconductor layer has a (111)B surface at opposite sides of an upper part of the mesa structure, which (111)B surface forms a first angle with the plane surface of the mesa structure, and has a crystal surface at opposite sides of the active layer, which crystal surface forms a second angle with the plane surface of the mesa. The second angle is larger than the first angle and smaller than 90°. Therefore, the width of the p type semiconductor mesa embedding layer at the opposite sides of the mesa is reduced with high uniformity and reproducibility, resulting in a buried heterojunction semiconductor laser with less reactive current and improved characteristics.

According to a thirteenth embodiment of the present invention, a semiconductor laser includes a stripe shape mesa including a lower cladding layer, an active layer, and an upper cladding layer disposed on a semiconductor substrate, a mesa embedding layer disposed on opposite sides of the mesa, and a thin layer interposed between opposite side walls of the mesa and the mesa embedding layer. The thin layer is grown at a substrate temperature lower than a growth temperature of the mesa embedding layer. Therefore, a highly-reliable buried heterojunction semiconductor laser with improved crystallinity of the mesa embedding layer is achieved.

According to a fourteenth embodiment of the present invention, in a method for fabricating a semiconductor laser, a lower cladding layer, an active layer, and an upper cladding layer are successively grown on a semiconductor substrate, these layers are formed in a stripe mesa shape, a thin layer is grown on opposite sides of the stripe mesa at a substrate temperature lower than the growth temperature of a mesa embedding layer described below, and the mesa embedding layer is grown on the thin layer to embed the stripe mesa. In this method, the thermal deterioration of the side walls of the active layer is suppressed, resulting in a highly-reliable buried heterojunction semiconductor laser with improved crystallinity of the mesa embedding layer.

According to a fifteenth embodiment of the present invention, in a method for fabricating a semiconductor laser, an InP lower cladding layer, an InGaAsP active layer, and an InP upper cladding layer are successively grown on an InP substrate, these layers are formed in a stripe mesa shape, the InP substrate is heated to a crystal growth temperature while supplying phosphine ($PH_3$) and arsine ($AsH_3$) with the supply rate of arsine less than that in the growth of the InGaAsP active layer, and a semiconductor layer is grown to embed the stripe mesa. Therefore, the thermal deterioration of the active layer and the cladding layers exposed at the side walls of the stripe mesa during rising the substrate temperature is reduced, resulting a highly-reliable buried heterojunction semiconductor laser with improved crystallinity of the mesa embedding layer.

DETAILED DESCRIPTION OF THE PREFERRED EMBODIMENTS

Figure 1:
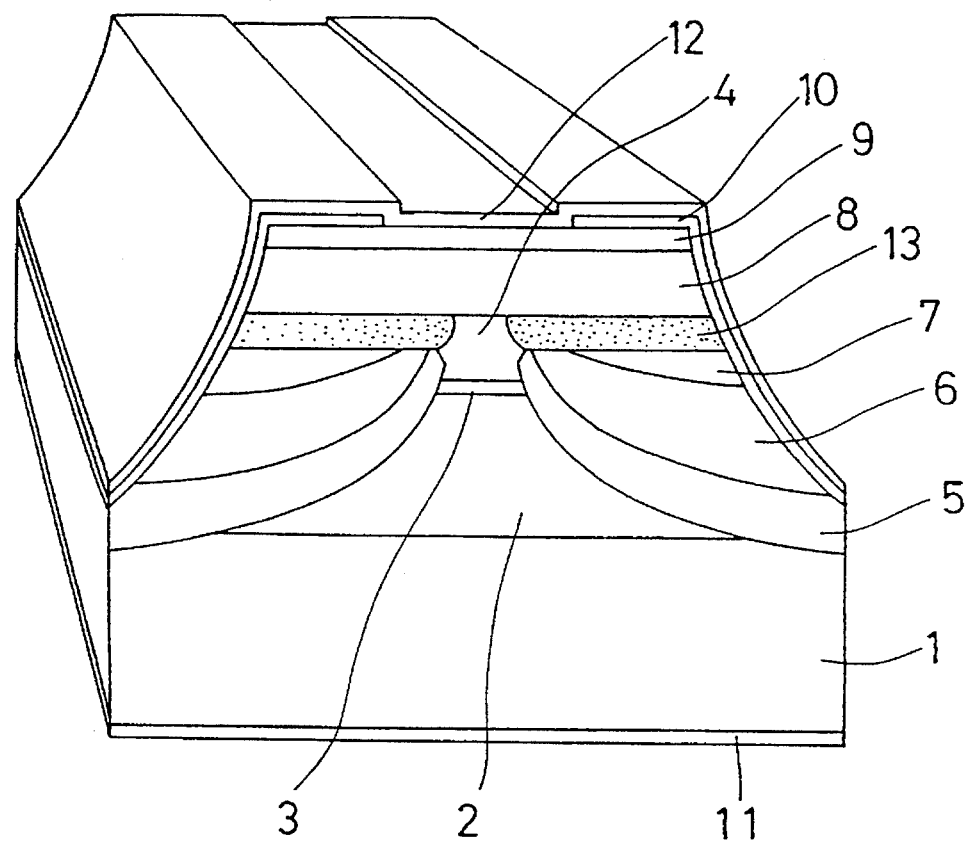
FIG. 1 is a perspective view illustrating a semiconductor laser in accordance with a first embodiment of the present invention.

FIG. 1 is a perspective view illustrating a semiconductor laser in accordance with a first embodiment of the present invention. In the Figure, reference numeral 1 designates a p type InP substrate. A p type InP lower cladding layer 2 is disposed on the substrate 1. An undoped InGaAsP active layer 3 is disposed on the lower cladding layer 2. An n type InP first upper cladding layer 4 is disposed on the active layer 3. The double heterojunction structure comprising the lower cladding layer 2, the active layer 3, and the first upper cladding layer 4 is formed in a stripe shape mesa by selective etching. A p type InP layer 5, an n type InP current blocking layer 6, and a p type InP current blocking layer 7 are successively disposed on opposite sides of the mesa structure. A p type impurity doped region 13 is disposed on the p type InP current blocking layer 7 at opposite sides of the n type InP first upper cladding layer 4. The p type impurity doped region 13 separates the upper portion of the mesa structure from the n type current blocking layer 6. An n type InP second upper cladding layer 8 is disposed on the first upper cladding layer 4 and on the p type impurity doped region 13. An n type InGaAsP contact layer 9 is disposed on the second upper cladding layer 8. An insulating film 10 having a stripe-shaped window opposed to the active layer 3 is disposed on top of the structure. An n side electrode 12 is disposed on the insulating film 10 and on the n type InGaAsP contact layer 9. A p side electrode 11 is disposed on the rear surface of the substrate 1.

A method of fabricating the semiconductor laser structure of FIG. 1 is illustrated in FIGS. 2(a)–2(c) and 3(a)–3(c). In these Figures, the same reference numerals as in FIG. 1 designate the same or corresponding parts.

Figure 2:
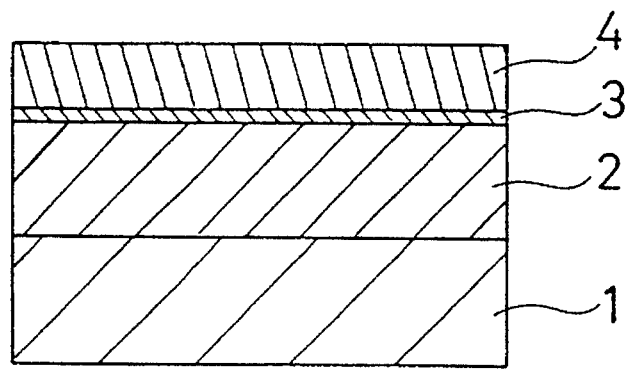
FIGS. 2(a)–2(c) are sectional views illustrating process steps in a method for fabricating the semiconductor laser of FIG. 1.
Figure 2:
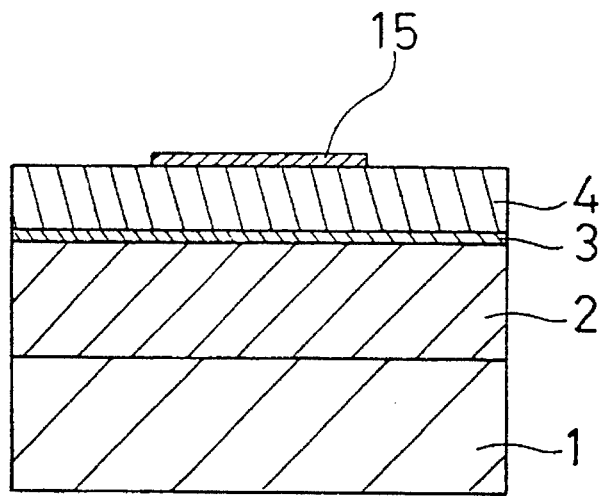
Figure 2:
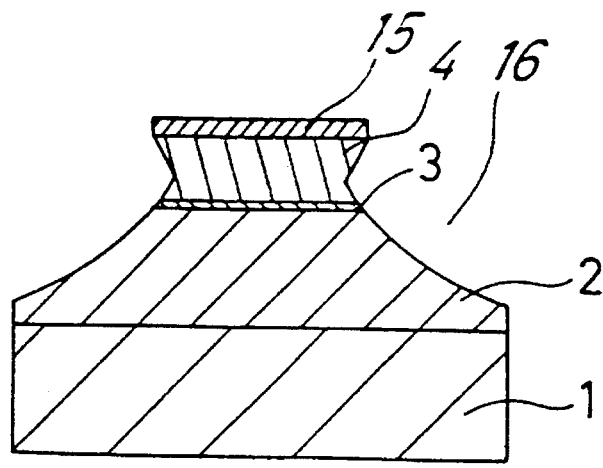

Initially, there are successively grown on the p type InP substrate 1 the p type InP cladding layer 2 about 2μm thick, the undoped InGaAsP active layer 3 0.1–0.2 μm thick, and the n type InP cladding layer 4 about 0.7 μm thick (FIG. 2(a)). Preferably, these layers are grown by MOCVD.

An insulating film having an adhesion higher than that of photoresist, such as $SiO_2$ or $SiN_x$, is deposited on the n type InP cladding layer 4, preferably by thermal CVD or plasma CVD. Thereafter, the insulating film is patterned using conventional photolithography and etching techniques, forming a stripe-shaped mask pattern 15 along the <011> direction (FIG. 2(b)). The width of the mask pattern 15 is 2–3 μm.

Then, portions of the wafer exposed at opposite sides of the mask pattern 15 are selectively etched using the $Br_2:CH_3OH$ system etchant to form channel grooves 16, whereby the laser active region including the active layer 3 is formed in a stripe mesa shape (FIG. 2(c)). Since the stripe-shaped mask pattern 15 extends along the <011> direction and has a high adhesion to the surface of the semiconductor layer, the etching hardly proceeds in the transverse direction under the insulating mask 15. Therefore, the upper portion of the mesa structure just below the mask 15 is formed in a reverse mesa shape. In addition, since the adhesion of the insulating film, such as $SiO_2$ or $SiN_x$, to the surface of the semiconductor layer is controlled with higher reproducibility compared with that of the photoresist, the etching profile of the mesa structure is formed with higher reproducibility compared with that formed using the photoresist.

Figure 3:
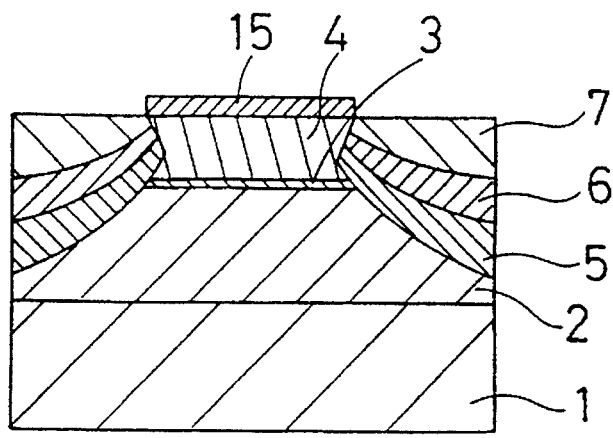
FIGS. 3(a)–3(c) are sectional views illustrating process steps in a method for fabricating the semiconductor laser of FIG. 1.
Figure 3:
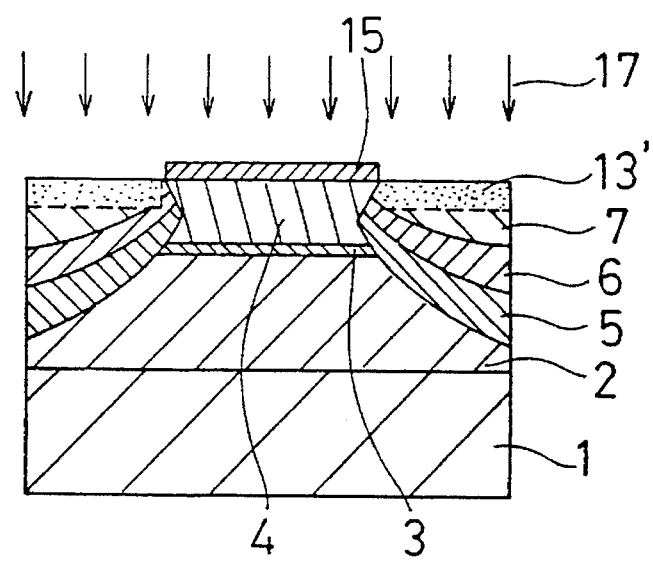
Figure 3:
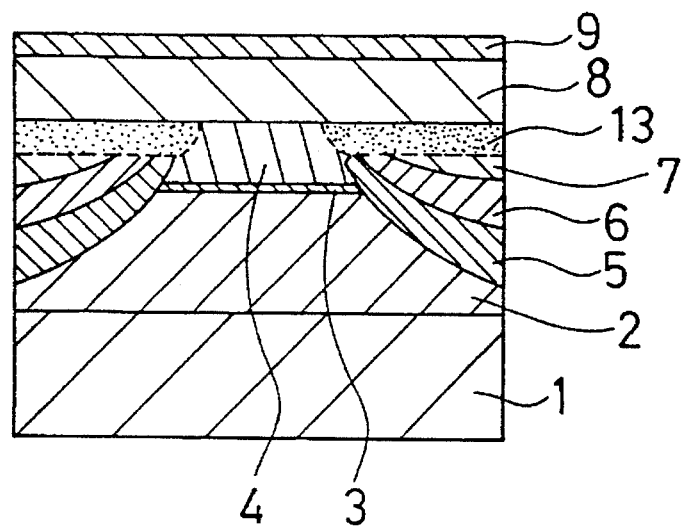

As illustrated in FIG. 3(a), using the insulating mask 15, the p type InP layer 5, the n type InP current blocking layer 6, and the p type InP current blocking layer 7 are successively grown in the channel grooves 16 contacting opposite sides of the mesa structure, preferably by LPE. These crystal layers are not grown on the mask 15 but selectively grown in the channel grooves 16. Since the upper portion of the mesa structure is in a reverse mesa shape, the growth rate of the p type InP layer 5 on the side walls of the reverse mesa portion is much slower than that on the side walls of the ordinary mesa and, therefore, the InP layer 5 grown on the reverse mesa portion is very thin, which causes the undesirable contact between the n type InP upper cladding layer 4 and n type InP current blocking layer 6.

In this first embodiment of the present invention, after the crystal growth by LPE, a p type impurity 17, such as Zn, is introduced into the unmasked region of the wafer by thermal diffusion (FIG. 3(b)). Since the mask 15 serves as a diffusion preventing mask, a self-aligned structure is achieved in the vicinity of the mask 15, whereby the distribution of the impurity atoms diffused into the wafer is controlled with high precision. Either of solid phase diffusion and gas phase diffusion may be employed as the thermal diffusion. In the solid phase diffusion, an impurity diffusion source layer is formed on the surface of the wafer and impurity atoms in the source layer are diffused into the wafer. In the gas phase diffusion, impurity atoms from the gaseous atmosphere are diffused into the wafer.

After removing the mask 15, the p type InP second upper cladding layer 8 and the n type InGaAsP contact layer 9 are successively grown on the wafer, preferably by LPE or MOCVD (FIG. 3(c)). During the crystal growth of FIG. 3(c), the dopant impurity introduced into the wafer in the step of FIG. 3(b) is diffused in the transverse direction and the depth direction of the wafer and electrically activated by annealing, forming the impurity doped regions 13 that separate the tips of the current blocking layers 6 from the reverse mesa portion.

After forming the laser structure in a mesa shape, the $SiO_2$ film 10 is deposited over the mesa-shaped structure and a stripe window is opened in the $SiO_2$ film 10 opposite the active layer 3. Then, the n side electrode 12 is formed in contact with the n type contact layer 9 at the stripe window, and the p side electrode 11 is formed on the rear surface of the substrate 1. Finally, opposite laser facets are formed by cleaving to complete the semiconductor laser of FIG. 1.

In the above-described method for producing the semiconductor laser, after the mesa-shaped double heterojunction structure is embedded with the InP layers 5, 6, and 7, the impurity doped region 13 for separating the tip of the InP current blocking layer 6 from the reverse mesa portion is formed. Therefore, even if the thickness of the p type InP layer 5 is reduced to narrow the first reactive current path, the undesirable contact between the current blocking layer 6 and the reverse mesa portion is prevented. As the result, semiconductor lasers with improved characteristics are produced at good yield.

While in the above-described first embodiment the p type impurity, such as Zn, is introduced into the wafer by thermal diffusion, ion implantation may be employed. In place of the p type impurity, an impurity which forms a trap level at a deep position in the InP band gap and semi-insulates the doped region, such as Fe, may be employed.

While in the above-described first embodiment a dielectric film, such as $SiO_2$ or $SiN_x$, is used as the mask for the mesa-etching, a photoresist film may be used so long as it does not degenerate in the subsequent crystal growth process and impurity diffusion process.

While in the above-described first embodiment LPE is employed for embedding the mesa structure with the crystal layers, MOCVD, which has never been employed for the reason described above, may be employed because the contact between the tip of the current blocking layer 6 and the upper portion of the mesa structure during the mesa embedding growth offers no problem in the method according to the first embodiment of the present invention. Since MOCVD offers good controllability of the thickness of the p type InP layer 5, the width of the first reactive current path is reduced with high precision.

Figure 4:
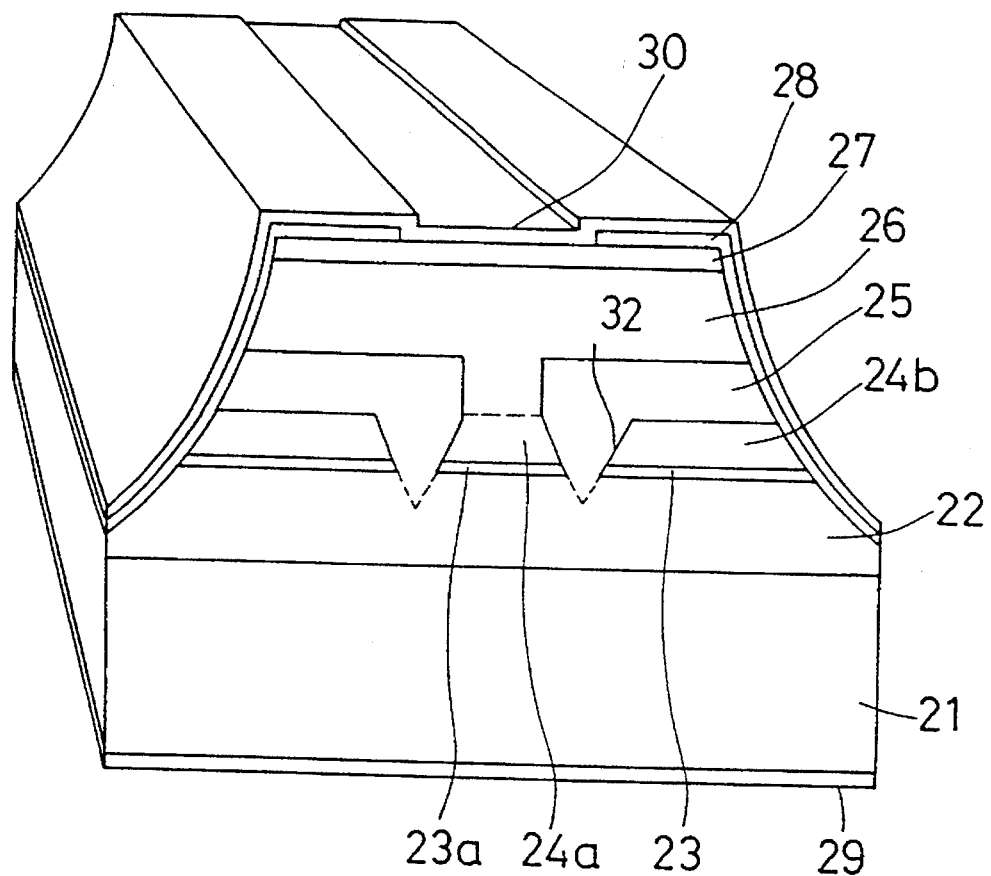
FIG. 4 is a perspective view illustrating a semiconductor laser in accordance with a second embodiment of the present invention.

FIG. 4 is a perspective view illustrating a semiconductor laser in accordance with a second embodiment of the present invention.

In FIG. 4, reference numeral 21 designates a p type InP substrate. A p type InP lower cladding layer 22 is disposed on the substrate 21. Undoped InGaAsP active layers 23a and 23b are disposed on the p type InP lower cladding layer 22. An n type InP first upper cladding layer 24a is disposed on the active layer 23a. Two V-shaped grooves 32 are disposed on opposite sides of the mesa structure including a portion of the lower cladding layer 22, the active layer 23a, and the upper cladding layer 24a. N type InP current blocking layers 24b are disposed on the active layers 23b at opposite sides of the mesa structure. P type InP current blocking layers 25 are disposed on the n type InP current blocking layers 24b and on surfaces of the V-shaped grooves 32. An n type InP second upper cladding layer 26 is disposed on the first upper cladding layer 24a and on the p type InP current blocking layers 25. An n type InGaAsP contact layer 27 is disposed on the second upper cladding layer 26. An insulating film 28 having a stripe-shaped window opposed to the active layer 23a is disposed on top of the laser structure. An n side electrode 30 is disposed on the insulating film 28 and on the n type InGaAsP contact layer 27. A p side electrode 29 is disposed on the rear surface of the substrate 21.

A method for fabricating the laser structure of FIG. 4 is illustrated in FIGS. 5(a)–5(d).

Initially, the n type InP lower cladding layer 22, the InGaAsP active layer 23, and the n type InP first upper cladding layer 24 are successively grown on the p type InP substrate 21 and, subsequently, an SiN film 31 is deposited on the first upper cladding layer 24 (FIG. 5(a)).

Then, the SiN film 31 is patterned to form two stripe-shaped windows parallel to each other along the <0$\bar{1}$1> direction. Using the SiN pattern 31 as a mask, the wafer is etched until the etching front reaches into the lower cladding layer 22 (FIG. 5(b)). The V-shaped grooves 32 shown in FIG. 5(b) are attained when InP is etched using the mask pattern with the stripe-shaped windows along the <0$\bar{1}$1> direction and using the $Br_2$:$CH_3OH$ system etchant or a $H_2SO_4$ (sulfuric acid) system etchant.

Figure 5:
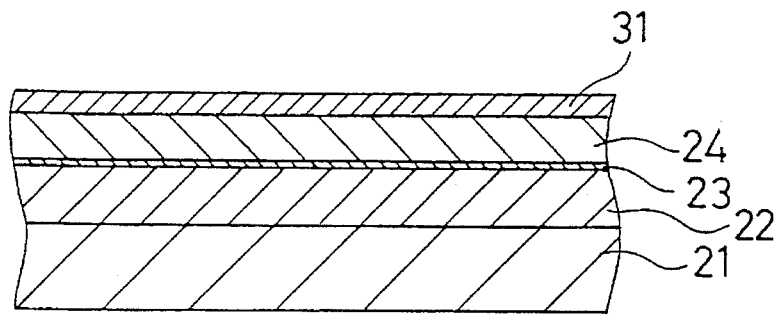
FIGS. 5(a)–5(d) are sectional views illustrating process steps in a method for fabricating the semiconductor laser of FIG. 4.
Figure 5:
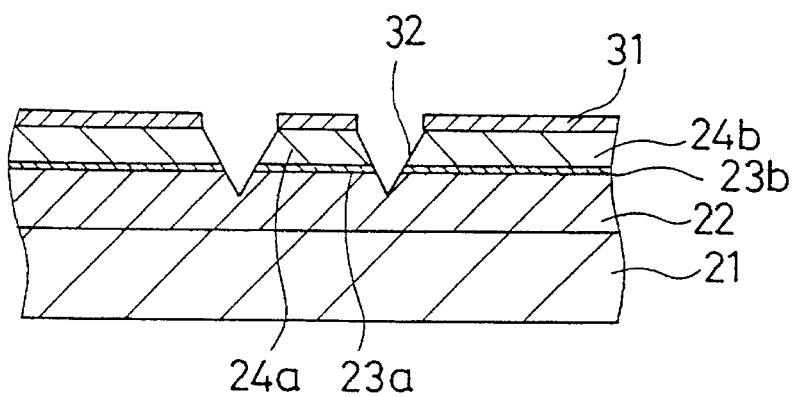
Figure 5:
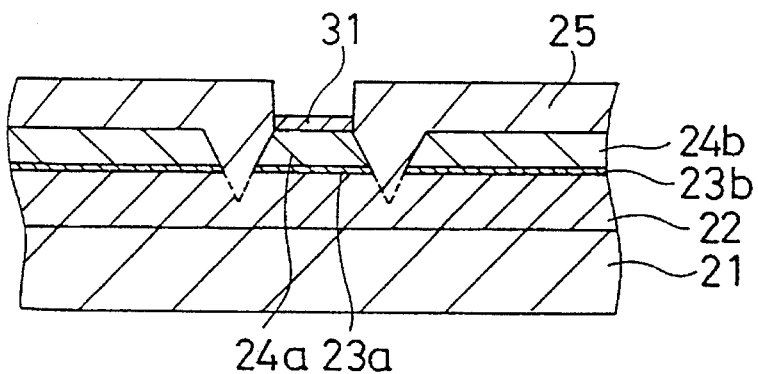
Figure 5:
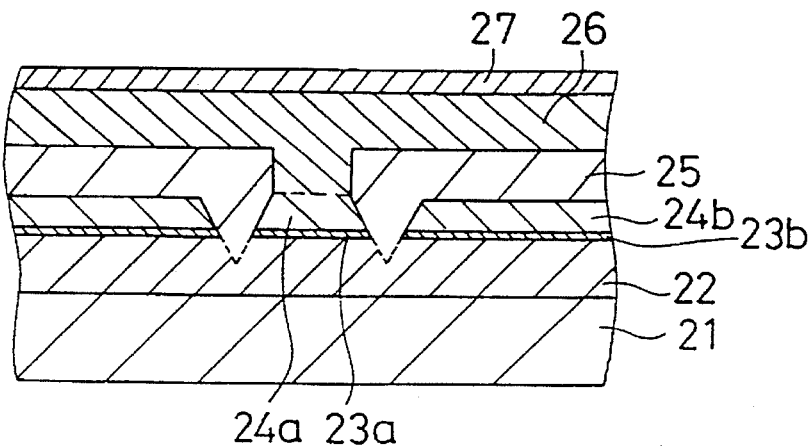

Then, the SiN film 31 is removed leaving the stripe-shaped center portion on the wafer, and the p type InP current blocking layer 25 is selectively grown on the wafer using the stripe-shaped SiN film as a mask (FIG. 5(c)).

After removing the stripe-shaped SiN film, the n type InP second upper cladding layer 26 and the n type InGaAsP contact layer 27 are successively grown on the entire surface of the wafer (FIG. 5(d)).

The semiconductor laser structure shown in FIG. 4 is completed through subsequent process steps, such as mesa-etching of the laser structure and formation of p side and n side electrodes.

Figure 9:
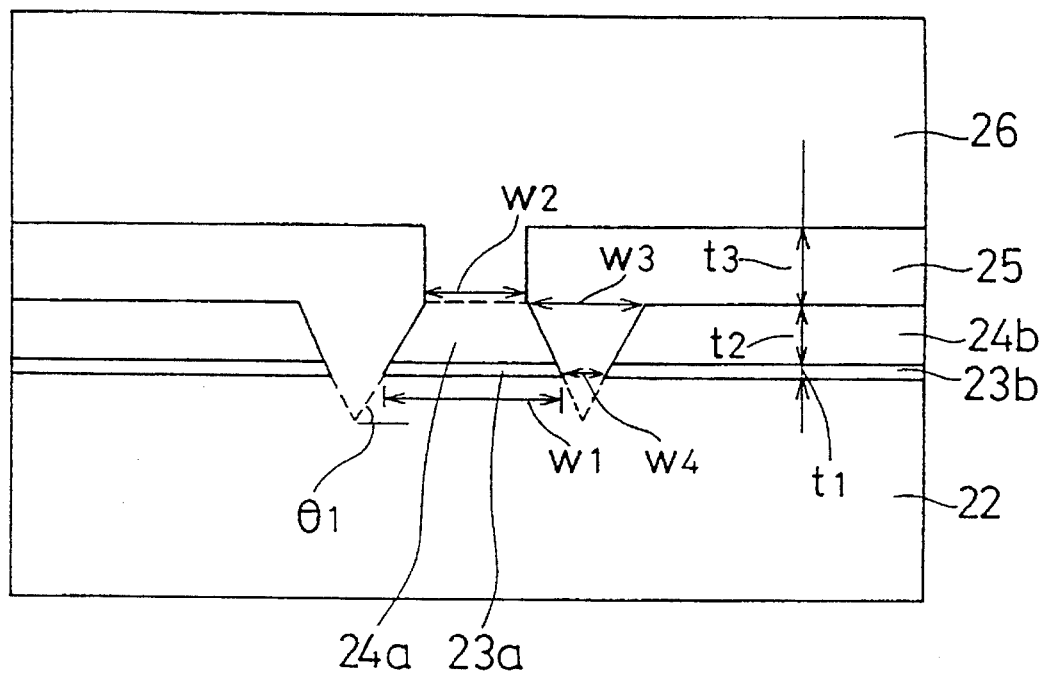
FIG. 9 is a schematic diagram for explaining dimensions of the respective parts of a semiconductor laser according to the second embodiment of a present invention.

FIG. 9 is a sectional view for explaining dimensions of the respective parts of the laser structure of FIG. 4.

If the thickness $t_1$ of the active layer 23 is 0.13 μm, the thickness $t_2$ of the n type current blocking layer 24b 0.5 μm, and the thickness $t_3$ of the p type current blocking layer 25 0.5 μm, the width $w_2$ of the upper end of the n type InP first upper cladding layer 24a, i.e., the width of the center stripe of the SiN film 31 in the step of FIG. 5(b), which determines the width $w_1$ of the light emitting region 23a of the active layer to be 2 μm, is represented by $$w_2 = w_1 - 2(t_1 + t_2)(\tan\theta_1)^{-1}$$

Since $\theta_1$ is 54.7°, $w_2$ is 1.1 μm. The distance $w_4$ between the active layers 23a and 23b, i.e., the width of the reactive current path, is represented by $$w_4 = w_3 - 2(t_1 - t_2)(\tan\theta_1)^{-1}$$

Accordingly, the distance $w_4$ is determined by the distance $w_3$ between the upper edge of the n type current blocking layer 24b and the upper edge of the first upper cladding layer 24a, i.e., the width of the stripe-shaped window of the SiN film 31 in the step of FIG. 5(b). When $w_3$ is 1.2 μm, the width of the reactive current path is 0.3 μm.

In the method for fabricating the semiconductor laser according to the second embodiment of the present invention, initially, the p type InP layer 22, the active layer 23, and the n type InP layer 24 are successively grown on the substrate 21 to form a double heterojunction structure. Then, two parallel stripe grooves are formed penetrating through the n type InP layer 24 and the active layer 23 to divide the double heterojunction structure into the stripe-shaped mesa portion and portions at opposite sides of the mesa portion. Thereafter, the p type InP current blocking layer 25 is formed except for the upper surface of the stripe-shaped mesa portion. Further, the n type InP layer 26 is formed on the upper surface of the mesa portion and on the p type InP current blocking layer 25. Therefore, the width of the reactive current path depends on the width of the stripe groove at the position of the active layer 23, significantly improving the controllability of the leakage current path width.

In the conventional production method, since the grooves at opposite sides of the mesa structure are filled with a plurality of semiconductor layers, the mesa-embedding growth is affected by the etching profiles of the grooves, resulting in variations in the widths of the leakage current paths. In the production method according to the second embodiment, since the two parallel stripe grooves providing the leakage current paths are completely filled with the p type current blocking layer 25, the above-described problem is avoided, and narrow leakage current paths are easily formed.

Figure 6:
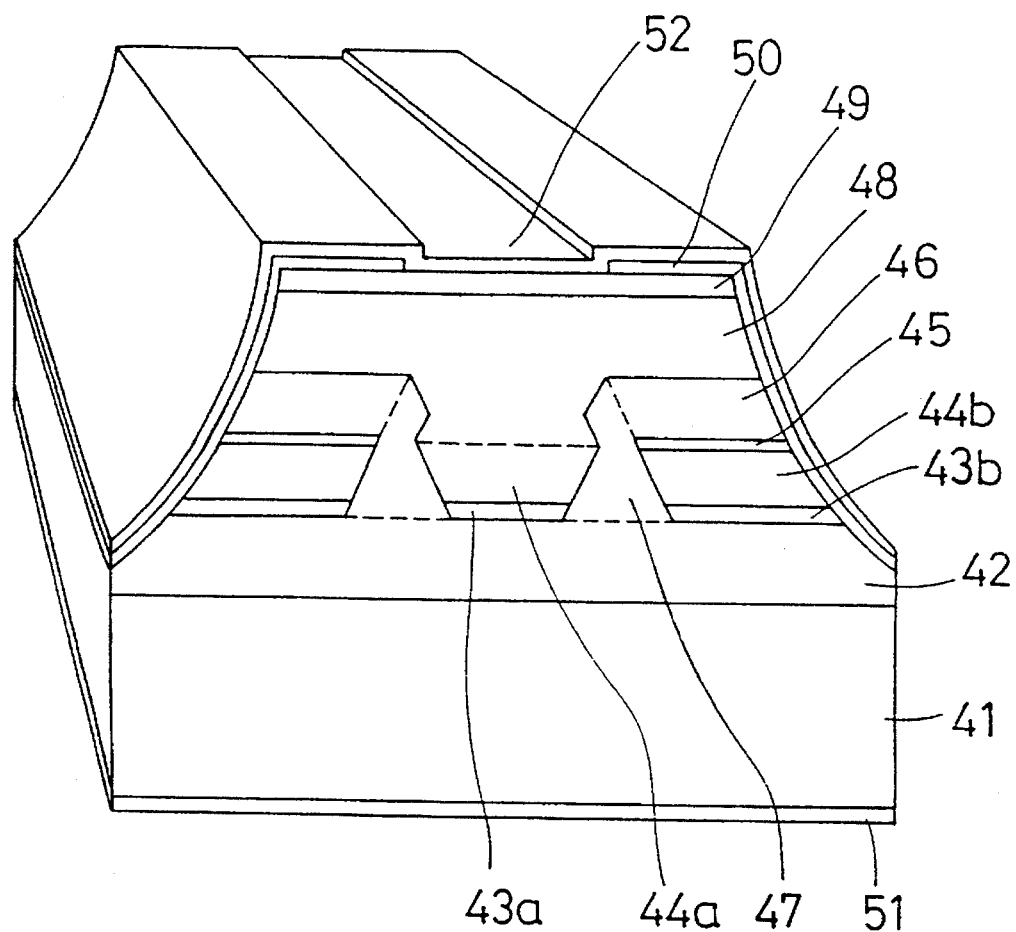
FIG. 6 is a perspective view illustrating a semiconductor laser in accordance with a third embodiment of the present invention.

FIG. 6 is a perspective view illustrating a semiconductor laser in accordance with a third embodiment of the present invention. In the Figure, reference numeral 41 designates a p type InP substrate. A p type InP lower cladding layer 42 is disposed on the substrate 21. Undoped InGaAsP active layers 43a and 43b are selectively disposed on the lower cladding layer 42. P type InP layers 47 are disposed on portions of the lower cladding layer 42 where the active layers 43a and 43b are absent. An n type InP first upper cladding layer 44a is disposed on the active layer 43a. N type InP current blocking layers 44b are disposed on the active layers 43b. InGaAsP etching stopper layers 45 are disposed on the n type InP current blocking layers 44b. P type InP current blocking layers 46 are disposed on the etching stopper layers 45. An n type InP second upper cladding layer 48 is disposed on the first upper cladding layer 44a, on the p type InP layers 47, and on the p type InP current blocking layers 46. An n type InGaAsP contact layer 49 is disposed on the second upper cladding layer 48. An insulating film 50 having a stripe-shaped window opposed to the active layer 43a is disposed on top of the laser structure. An n side electrode 52 is disposed on the insulating film 50 and on the n type InGaAsP contact layer 49. A p side electrode 51 is disposed on the rear surface of the substrate 41.

A method for fabricating the laser structure of FIG. 6 is illustrated in FIGS. 7(a)–7(d) and 8(a)–8(c).

Figure 7A:
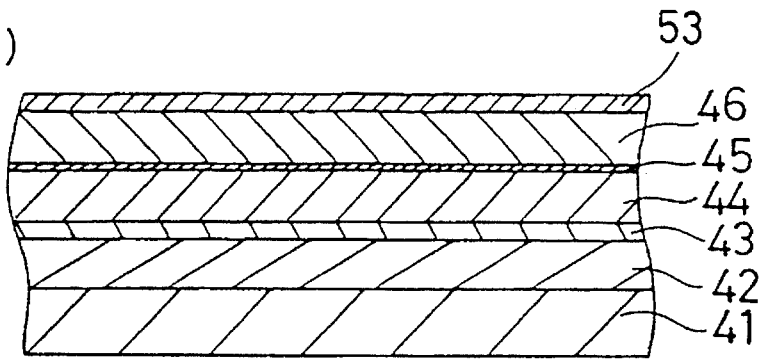
FIGS. 7(a)–7(d) are sectional views illustrating process steps in a method for fabricating the semiconductor laser of FIG. 6.

Initially, as illustrated in FIG. 7(a), there are successively grown on the p type InP substrate 41, the n type InP lower cladding layer 42, the InGaAsP active layer 43, the n type InP first upper cladding layer 44, the InGaAsP etching stopper layer 45, and the p type InP current blocking layer 46, preferably by MOCVD. Thereafter, an SiN film 53 is deposited on the p type InP current blocking layer 46.

Then, the SiN film 53 is patterned by conventional photolithography and etching technique to form a stripe-shaped window extending along the <0$\bar{1}$1> direction. Using the patterned SiN film 53 as a mask, the wafer is etched down to the etching stopper layer 45, followed by removal of the etching stopper layer 45 (FIG. 7(b)). The stripe-shaped groove 55 of trapezoidal cross section is attained when InP is etched using a mask having a stripe-shaped window along <0$\bar{1}$1> direction with the $Br_2$:$CH_3OH$ system etchant or the $H_2SO_4$ system etchant.

Figure 7B:
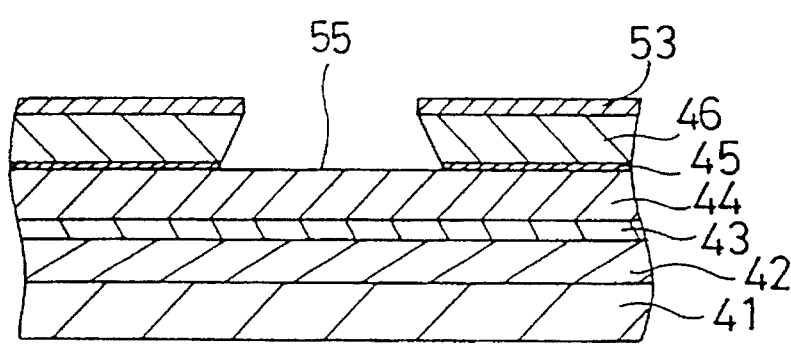
Figure 7C:
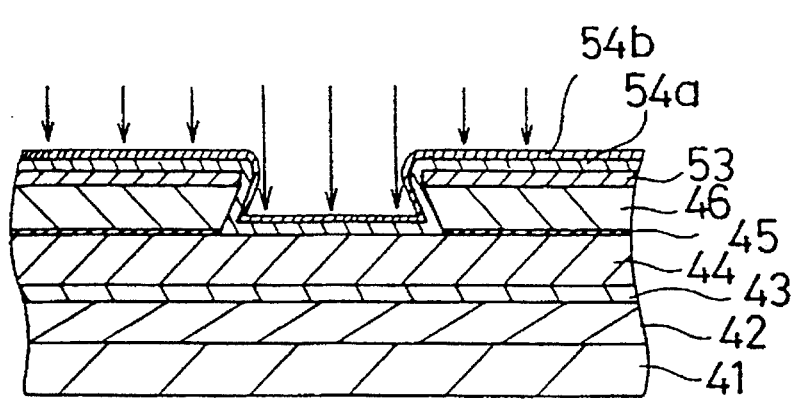

After successively depositing an SiN film 54a and a negative photoresist 54b over the entire surface of the wafer, the wafer is irradiated with light at right angles to expose the negative photoresist 54b to light (FIG. 7(c)).

Figure 7D:
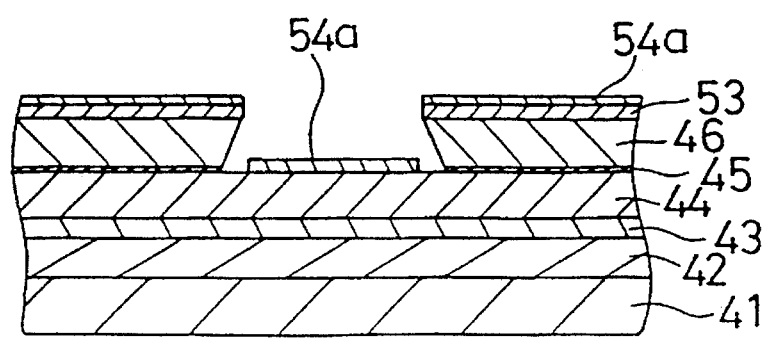

Then, portions of the negative photoresist 54b in the opposite corners of the groove which were not exposed to light are removed by developing, and portions of the SiN film 54a exposed by the developing are removed by etching (FIG. 7(d)). The width of the opening formed by the etching of the SiN film 54a, in which the n type InP first upper cladding layer 44 is exposed, depends on the thickness of the p type current blocking layer 46.

Figure 8:
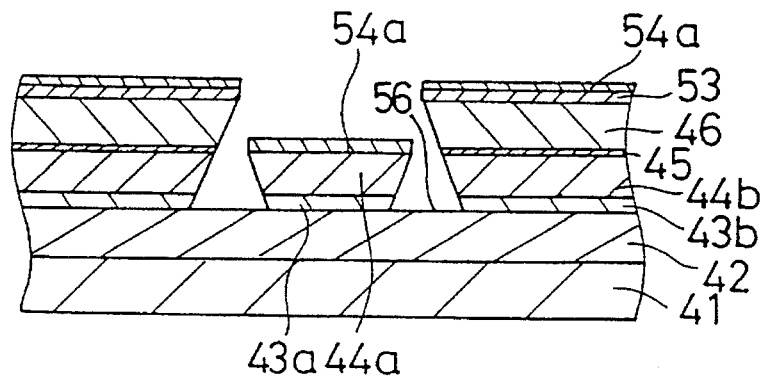
FIGS. 8(a)–8(c) are sectional views illustrating process steps in a method for fabricating the semiconductor laser of FIG. 6.
Figure 8:
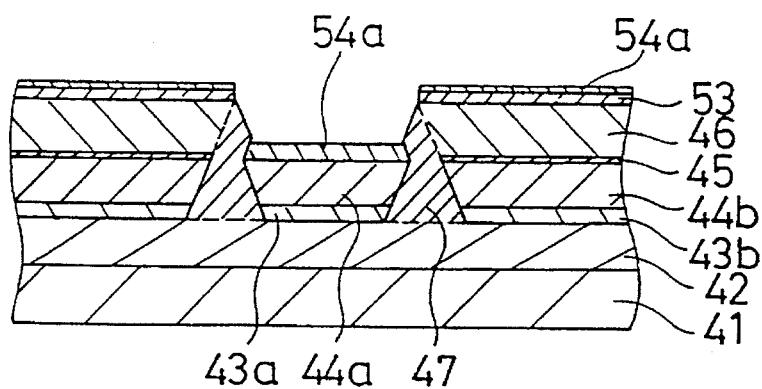
Figure 8:
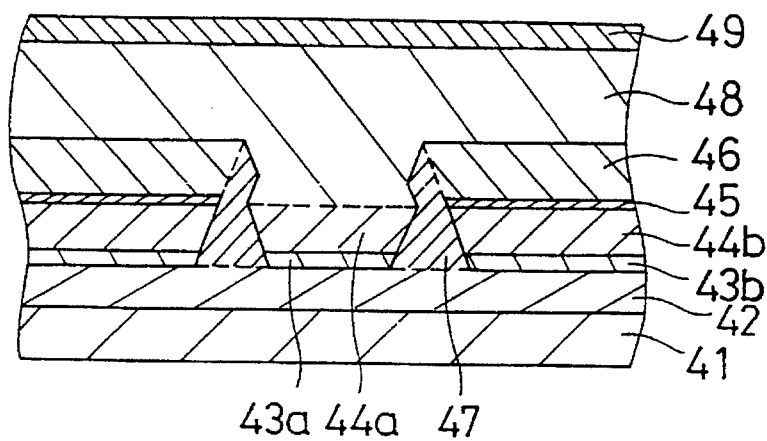

Using the SiN film 54a as a mask, portions of the first upper cladding layer 44 and the active layer 43 are etched as shown in FIG. 8(a). Since the stripe-shaped opening of the SiN film 54a extends along the <0$\bar{1}$1> direction, the stripe-shaped groove 56 of trapezoidal cross section as shown in FIG. 8(a) is attained using the $Br_2$:$CH_3OH$ system etchant or the $H_2SO_4$ system etchant.

As illustrated in FIG. 8(b), the p type InP layer 47 is selectively grown in the two stripe-shaped grooves, using the SiN film 54a as a mask, by a vapor phase deposition, such as MOCVD.

After removing the SiN films 54a and 53, the n type InP second upper cladding layer 48 and the n type InGaAsP contact layer 49 are successively grown on the entire surface of the wafer (FIG. 8(c)).

The semiconductor laser structure shown in FIG. 6 is completed through subsequent process steps, such as mesa-etching of the laser structure and formation of the p side and n side electrodes.

Figure 10:
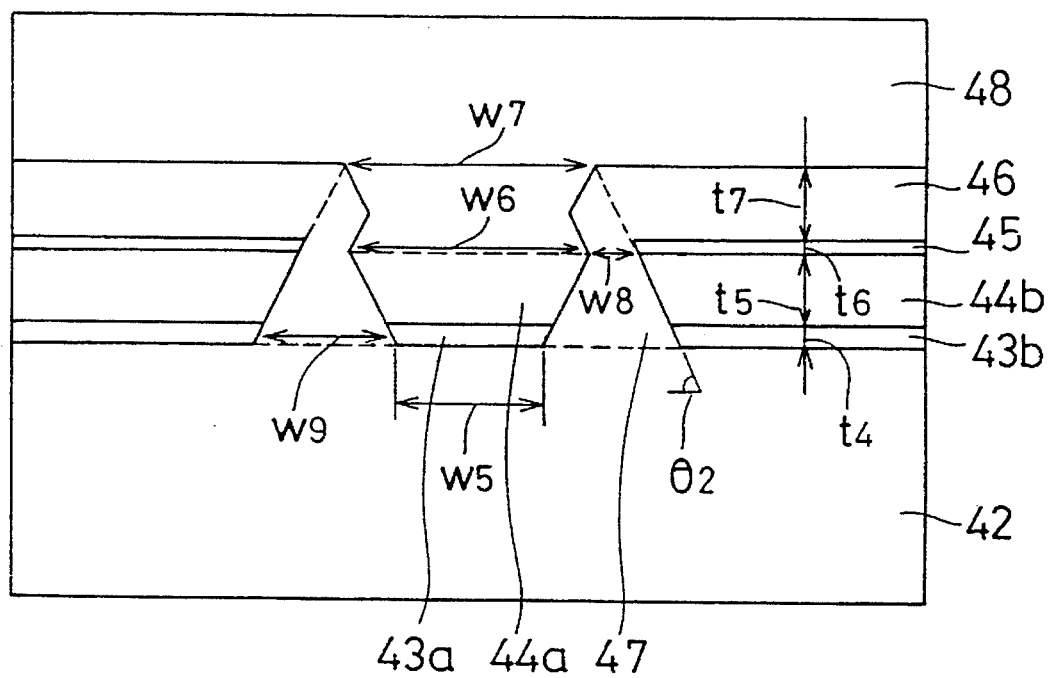
FIG. 10 is a schematic diagram for explaining dimensions of the respective parts of a semiconductor laser according to the third embodiment of a present invention.

FIG. 10 is a sectional view for explaining dimensions of the respective parts of the laser structure of FIG. 6.

If the thickness $t_4$ of the active layer 43 is 0.13 μm, the thickness $t_5$ of the n type current blocking layer 44b 0.5 μm, the thickness $t_6$ of the etching stopper layer 45 0.05 μm, and the thickness $t_7$ of the p type current blocking layer 46 0.5 μm, the width $w_6$ of the upper end of the n type InP first upper cladding layer 44a that determines the width $w_5$ of the light emitting region 43a of the active layer to be 2 μm is represented by $$w_6 = w_5 + 2(t_4 + t_5)(\tan\Theta_2)^{-1}.$$

Since $\Theta_2$ is 54.7°, $w_6$ is 2.9 μm. The distance $w_7$ between the upper edges of the opposed p type InP current blocking layers 46, i.e., the width of the opening of the SiN film 53 in the step of FIG. 7(b), is approximately equal to the width $w_6$ of the upper end of the first upper cladding layer 44a, so that the width of the opening of the SiN film 53 is 2.9 μm. On the other hand, the distance $w_8$ between the upper edge of the n type current blocking layer 44b and the upper edge of the first upper cladding layer 44a, i.e., the width of the opening of the SiN film 54a in the step of FIG. 7(d), is represented by $$w_8 = (t_6 + t_7)(\tan\Theta_2)^{-1}$$

and, therefore, $w_8$ is 0.35 μm. In addition, the distance $w_9$ between the active layers 43a and 43b, which corresponds to the width of the leakage current path, is represented by $$w_9 = w_8 + 2(t_4 + t_5)(\tan\Theta_2)^{-1}$$

and, therefore, $w_9$ is 1.2 μm.

In a method for fabricating the semiconductor laser according to the third embodiment of the present invention, initially, the p type InP layer 42, the active layer 43, the n type InP layer 44, and the p type InP layer 46 are successively grown on the substrate 41 with a {100} surface orientation. Then, a first stripe-shaped groove 55 along the <0$\bar{1}$1> direction is formed penetrating through the p type InP layer 46 to expose the surface of the n type InP layer 44. Then, second stripe-shaped grooves 56 along the <0$\bar{1}$1> direction are formed at opposite sides of the first groove penetrating through the n type InP layer 44 and the active layer 43. The second grooves 56 are filled with the p type InP layer 47 and, thereafter, the n type InP layer 48 is formed on the entire surface of the wafer. Therefore, the width of the leakage current path depends on the width of the second groove 56 at the position of the active layer 43, significantly improving the controllability of the leakage current path width.

In the conventional production method, since the grooves at opposite sides of the mesa structure are filled with a plurality of semiconductor layers, the mesa-embedding growth is affected by the etching profiles of the grooves, resulting in variations in the widths of the leakage current paths. In the production method according to the third embodiment, since the second grooves 56 providing the leakage current paths are completely filled with the p type InP layer 47, the above-described problem in the conventional method is avoided, and narrow leakage current paths are easily formed.

In addition, since the opening width of the mask for producing the two stripe-shaped grooves depends on the thickness of the grown layer which provides higher precision than the patterning of a mask, the controllability of the leakage current path width is improved compared with that of the second embodiment.

In addition, since the p type InP layer 47 and the p type InP current blocking layer 46 are formed in different steps, if the resistance of the p type InP layer 47 is increased by reducing the carrier concentration of the p type InP layer 47 compared with that of the p type current blocking layer 46, the leakage current is further reduced.

Figure 11:
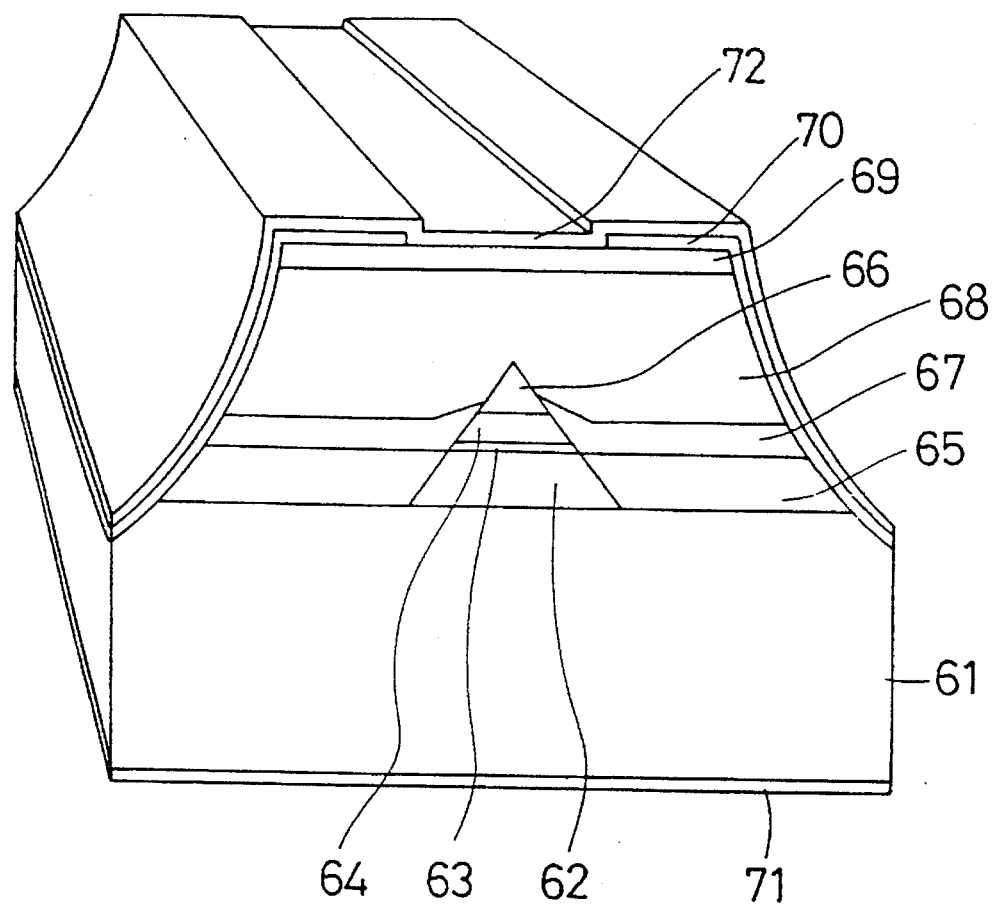
FIG. 11 is a perspective view illustrating a semiconductor laser in accordance with a fourth embodiment of the present invention.

FIG. 11 is a perspective view illustrating a semiconductor laser in accordance with a fourth embodiment of the present invention. In the Figure, reference numeral 61 designates a p type InP substrate. A p type InP lower cladding layer 62 is disposed on a region of the substrate 61. An undoped InGaAsP active layer 63 is disposed on the lower cladding layer 62. An n type InP first upper cladding layer 64 is disposed on the active layer 63. An n type InP layer 66 is disposed on the first upper cladding layer 64. N type InP current blocking layers 65 are disposed on regions of the substrate where the lower cladding layer 62 is absent. P type InP current blocking layers 67 are disposed on the n type current blocking layers 65. An n type InP second upper cladding layer 68 is disposed on the p type current blocking layers 67 and on the n type InP layer 66. An n type InGaAsP contact layer 69 is disposed on the second upper cladding layer 68. An insulating film 70 having a stripe-shaped window opposed to the active layer 63 is disposed on the laser structure. An n side electrode 57 is disposed on the insulating film 70 and on the n type InGaAsP contact layer 69. A p side electrode 71 is disposed on the rear surface of the substrate 61.

A method for fabricating the laser structure of FIG. 11 is illustrated in FIGS. 12(a)–12(d). In the Figures, the same reference numerals as in FIG. 11 designate the same or corresponding parts.

Figure 12:
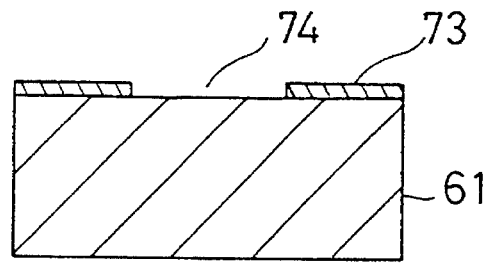
FIGS. 12(a)–12(d) are sectional views illustrating process steps in a method for fabricating the semiconductor laser of FIG. 11.
Figure 12:
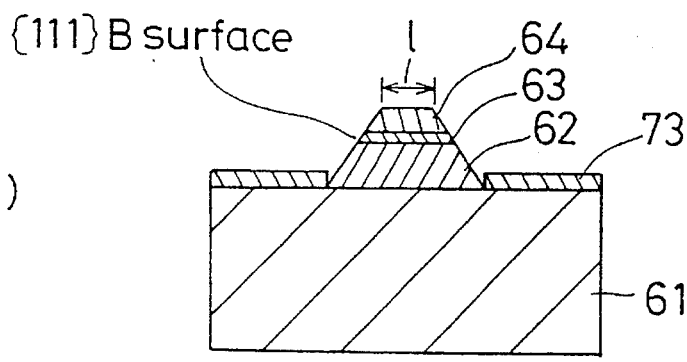
Figure 12:
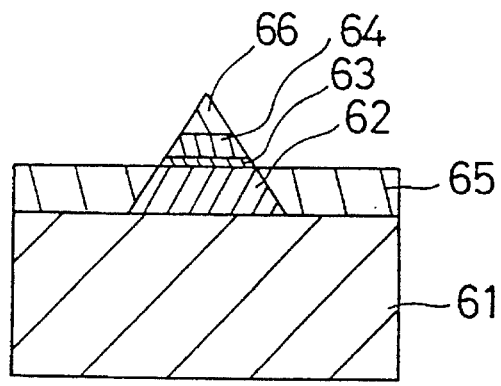
Figure 12:
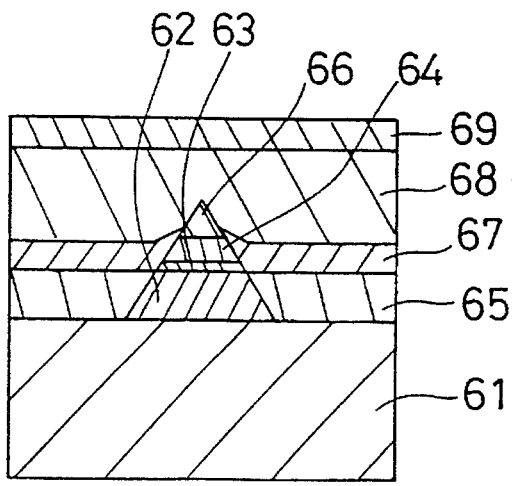

Initially, as illustrated in FIG. 12(a), a mask for selective growth 73 comprising SiO$_2$ or the like and having a stripe-shaped window 74 along the <011> direction is formed on the p type InP substrate 61 with a {100} surface orientation. The width of the window 74 is about 3.5 μm.

As illustrated in FIG. 12(b), the p type InP buffer layer 62 1 μm thick, the InGaAsP active layer 63 0.1 μm thick, and the n type InP first upper cladding layer 64 0.5 μm thick are successively grown by MOCVD. When the selective crystal growth is carried out by MOCVD on the substrate having the stripe window along the <011> direction, the crystal growth proceeds forming a layer with side walls of the {111}B surface. It is well known that no crystal growth proceeds on the {111}B surface. Therefore, a stripe-shaped mesa structure having a trapezoidal cross section with the upper width 1 of about 1.4 μm is attained.

After removing the mask 73, an n type InP layer is grown on the wafer to a thickness of 1 μm by MOCVD (FIG. 12(c)). Since no crystal is grown on the {111}B surface, the crystal growth proceeds on the substrate 61 and on the first upper cladding layer 64, forming the n type InP current blocking layers 65 and the n type InP layer 66. The n type InP layer 66 has a triangular cross section with a height of 1 μm.

Then, the p type InP current blocking layer 67 0.5 μm thick, the n type InP second upper cladding layer 68 2 μm thick, and the n type InGaAsP contact layer 69 are successively grown on the wafer by MOCVD (FIG. 12(d)). The semiconductor laser of FIG. 11 is completed through subsequent process steps, such as mesa-etching of the laser structure and formation of p side and n side electrodes.

Figure 13:
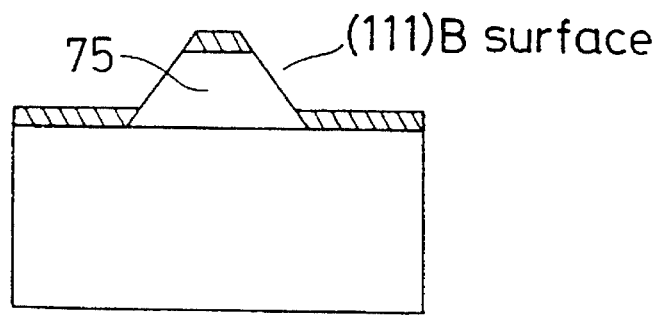
FIGS. 13(a)–13(c) are sectional views for explaining configurations of crystal layers grown at opposite sides of a mesa structure in the fabrication method of the semiconductor laser of FIG. 11.
Figure 13:
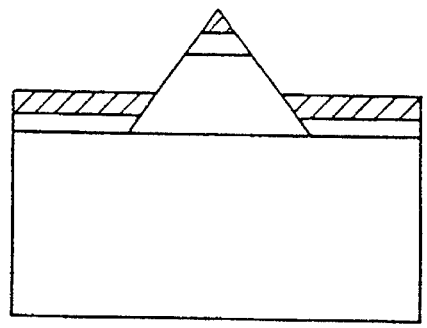
Figure 13:
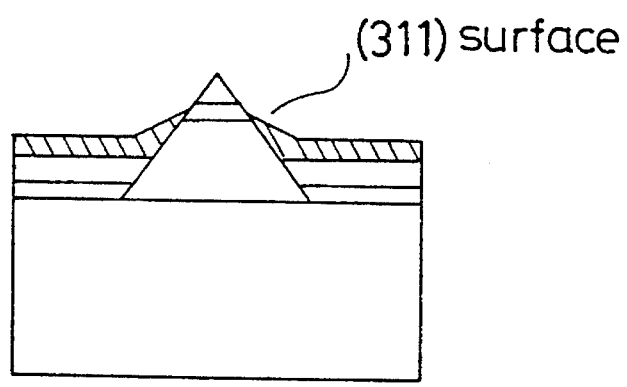

FIGS. 13(a)–13(c) are sectional views illustrating growth profiles of crystal layers grown by MOCVD on a substrate with a stripe mesa 75 extending along the <110> direction and having {111} side walls. The stripe mesa 75 is formed by the selective growth in the step of FIG. 12(b). In each of the process steps shown in FIGS. 13(a)–13(c), the hatched portion indicates a crystal layer grown in the step.

In FIG. 13(a) where the cross section of the mesa 75 is trapezoidal, the crystal growth proceeds parallel to the {100} surface at the both sides of the mesa 75. In FIG. 13(b), the crystal growth on the mesa 75 practically stops once the formation of a perfect triangular portion is completed. In FIG. 13(c), the crystal growth proceeds forming layers with the {311} surface at both sides of the mesa due to atoms attached to the {111}B surface. Therefore, if the n type InP current blocking layer 65 of the semiconductor laser is grown parallel to the {100} surface, the width of the leakage current path can be controlled by the thickness of the current blocking layer 65.

In the production method according to the fourth embodiment of the present invention, since no wet etching is employed, reduction in the production yield due to the variation in the etching profile is suppressed.

While in the fourth embodiment of the present invention the thickness of the n type InP current blocking layer 65 is the same as that of the p type InP buffer (lower cladding) layer 62, the n type InP current blocking layer 65 may be thinner than the p type InP buffer layer 62 if the difference in the thicknesses is less than 0.5 μm. In this case, the leakage current is reduced to an extent equivalent to or more than the reduction achieved in the case where the mesa embedding growth is carried out under the best conditions by the conventional LPE method.

Figure 17:
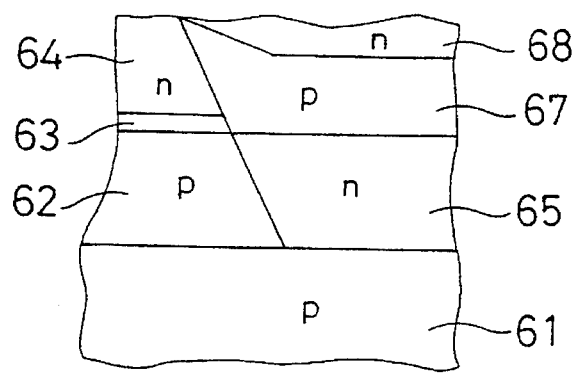
FIG. 17 is a schematic diagram for explaining operation of a semiconductor laser according to the fourth embodiment of the present invention in the case where a second conductivity type current blocking layer is as thick as a first conductivity type lower cladding layer.
Figure 18:
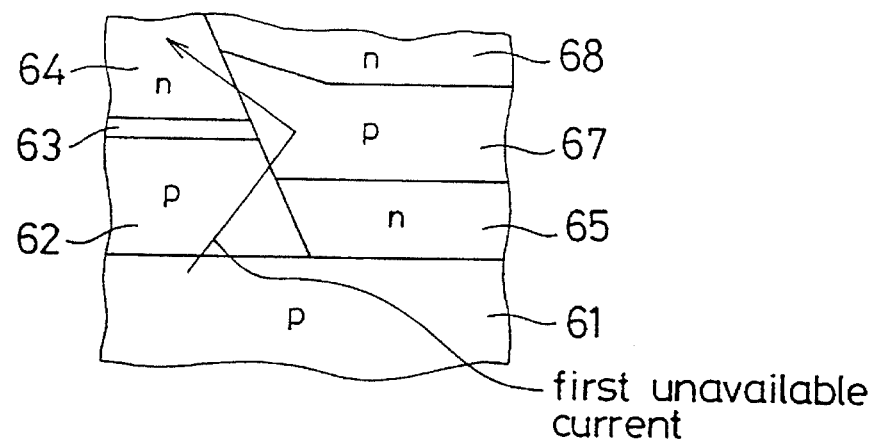
FIG. 18 is a schematic diagram for explaining operation of the semiconductor laser according to the fourth embodiment of the present invention in the case where the second conductivity type current blocking layer is thinner than the first conductivity type lower cladding layer.
Figure 48:
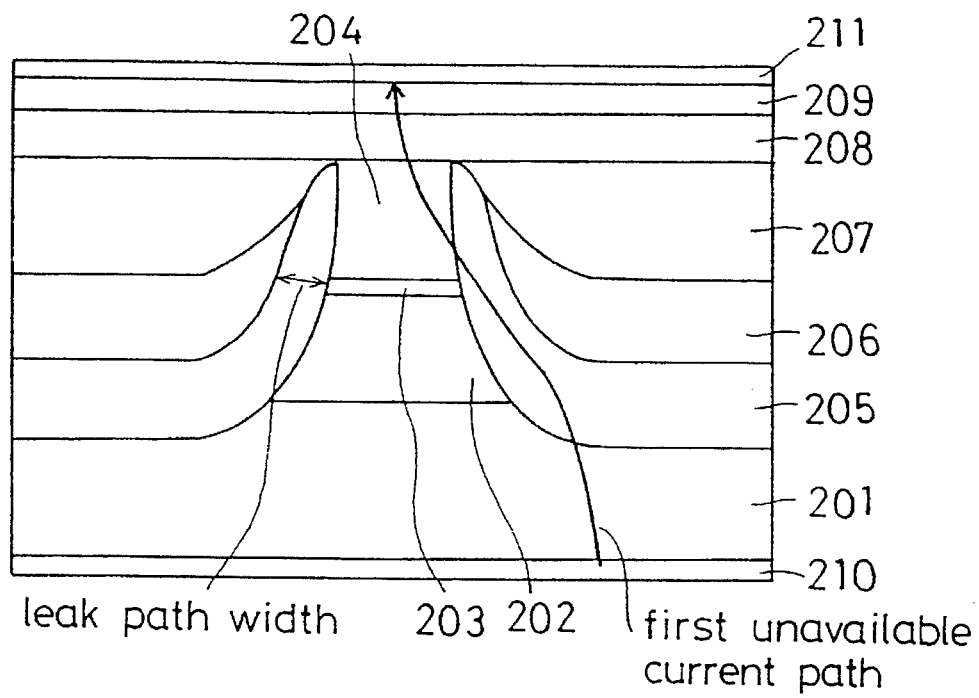
FIG. 48 is a sectional view of a conventional semiconductor laser with the first reactive current path.
Figure 49:
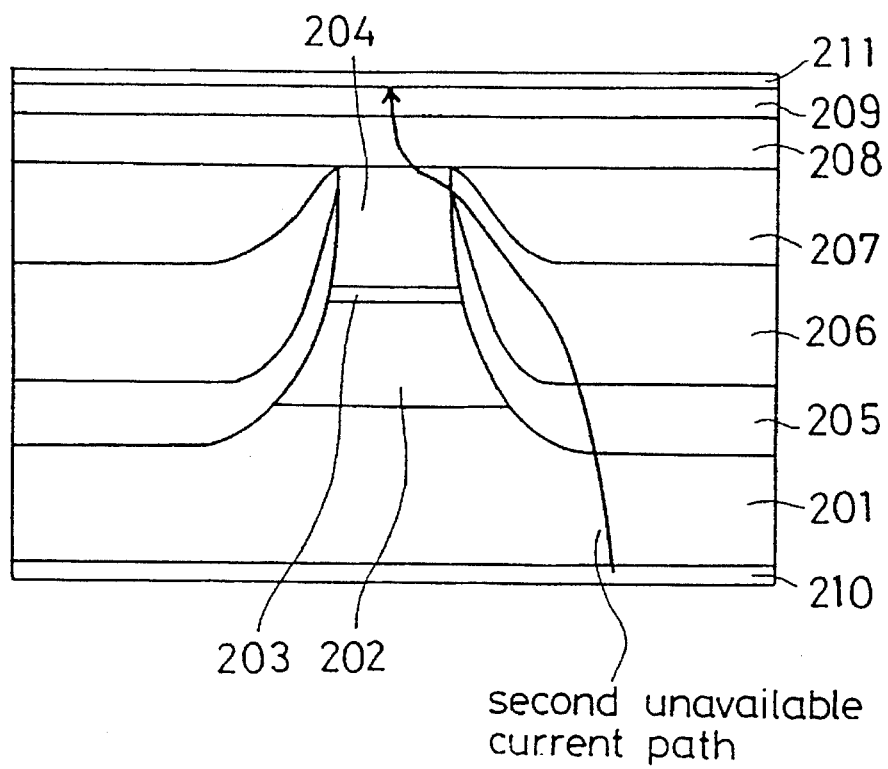
FIG. 49 is a sectional view of a conventional semiconductor laser with the second reactive current path.
Figure 50:
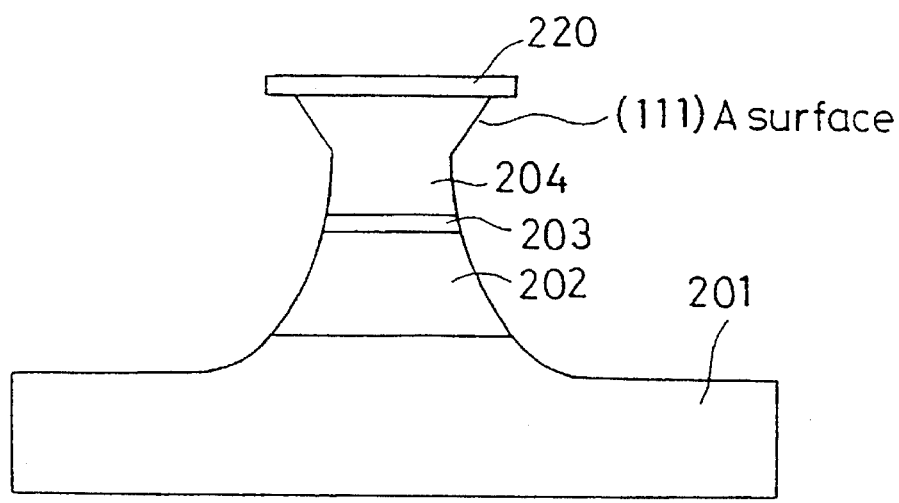
FIG. 50 is a sectional view of a stripe-shaped mesa formed in a conventional method for fabricating a semiconductor laser.
Figure 51:
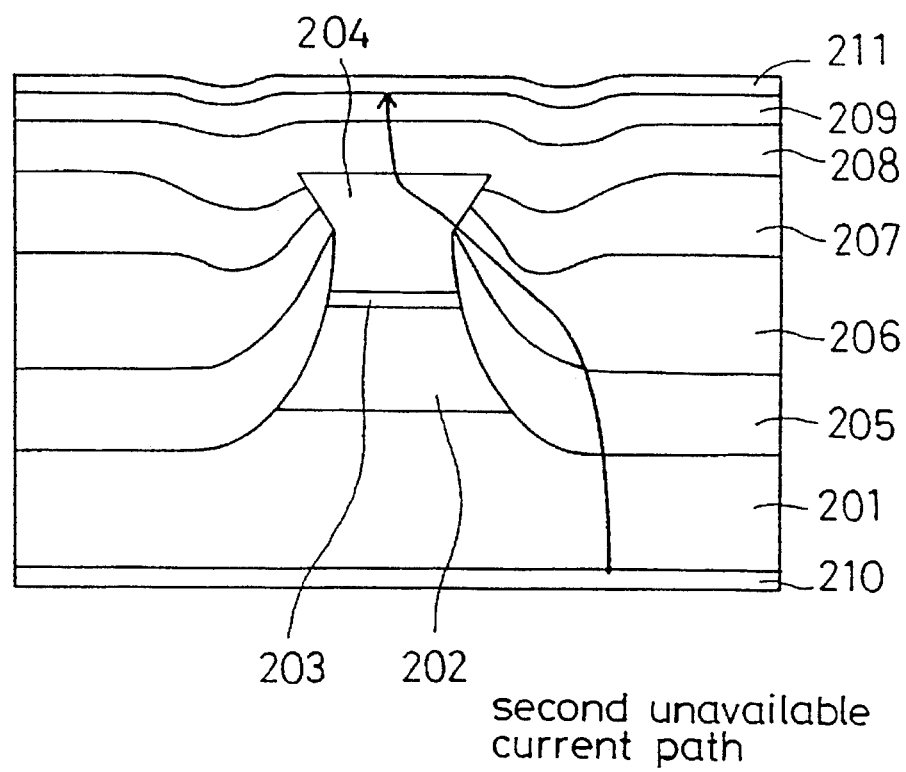
FIG. 51 is a sectional view of a semiconductor laser formed by embedding the mesa of FIG. 50 with crystal layers, in which a second reactive current path is formed.
Figure 52:
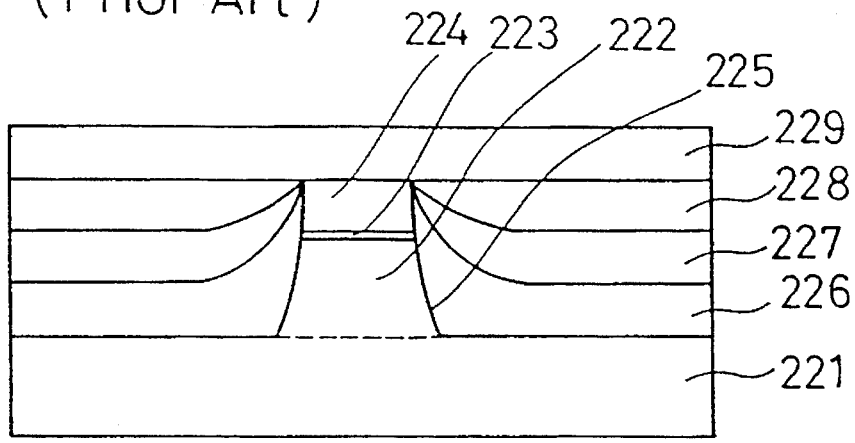
FIG. 52 is a sectional view illustrating a semiconductor laser according to the prior art.

When the thickness of the n type InP current blocking layer 65 is the same as that of the p type InP cladding layer 62 as shown in FIG. 17, the p type cladding layer 62 is not in contact or is in contact at a line with the p type current blocking layer 67. Therefore, the resistance to the current flowing from the p type cladding layer 62 to the p type current blocking layer is very large, so that leakage current hardly flows. On the other hand, when the n type InP current blocking layer 65 is thinner than the p type InP buffer layer 62, reactive current of the same type as the first reactive current flows through an interface between the p type cladding layer 62 and the p type current blocking layer 67 as shown in FIG. 18. Even if the mesa embedding growth is carried out under with the best condition in the conventional LPE method, the width of the leakage current path shown in FIG. 48 is about 0.5 μm. Therefore, if the width of the interface between the p type cladding layer 62 and the p type current blocking layer 65, i.e., the difference in thicknesses between the layers 62 and 65, is 0.5 μm or less, the leakage current is reduced to an extent equivalent to or more than the reduction achieved in the case where the mesa embedding growth is carried out under the best conditions by the conventional LPE method.

Figure 14:
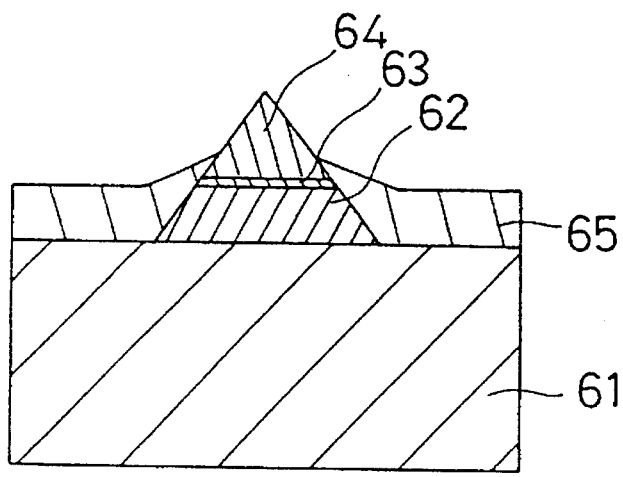
FIGS. 14(a) and 14(b) are sectional views for explaining a difference in configurations of crystal layers grown on different mesa structures formed by selective growth.
Figure 14:
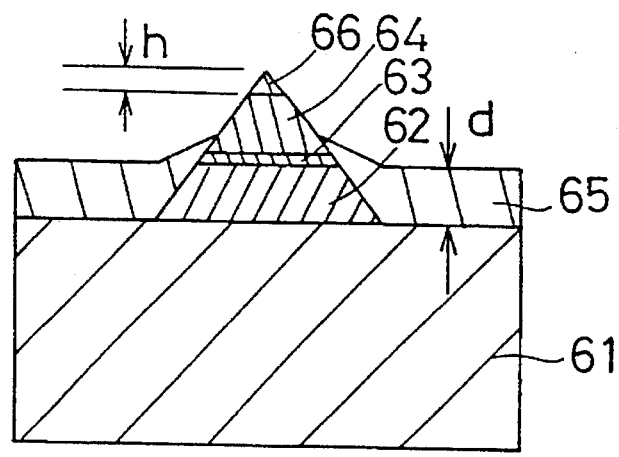
Figure 15:
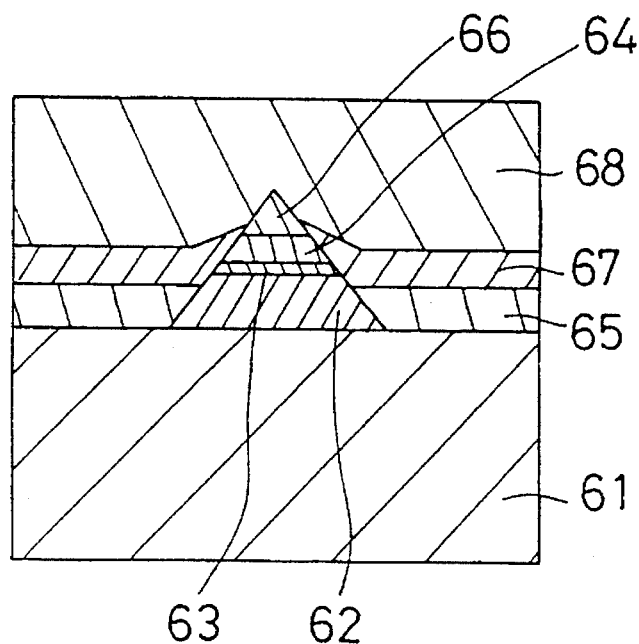
FIG. 15 is a sectional view illustrating a part of a semiconductor laser in accordance with a variation of the fourth embodiment.
Figure 19:
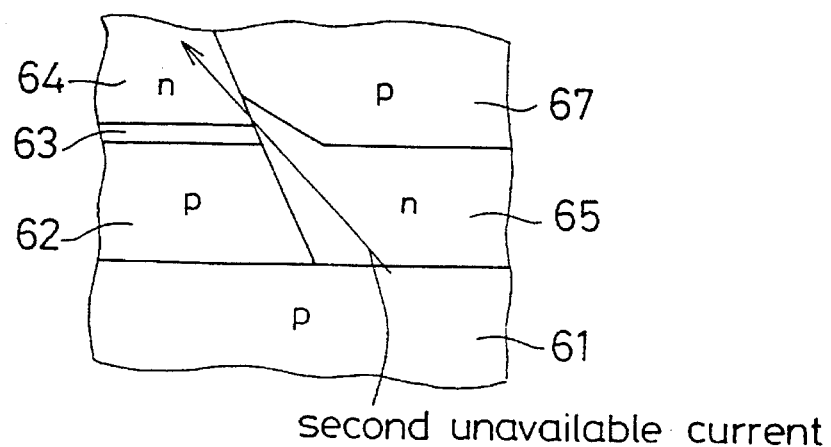
FIG. 19 is a schematic diagram for explaining operation of the semiconductor laser according to the fourth embodiment of the present invention in the case where the second conductivity type current blocking layer is thicker than the first conductivity type lower cladding layer.

If the n type InP current blocking layer 65 is grown on the substrate having the mesa structure of triangular cross section (FIG. 14(a)) or the thickness d of the n type InP current blocking layer 65 is larger than the thickness h of the n type InP cladding layer 66 (FIG. 14(b)), the n type InP layer 65 is grown with swollen portions on opposite sides of the mesa. Since the swollen portion depends on the growth condition and has poor reproducibility, it is difficult to control the position of the upper end of the swollen portion. In this structure, the n type InP current blocking layer 65 is unfavorably in contact with the n type InP cladding layer 64, producing reactive current of the same type as the second reactive current as shown in FIG. 19.

Accordingly, it is important to grow the n type InP current blocking layer 65 parallel to the surface with an appropriate shape of the mesa structure for the thickness of the current blocking layer 65. In this fourth embodiment, since the selective growth of the mesa structure is carried out by MOCVD that offers good controllability and reproducibility, the second reactive current is easily avoided.

Figure 16:
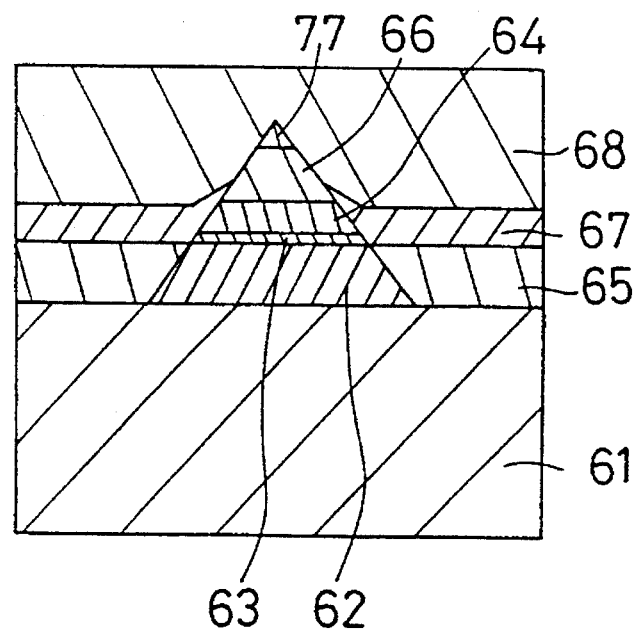
FIG. 16 is a sectional view illustrating a part of a semiconductor laser in accordance with another variation of the fourth embodiment.

While in the fourth embodiment of the present invention the growth of the n type InP layer 66 spontaneously stops with the triangular cross section of the layer 66, the growth of the n type InP layer 66 may be stopped with the trapezoidal cross section of the layer 66 as shown in FIG. 16. In this case, a p type InP layer 77 with triangular cross section is grown on the n type InP layer 66 during the growth of the p type InP layer 67.

Figure 20:
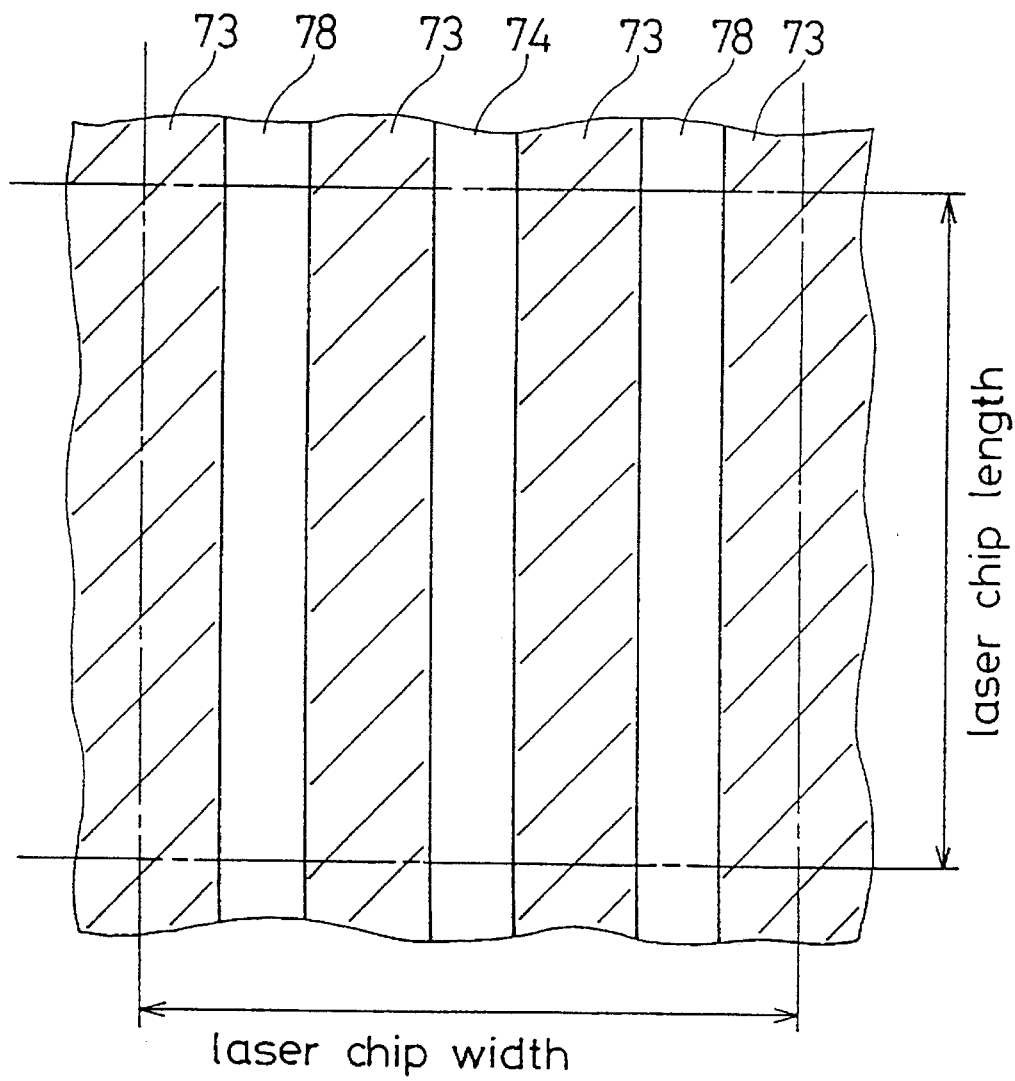
FIG. 20 is a schematic diagram illustrating a mask pattern used for selective growth in the process of fabricating the semiconductor laser in accordance with the fourth embodiment of the present invention.

FIG. 20 is a schematic diagram illustrating a mask pattern for the selective growth according to the fourth embodiment of the present invention. In the Figure, reference numeral 73 designates the mask pattern, numeral 74 designates a window for growing laser active layers, and numeral 78 designates windows for growing dummy layers (hereinafter referred to as dummy windows).

Since the mask pattern 73 has the windows 78 for growing dummy layers, the number of stripes of the mask pattern is increased, reducing the width of each stripe. In the process step of FIG. 12(b), if the stripe width of the mask pattern 73 is large, polycrystalline material is deposited on the mask, which makes the removal of the mask pattern difficult. The deposition of the polycrystalline material on the mask pattern is suppressed if the stripe width of the mask pattern is reduced to several tens to several hundreds of microns as shown in FIG. 20.

Figure 21:
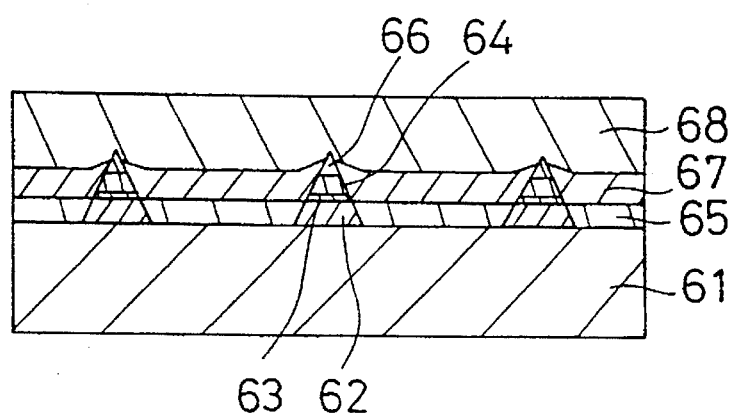
FIGS. 21(a) and 21(b) are sectional views of semiconductor lasers fabricated with the mask pattern of FIG. 20.
Figure 21:
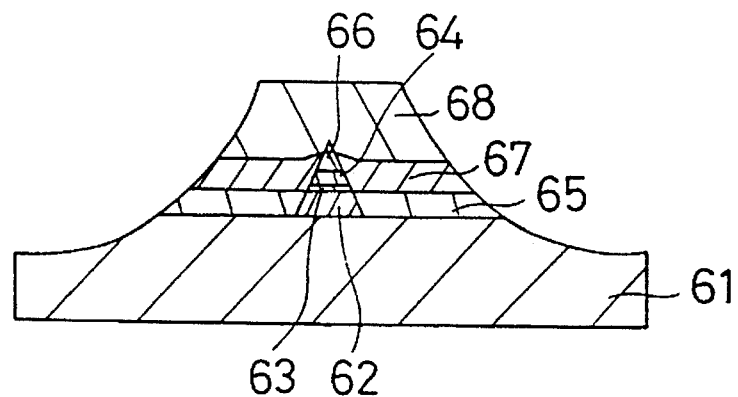

When using the mask pattern of FIG. 20, the laser active layers are grown also in the dummy windows 78 as shown in FIG. 21(a), resulting in a laser array including a plurality of active regions in a chip. When a single laser device is desired, portions of the wafer including the dummy layers are removed by etching or the like as shown in FIG. 21(b).

Although the mask pattern 73 shown in FIG. 20 includes two dummy windows 78 at opposite sides of the window 74, the number of the dummy windows 78 formed in the region corresponding to a laser chip is not restricted thereto.

Figure 22:
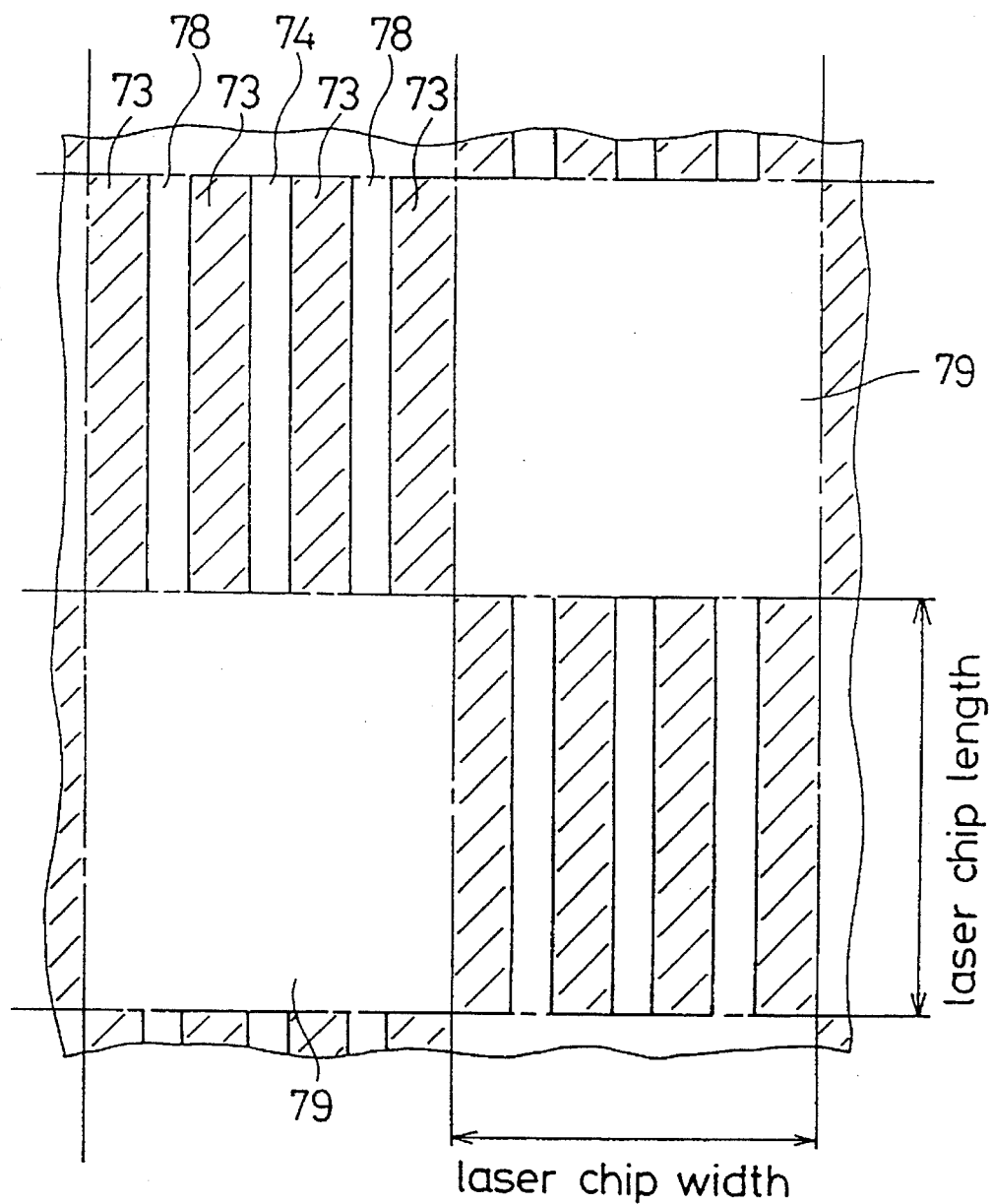
FIG. 22 is a schematic diagram illustrating another mask pattern used for selective growth in the process of fabricating a semiconductor laser in accordance with the fourth embodiment of the present invention.

Furthermore, as illustrated in FIG. 22, large dummy windows 79 may be formed on laser chip regions adjacent to the laser chip regions on which the selective growth is carried out. In this case, since the large dummy windows 79 facilitate the sweep of the growth material, even if the stripe width of the mask pattern 73 is wider than several hundred microns, no polycrystalline material is deposited on the mask 73, increasing the degree of freedom in designing the laser chip region on which the selective growth is carried out.

FIGS. 23(a)–23(e) are perspective views illustrating process steps in a method for fabricating a semiconductor laser in accordance with a fifth embodiment of the present invention. In the Figures, reference numeral 81 designates a p type InP substrate, numeral 82 designates a p type InP lower cladding layer, numeral 83 designates an undoped InGaAsP active layer, numeral 84 designates an n type InP upper cladding layer, numeral 85 designates an InGaAs dummy layer, and numeral 86 designates an InP dummy layer.

Initially, there are successively grown on the p type InP substrate 81 the p type InP layer 82 about 1 μm thick, the InGaAsP active layer 83 about 0.1 μm thick, and the n type InP upper cladding layer 84 about 1 μm thick, preferably by MOCVD. Subsequently, the InGaAsP dummy layer 85 about 0.5 μm thick and the InP dummy layer 86 about 0.5 μm thick are successively grown on the n type InP upper cladding layer 84 by MOCVD (FIG. 23(a)).

Figure 23:
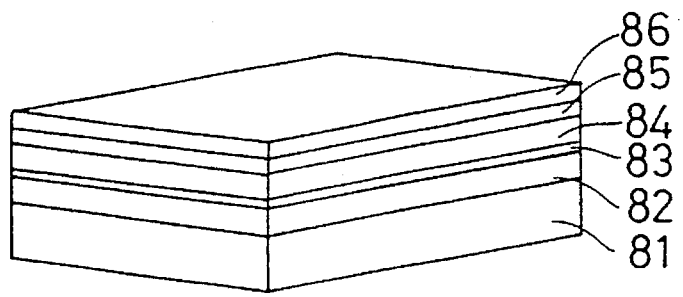
FIGS. 23(a)–23(e) are perspective views illustrating a method for fabricating a semiconductor laser in accordance with a fifth embodiment of the present invention.
Figure 23:
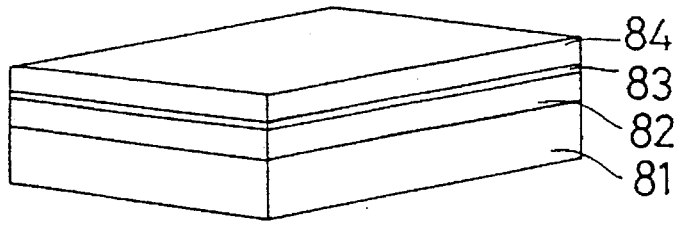
Figure 23:
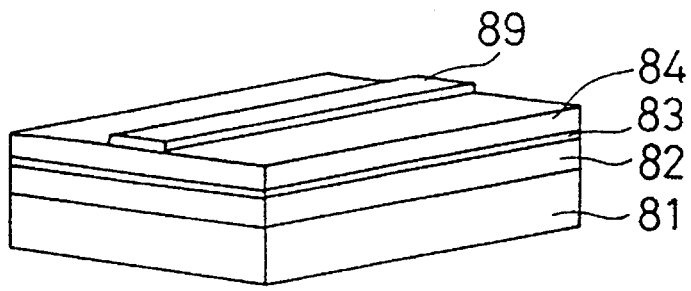
Figure 23:
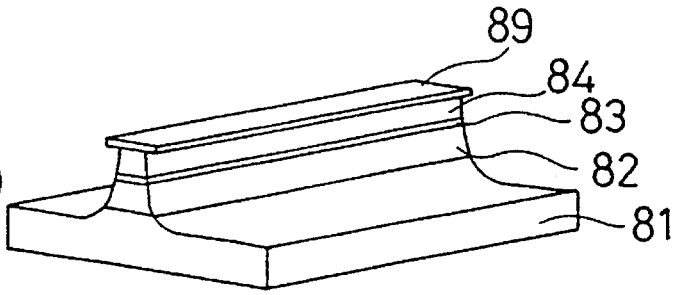
Figure 23:
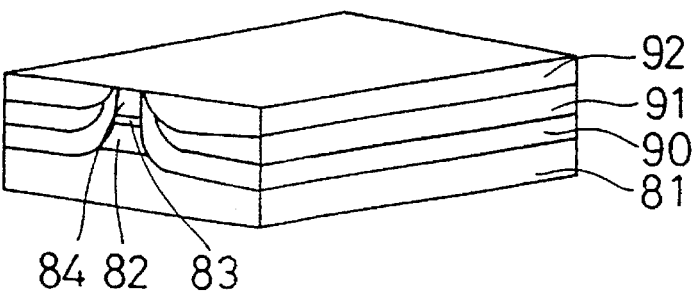

In FIG. 23(b), the InP dummy layer 86 and the InGaAsP dummy layer 85 are selectively etched away using appropriate solutions to expose the surface of the n type InP upper cladding layer 84. The InP dummy layer 86 is etched with an etchant that etches InP but does not etch InGaAsP, such as hydrochloric acid, and the InGaAsP dummy layer 85 is etched with an etchant that etches InGaAsP but does not etch InP, such as a mixture of sulfuric acid, hydrogen peroxide, and water. When using the selective etching technique, the dummy layers 86 and 85 are completely removed and the etching is stopped at the time when the surface of the InP upper cladding layer 84 is completely exposed, resulting in a uniform surface before the deposition of photoresist.

After removing the dummy layers and treating the surface of the n type InP upper cladding layer 84 with hydrofluoric acid, a negative photoresist 89 is deposited and patterned in a stripe shape having a width of about 6 μm (FIG. 23(c)). The adhesion of the photoresist pattern 89 to the surface of the n type InP upper cladding layer 4 is uniform in a wafer or in different wafers because the surface before the deposition of the photoresist is uniform.

Using the photoresist pattern 89 as a mask, the wafer is etched until the etching front reaches into the substrate 81, for example, to a depth of about 4 μm, forming a mesa-shaped optical waveguide including the active layer 1 –2 μm wide (FIG. 23(d)). Preferably, the $Br_2:CH_3OH$ system etchant is employed. In the formation of the photoresist pattern 89, the adhesion of the photoresist pattern to the surface of the n type InP upper cladding layer 84 is controlled so as to attain a desired mesa shape, and the adhesion is uniform in a wafer or in different wafers, resulting in a desired mesa shape shown in FIG. 23(d), i.e., the gently-sloping mesa.

After removing the photoresist pattern 89, the p type InP current blocking layer 90, the n type InP current blocking layer 91, and the p type InP current blocking layer 92 are successively grown on the substrate 81 contacting opposite sides of the optical waveguide by LPE (FIG. 23(e)). Since the optical waveguide of the desired shape, i.e., ordinary mesa shape, is always attained in the above-described etching process, the n type InP current blocking layer 91 is not in contact with the n type InP upper cladding layer 84 during the mesa embedding growth process, an increase in the leakage current during the laser operation is avoided.

Thereafter, the n type InP upper cladding layer and the n type InGaAsP contact layer are successively grown over the surface of the wafer, and the p side electrode and the n side electrode are formed on the rear surface of the substrate 81 and on the surface of the contact layer, respectively, completing a semiconductor laser.

According to the fifth embodiment of the present invention, after the growth of the semiconductor layers 82, 83, and 84 forming the double heterojunction structure, the dummy layers 85 and 86 are successively grown. Then, the dummy layers are etched away to expose the surface of the uppermost layer 84, followed by the surface treatment with hydrofluoric acid and the deposition of the photoresist 89. Since the surface state of the crystal layer before the deposition of the photoresist is uniform, the adhesion of the photoresist to the upper most layer 84 is uniform, resulting in uniform etching profile that improves reproducibility in the subsequent step of growing the current blocking layers.

While in the above-described fifth embodiment two dummy layers, i.e., the InGaAsP layer 85 and the InP layer 86, are employed because the control of the source gas in the CVD apparatus is easy if the crystal growth is finished with the InP layer, the dummy layer may be a single layer, i.e., the InGaAsP layer, that is selectively etched without etching the InP upper cladding layer. Also in this case, the same effects as described above are achieved.

The thickness of the dummy layer is, for example, 0.1 μm or more, so that the dummy layer is grown with uniform composition by MOCVD. Although there is no upper limit, it is desired that the dummy layer be thinner than 1 μm so as not to take much time in the crystal growth and the etching removal.

Although a negative photoresist is employed because it has a resistance to the $Br_2:CH_3OH$ solution, a positive photoresist may be employed so long as it has a resistance to the $Br_2:CH_3OH$ solution.

Although a p type InP substrate is employed, an n type InP substrate may be employed with the same effects as described above. In this case, an n type InP lower cladding layer, the InGaAsP active layer, and a p type InP upper cladding layer are disposed on the substrate.

Although the fifth embodiment of the present invention is applied to a Fabry-Perot semiconductor laser, it may be applied to a DFB (Distributed Feedback) semiconductor laser with the same effects as described above.

Before describing sixth to eighth embodiments of the present invention, a description is given of a method for embedding a stripe shape mesa with InP layers grown by MOCVD, which mesa is formed on an InP substrate with a (001) surface orientation using an $SiO_2$ mask extending along the <110> direction.

A vacuum tube type vertical reactor is used as an MOCVD apparatus. Trimethylindium (TMI) and phosphine ($PH_3$) are used as source materials of the InP layer. The MOCVD growth is performed at a growth temperature of 650° C. and a growth pressure of 76 torr. The ratio of $PH_3$/TMI is 100. A growth rate of 3 μm/hr is adopted. P type InP layers and n type InP layers are alternatingly laminated, and the lamination is etched with a stain etchant of $K_3Fe(CN)_6:KOH:H_2O$ system to observe the cross section of the respective layers. Diethylzinc (DEZn) is used as a source of a p type impurity and hydrogen sulfide ($H_2S$) is used as a source of an n type impurity. The rise and fall of the temperature before and after the growth are carried out in a $PH_3$ gas atmosphere to prevent the substrate from being thermally deteriorated.

Figure 28:
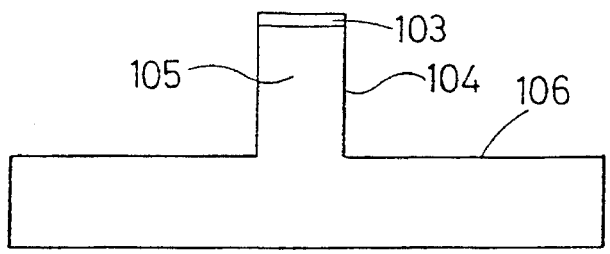
FIG. 28 is a sectional view illustrating a mesa structure having a rectangular cross section.

First of all, an MOCVD growth for embedding a stripe shape mesa structure shown in FIG. 28 with InP layers will be described. The stripe shape mesa of FIG. 28 extends along the <110> direction and has a rectangular cross section, i.e., a (1$\bar{1}$0) surface 104 forms the side wall. The mesa is formed by dry etching with a $C_2H_6:O_2$ system etchant. An $SiO_2$ film 103 serving as a mask for selective growth is formed on the surface of the wafer. FIGS. 29(a)–29(d) are sectional views illustrating a mesa embedding growth mechanism in which the stripe shape mesa 105 of FIG. 28 is embedded with p type and n type InP layers alternatingly grown on opposite sides of the mesa. In the Figures, reference numerals 120 to 123 designate mesa embedding crystal layers. In the initial stage of the crystal growth, as shown in FIG. 29(a), the crystal layer 120 is grown on the (1$\bar{1}$0) surface 104 and on the flat (001) surface 106 at the same growth rate. A (111)B surface 107 is formed at an end of the crystal layer 120 in the vicinity of the upper end of the mesa 105. No crystal layer is grown on the (111)B surface 107. The angle $\Theta_1$ between the (111)B surface 107 and the (001) surface 106 is 55°.

Thereafter, the crystal layers 121 and 122 are grown in the same manner as described above until the stage shown in FIG. 29(c), i.e., until the (1$\bar{1}$0) surface 104 disappears. After the disappearance of the (1$\bar{1}$0) surface 104, the crystal layer 123 is grown on the (111)B surface 108 as shown in FIG. 29(d), whereby the stripe shape mesa 105 is completely embedded with the crystal layers 120 to 123. No crystal layer is grown on the (111)B surface 107 by MOCVD because group V atoms form the (111)B surface 107. However, in the stage shown in FIG. 29(d), since the (111)B surface 107 is in contact with the (001) surface 106 at the point 108, particles grown on the (001) surface 106 provide a site 109 which enables crystal growth on the (111)B surface (FIG. 30(a)), whereby the crystal growth proceeds on the (111)B surface (FIG. 30(b)).

When the stripe shape mesa with vertical side walls is buried with crystal layers, since the mask 103 does not protrude over the side surfaces of the mesa, the mask 103 does not adversely affect the source gas flow, resulting in a flat surface on the mesa embedding crystal layers as shown in FIG. 29(d).

Using the above-described mesa embedding crystal growth mechanism, a p type InP first embedding layer is grown as the crystal layer 120 in the step of FIG. 29(a) and, thereafter, an n type InP second embedding layer is grown as the crystal layers 121 and 122 in the steps of FIGS. 29(b) and 29(c), resulting in a laser structure in which the n type InP second embedding layer is not in contact with the n type first upper cladding layer on the active layer and the leakage current path is narrow.

Figure 31:
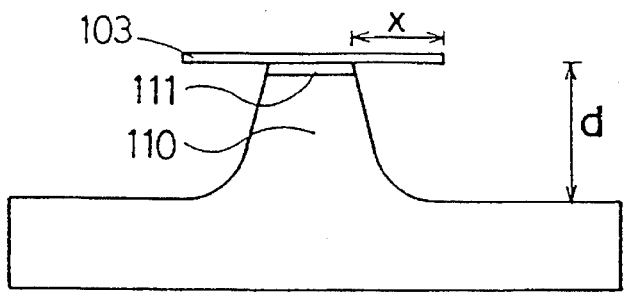
FIG. 31 is a sectional view illustrating a mesa structure having a trapezoidal cross section, side walls of which slope along arcs in the vicinity of the substrate.
Figure 32:
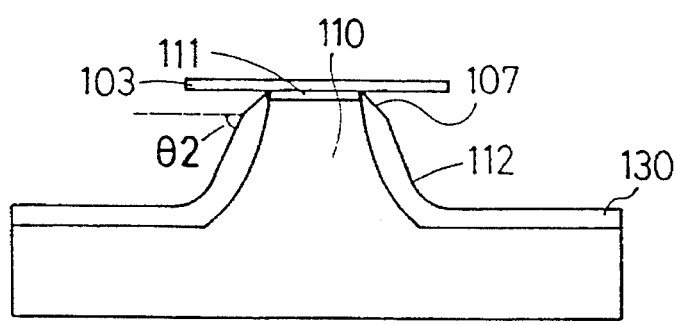
FIGS. 32(a)–32(d) are sectional views illustrating a growth mechanism of crystal layers for embedding the mesa structure of FIG. 31.
Figure 32:
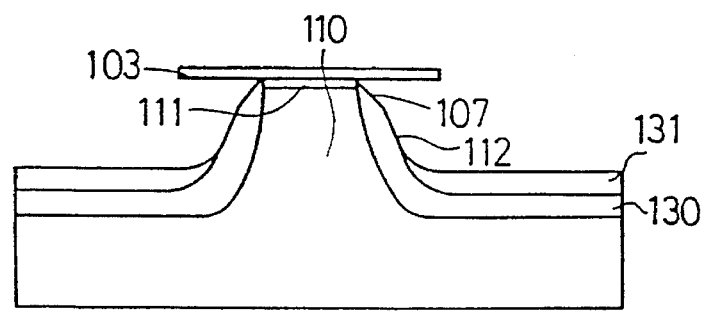
Figure 32:
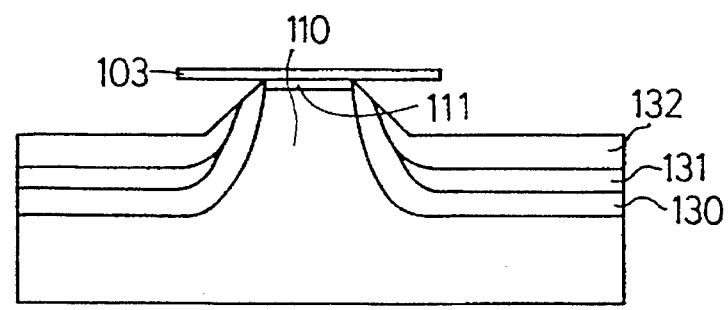
Figure 32:
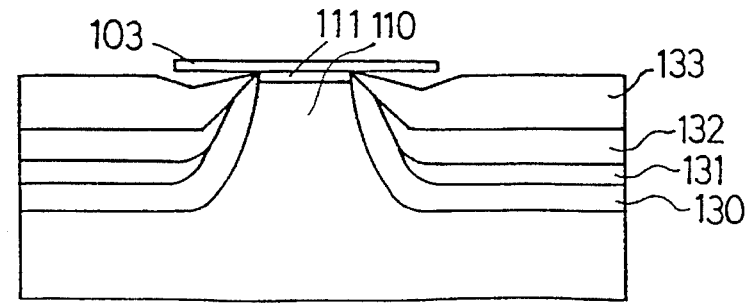

A description is now given of a mesa embedding growth mechanism for embedding a stripe mesa 110 shown in FIG. 31 extending along the <110> direction and having a trapezoidal cross section in which the width of the stripe is narrowest at the upper end of the mesa and gradually increases downward drawing an arc at the bottom of the mesa. The mesa structure 110 is formed by a wet etching using a $HBr:H_2O_2:H_2O$ system etchant. More specifically, a wafer with an $SiO_2$ mask 103 is put in a mixture of $HBr:H_2O_2:H_2O$ (=2:1:10), which is heated to 20° C., for sixteen minutes, whereby the mesa structure 110 with the depth d of 2.5 μm is attained. If the material directly under the $SiO_2$ mask 103 is InGaAs(P) 111, a trapezoidal mesa with no (111)A surface at the side walls is attained. In the formation of the stripe shape mesa 110, side etching proceeds under the $SiO_2$ mask 103 at opposite sides of the mesa as shown in FIG. 31, whereby the mask 103 protrudes over each side wall of the mesa by 1.7~1.8 μm (x=1.7~1.8 μm), which is about 70% of the depth d of the mesa.

FIGS. 32(a)–32(d) are sectional views illustrating the mesa embedding growth mechanism for embedding the trapezoidal mesa structure 110 of FIG. 31 with p type InP layers and n type InP layers alternatingly grown at opposite sides of the mesa. In the Figures, reference numeral 130 to 133 designates mesa embedding crystal layers.

In the initial stage of the crystal growth shown in FIG. 32(a), the crystal layer 130 is grown with the (111)B surface 107 at opposite sides of the upper end of the mesa and a (221)B surface 112 under the (111)B surface 107. The angle $\Theta_2$ between the (221)B surface 112 and the (001) surface is 70°.

Since the crystal hardly grows on the (111)B surface 107 and on the (221)B surface 112, the crystal layer 131 is grown only on the flat portion of the wafer as shown in FIG. 32(b) and, subsequently, the crystal layer 132 is grown in the same manner as the layer 131, resulting in the structure of FIG. 32(c) in which the (221)B surface 112 disappears. Thereafter, the crystal layer 133 is grown in the same manner as already described with respect to the crystal layer 123 in the step of FIG. 29(d), whereby the mesa 110 is embedded with the crystal layers.

The opposite ends of the $SiO_2$ mask 103 protrude over the side walls of the mesa 110 due to the side etching of the wafer under the mask 103, and the protruding portions of the mesa 103 adversely affect the source gas flow. Therefore, the surface of the structure shown in FIG. 32(d) is not completely flat but has depressions about 0.8 μm deep at opposite sides of the mesa. These depressions disappear if a crystal layer about 2 μm thick is grown on the wafer after the removal of the SiO₂ mask 103, whereby the surface of the wafer is flattened.

Using the above-described mesa embedding growth mechanism, a p type InP first embedding layer with the (221)B surface is grown as the crystal layer 130 in the step of FIG. 32(a) and, thereafter, an n type InP second embedding layer is grown as the crystal layers 131 and 132 in the steps of FIGS. 32(b) and 32(c), resulting in a laser structure in which the n type InP second embedding layer is not in contact with the n type first upper cladding layer on the active layer and the leakage current path is narrow.

Figure 33:
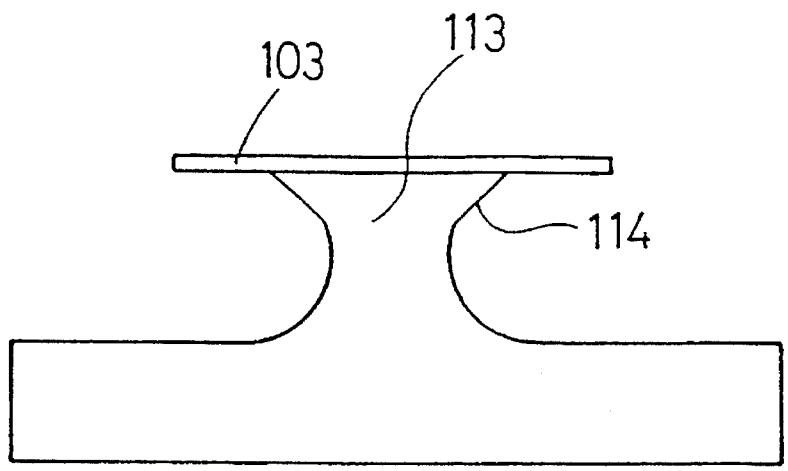
FIG. 33 is a sectional view illustrating a mesa structure an upper part of which is in a reverse-mesa shape.
Figure 34:
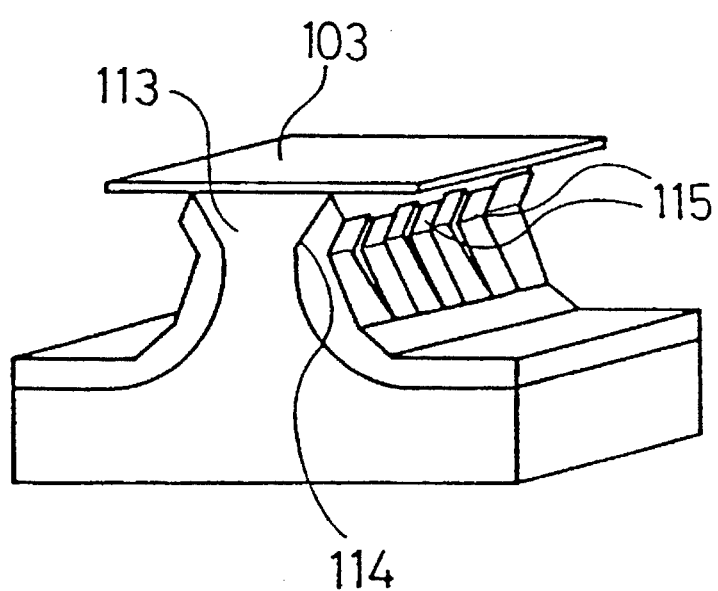
FIG. 34 is a perspective view illustrating the mesa structure of FIG. 33 side walls of which are embedded with crystal layers having uneven surfaces.

A description is given of a mesa embedding growth for embedding a stripe-shaped reverse mesa 113 shown in FIG. 33 extending along the <110> direction and having a (111)A surface 114 at opposite sides of the upper part of the mesa. The mesa 113 is formed by a wet etching using the Br₂:CH₃OH system etchant. Also in this case, the (111)B surface 107 is formed at the upper end of the mesa in the initial stage of the crystal growth, and no crystal grows on the (111)B surface. However, the (111)A surface 114 shown in FIG. 33 is uneven due to the mesa etching. In addition, the (111)A surface 114 is formed by the group III atoms, such as In atoms which react with oxygen in the atmosphere, so that the (111)A surface 114 is easily contaminated. The uneven (111)A surface 114 results an uneven surface 115 of a crystal layer grown on the side wall of the mesa by MOCVD, as shown in FIG. 34. As a result, the leakage current path width unfavorably varies in the wafer or in the laser resonator during fabricating the laser structure.

In the sixth to eighth embodiments of the present invention described hereinafter, the above-described mesa embedding mechanism, which was experimentally discovered by the inventors of the present invention for the first time, is effective utilized, and a semiconductor laser employing a p type substrate and having less reactive current is realized by the present invention for the first time.

Figure 24:
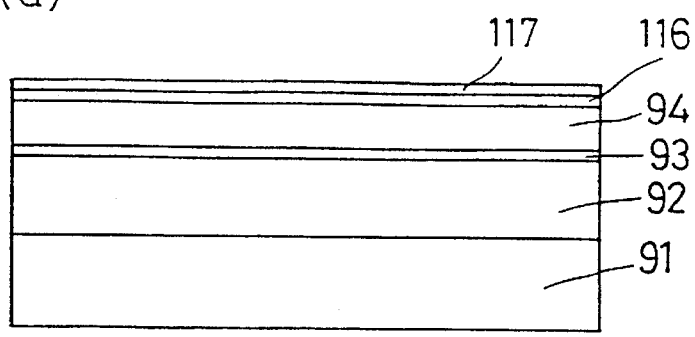
FIGS. 24(a)–24(d) are sectional views illustrating a method for fabricating a semiconductor laser in accordance with a sixth embodiment of the present invention.
Figure 24:
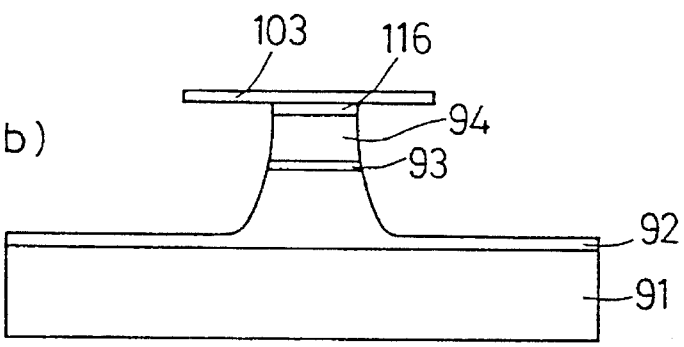
Figure 24:
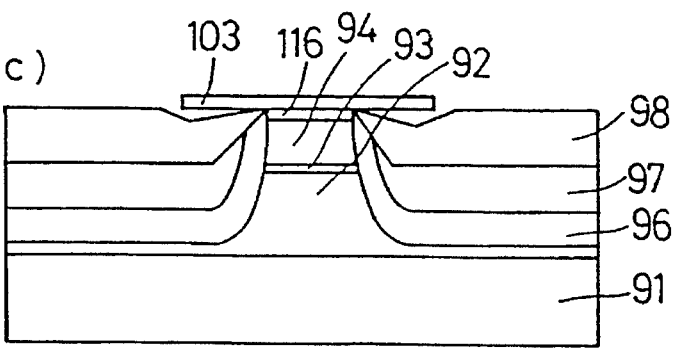
Figure 24:
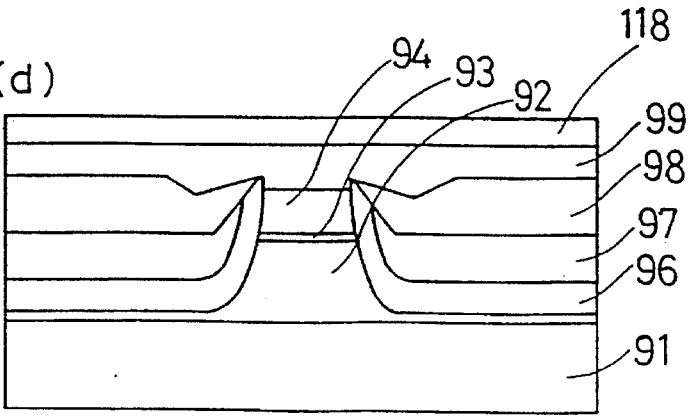

FIGS. 24(a)–24(d) are sectional views illustrating a method for fabricating a semiconductor laser in accordance with the sixth embodiment of the present invention. In FIG. 24(a), there are successively grown on a p type InP substrate 91 (Zn doped, carrier concentration of 5×10¹⁸ cm⁻³, (001) surface orientation) a p type InP buffer layer 92 (Zn doped, carrier concentration of 1×10¹⁸ cm⁻³, 2 μm thick), an undoped InGaAsP active layer 93 (λ=1.3 μm, 0.1 μm thick), an n type InP first upper cladding layer 94 (S doped, carrier concentration of 1×10¹⁸ cm⁻³, 0.7 μm thick), an n type InGaAs cap layer 116 (S doped, carrier concentration of 1×10¹⁸ cm⁻³, 0.1 μm thick), and an n type InP cap layer 117 (S doped, carrier concentration of 1×10¹⁸ cm⁻³, 0.1 μm thick).

These layers are grown by MOCVD. Trimethylindium (TMIn), triethylgallium (TEGa), phosphine (PH₃), arsine (AsH₃), hydrogen sulfide (H₂S), and diethylzinc (DEZn) are employed as source materials. The MOCVD growth is carried out at a growth temperature of 625° C. and a growth pressure of 50 torr. The ratio of V/III is 100.

After selectively removing the n type InP cap layer 117 using HCl, an SiO₂ film 103 is deposited on the n type InGaAs cap layer 116 by sputtering. Then, the SiO₂ film 103 is formed in a stripe shape having a width of 5 μm and extending along the <110> direction using conventional photolithographic techniques. Using the stripe-shaped SiO₂ film 103 as a mask, the wafer is etched with a mixture of HBr:H₂O₂:H₂O(=2:1:10), which is heated to 20° C., for 16 minutes, whereby a stripe-shaped mesa having a trapezoidal cross section and a depth of 2.5 μm is attained as shown in FIG. 24(b).

Thereafter, the mesa structure is buried with crystal layers grown by MOCVD with the same growth conditions as described with respect to FIGS. 32(a)–32(d). More specifically, a first p type InP layer 96 (Zn doped, carrier concentration of 0.8×10¹⁸ cm⁻³, 0.7 μm thick on flat surface), an n type InP layer 97 (S doped, carrier concentration of 7×10¹⁸ cm⁻³, 0.8 μm thick on flat surface), and a second p type InP layer 98 (Zn doped, carrier concentration of 0.8×10¹⁸ cm⁻³, 1 μm thick on flat surface) are successively grown on the p type InP buffer layer 92 at opposite sides of the mesa structure (FIG. 24(c) ).

After removing the SiO₂ mask 103 with HF and the n type InGaAs cap layer 116 with HNO₃, an n type InP second upper cladding layer 99 (S doped, carrier concentration of 1×10¹⁸ cm⁻³, 15 μm thick) and an n type InP contact layer 118 (S doped, carrier concentration of 7×10¹⁸ cm⁻³, 0.5 μm thick) are deposited over the wafer to flatten the surface of the wafer (FIG. 24(d)).

Figure 25:
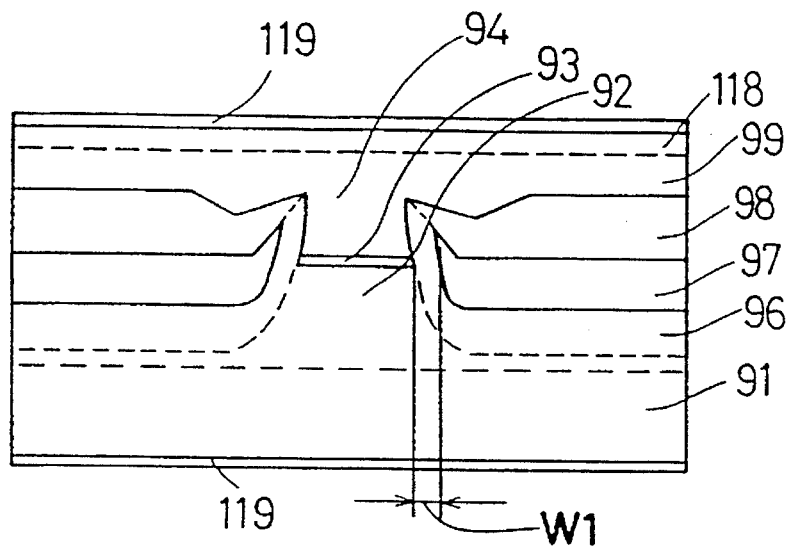
FIG. 25 is a sectional view illustrating a semiconductor laser fabricated according to the process steps of FIGS. 24(a)–24(d).

Thereafter, ohmic electrodes 119 are formed on the n type InP contact layer 118 and on the rear surface of the substrate 91, and the wafer is cleaved so that the (110) surface is exposed at the facet of the Fabry Perot resonator, completing the laser structure of FIG. 25.

Figure 53:
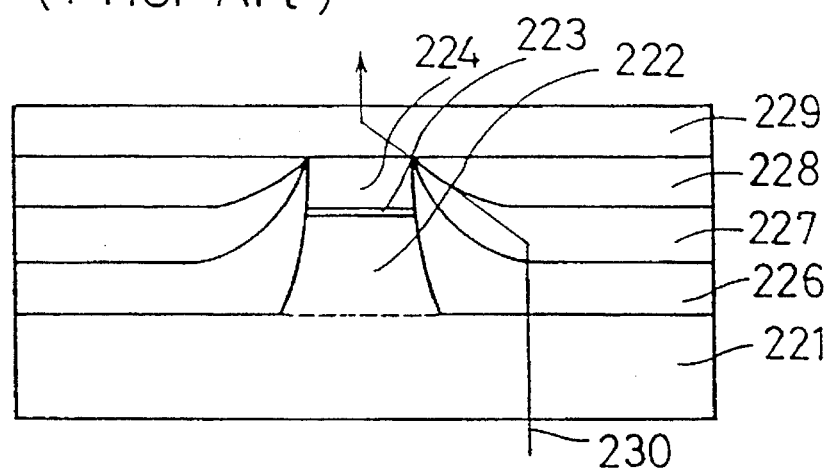
FIG. 53 is a sectional view for explaining the Second reactive current path in the laser structure of FIG. 52.
Figure 54:
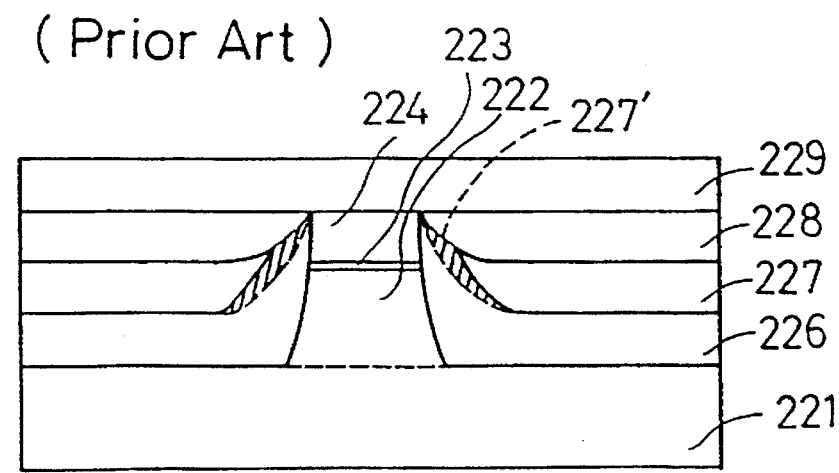
FIG. 54 is a sectional view of a semiconductor laser according to the prior art having means for preventing the second reactive current path.

The growth of the n type InP layer 97 is carried out according to the process steps shown in FIGS. 32(b) and 32(c). The (111)B surface 107 of the first p type InP layer 96 is present at the upper end of the side wall of the mesa, and the growth of the n type InP layer 97 does not proceed on the (111)B surface. Therefore, the n type InP layer does not contact the n type InP first upper cladding layer 94. In this structure, the first reactive current path 230 shown in FIG. 53 is not formed. Since this method does not employ impurity diffusion or the like, the carrier concentrations of the InP layers 96, 97, and 98 are not restricted.

Figure 55:
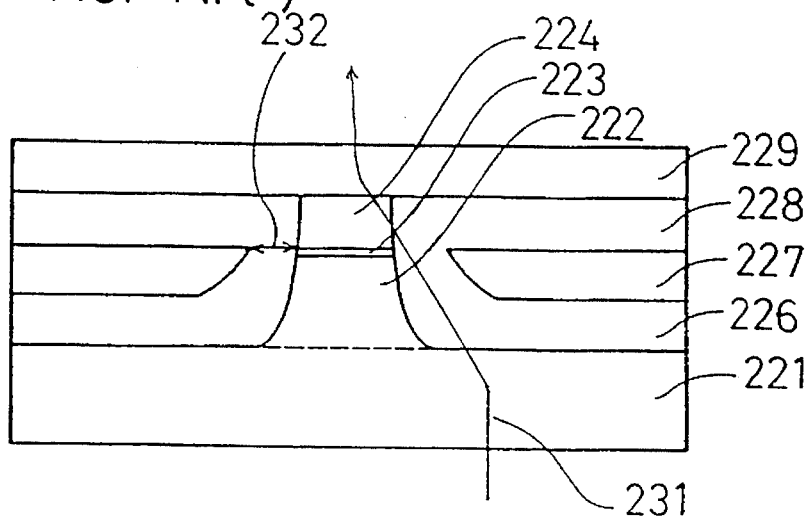
FIG. 55 is a sectional view of a semiconductor laser with the first reactive current path.
Figure 56:
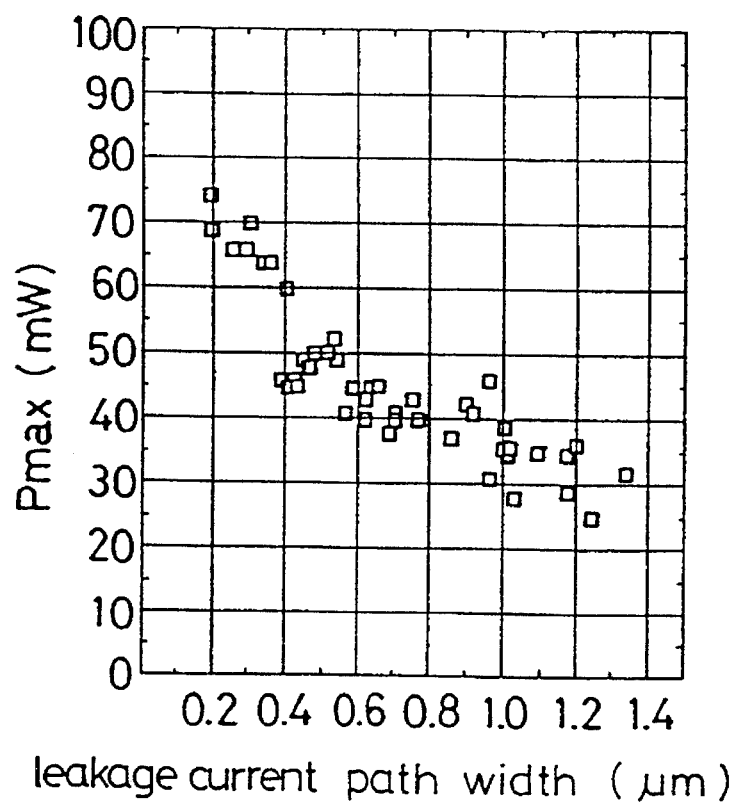
FIG. 56 is a graph illustrating a relation between leakage current path width and maximum output power.
Figure 57:
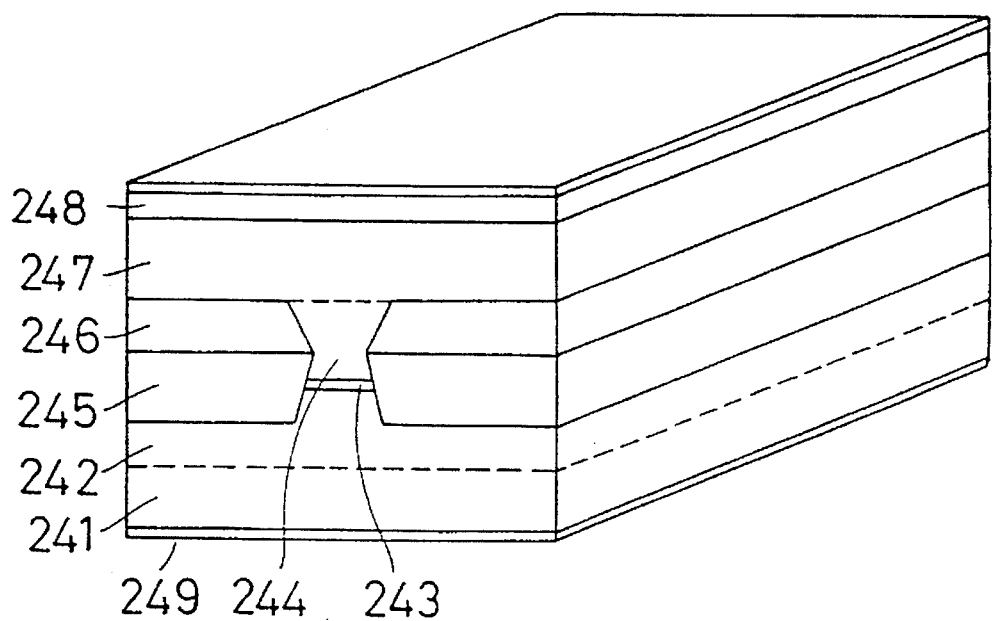
FIG. 57 is a perspective view illustrating a buried heterojunction semiconductor laser employing an n type substrate according to the prior art.
Figure 58:
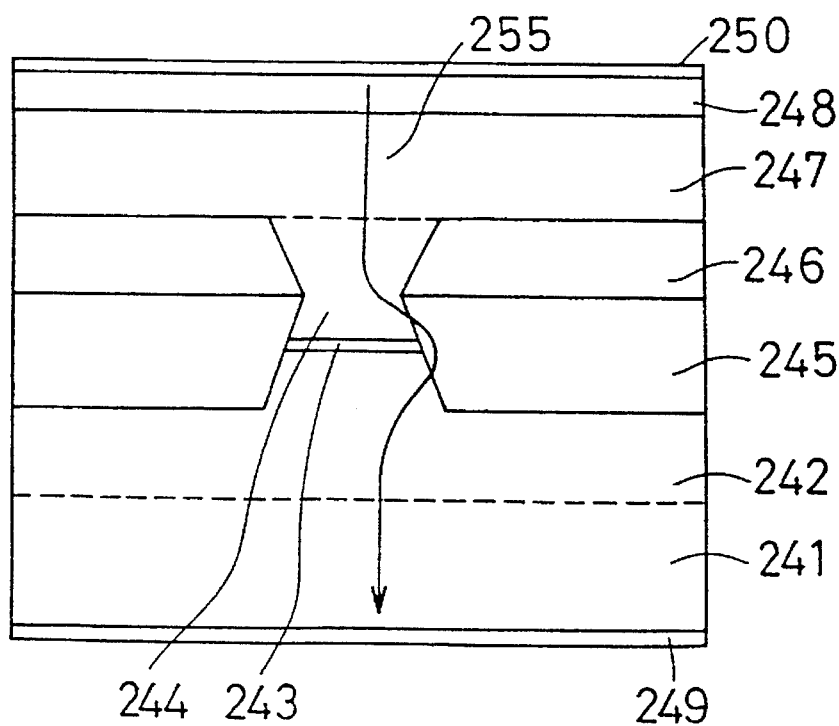
FIG. 58 is a sectional view of the semiconductor laser of FIG. 57.
Figure 59:
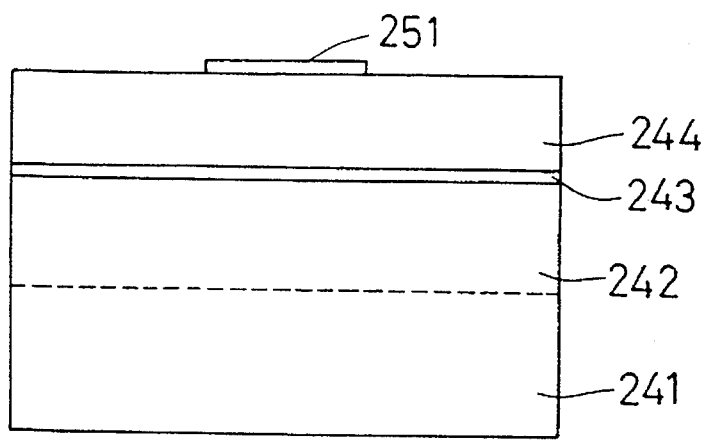
FIGS. 59(a)–59(c) are sectional views illustrating a method for fabricating the laser of FIG. 57.
Figure 59:
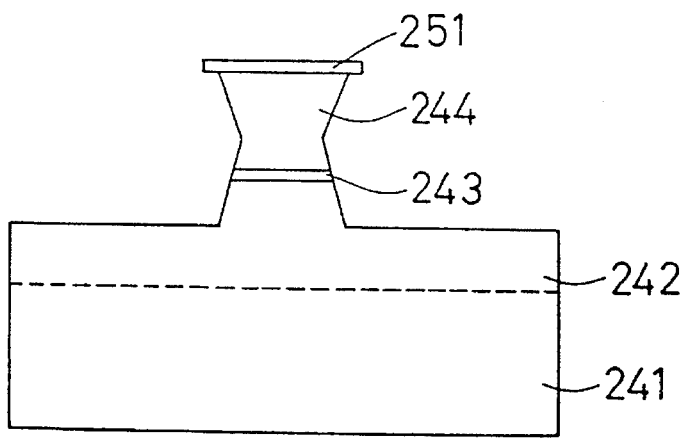
Figure 59:
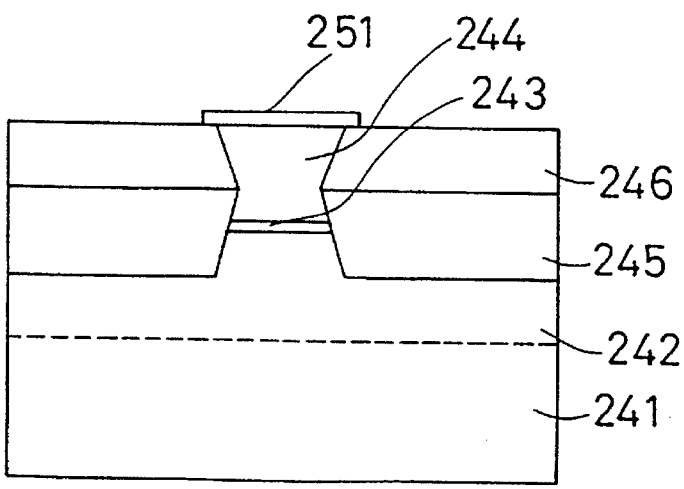

In this sixth embodiment of the present invention, MOCVD, which offers good uniformity and controllability of layer thicknesses, is used for growing the mesa embedding layers 96, 97, and 98. Further, the growth of the first p type InP layer 96 on the opposite sides of the mesa in the transverse direction is stopped by the (221)B surface 112 shown in FIG. 32(a). Therefore, the width 232 of the second reactive current path 231 shown in FIG. 55 can be reduced. That is, once the (221)B surface 112 is formed on the side wall of the mesa, the thickness of the p type InP layer 96 on the side wall of the mesa does not increase with the growth of the layer 96, whereby the leakage current path width is reduced and controlled with high reproducibility.

Figure 35:
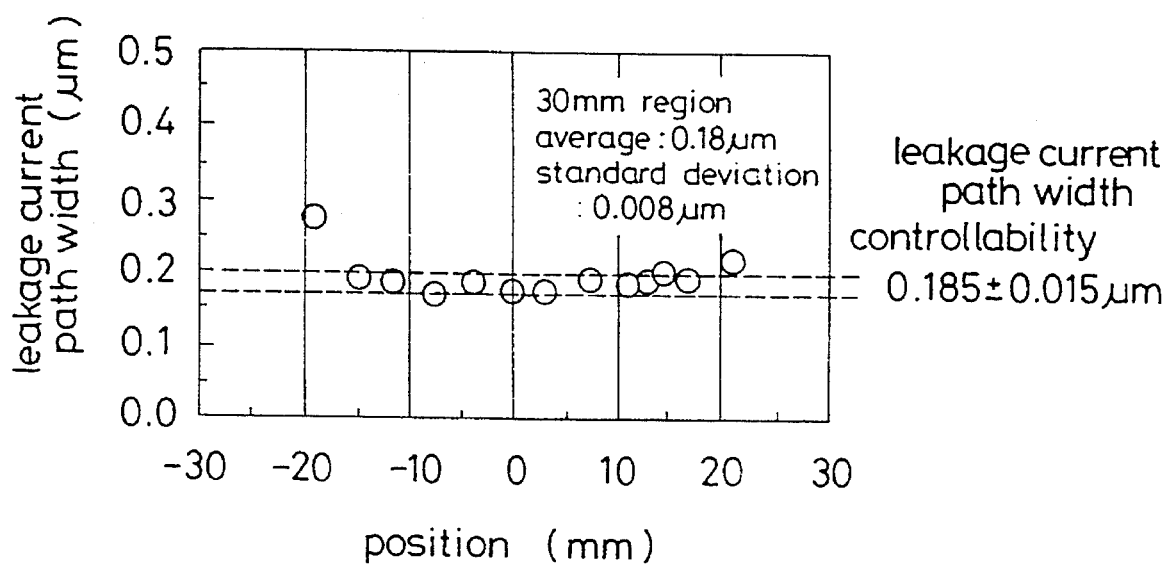
FIG. 35 is a graph illustrating the distribution of leakage current path widths in a semiconductor laser wafer fabricated according to the sixth embodiment of the present invention.
Figure 36:
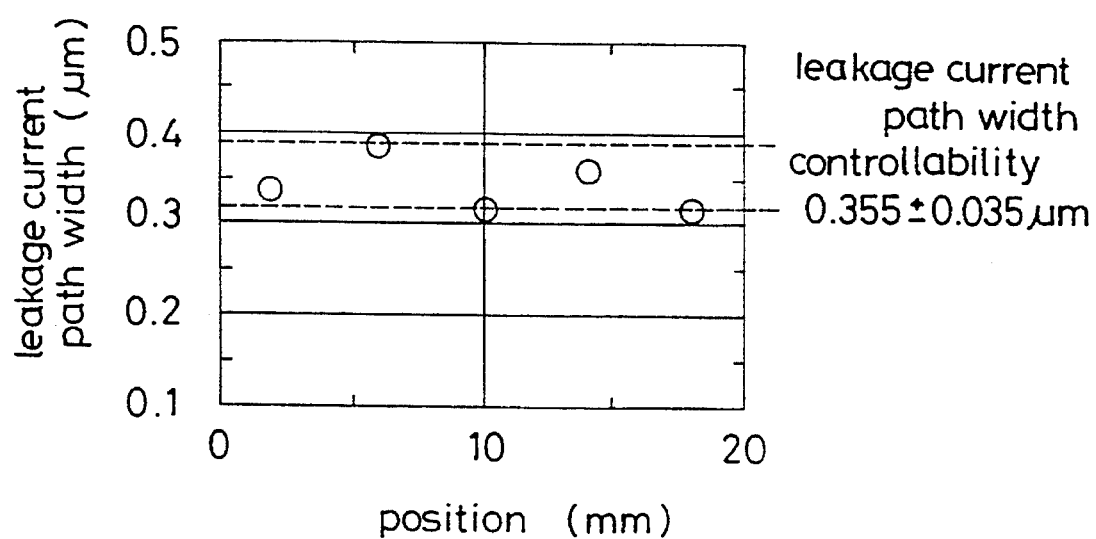
FIG. 36 is a graph illustrating the distribution of leakage current path widths in a semiconductor laser wafer fabricated by the conventional method utilizing impurity diffusion.
Figure 37A:
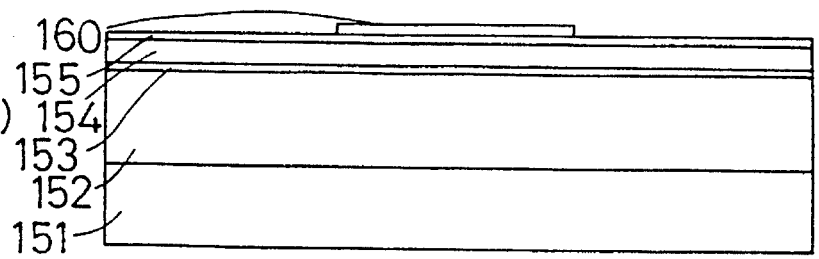
FIGS. 37(a)–37(e) are sectional views illustrating a method for fabricating a semiconductor wafer in accordance with a ninth embodiment of the present invention.
Figure 37B:
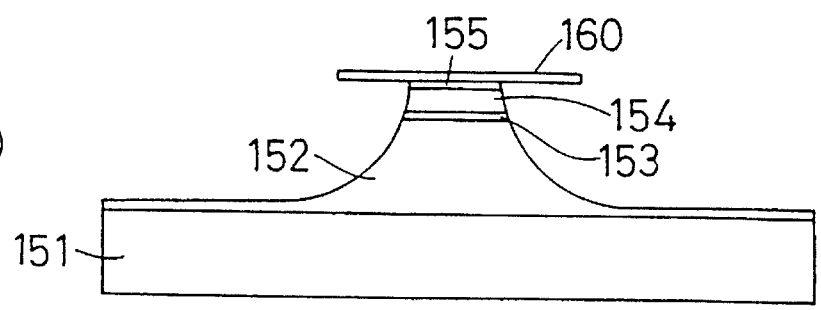
Figure 37C:
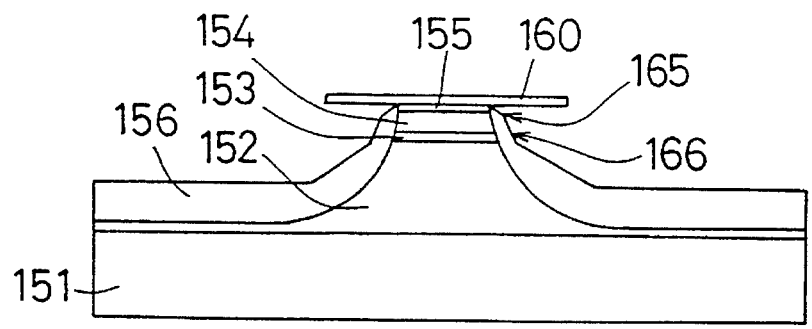
Figure 37D:
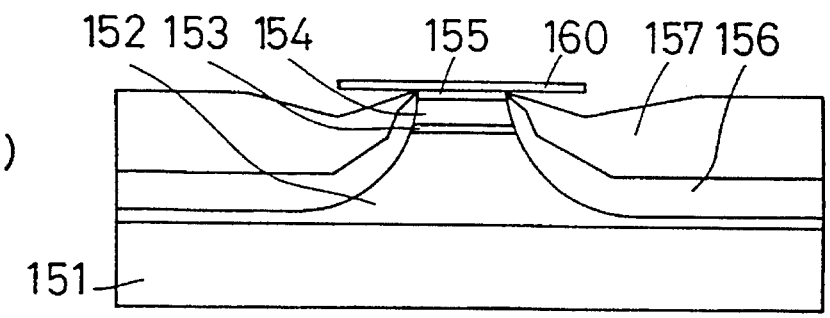
Figure 37E:
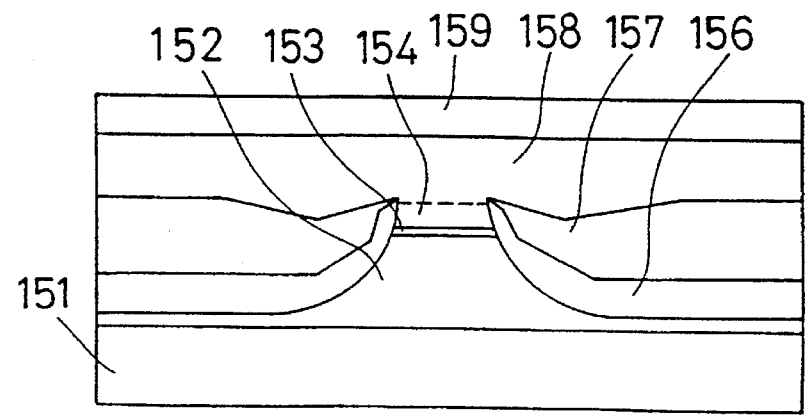

FIG. 35 is a graph illustrating a distribution of leakage current path widths in a wafer fabricated according to the sixth embodiment of the present invention. FIG. 36 is a graph illustrating a distribution of the leakage current path widths in a wafer fabricated by the conventional LPE method utilizing impurity diffusion. As shown in FIG. 35, very narrow and uniform leakage current paths are achieved in this sixth embodiment of the present invention compared with the conventional LPE method. In FIG. 35, the leakage current paths in the vicinity of the periphery of the wafer are wider than those in the center of the wafer. This is because the depths of the mesa structures in the vicinity of the periphery of the wafer are increased during the wet etching and, thereby, the position of the n type InP layer 97 is relatively low compared with the position of the active layer 93. The influence of the mesa depth on the leakage current path was examined by an experiment and it was found that variation in the mesa depth within a range of ±0.2 μm does not adversely affect the leakage current path width.

According to the sixth embodiment of the present invention, semiconductor lasers with less reactive current and improved high output characteristics are fabricated with high uniformity and reproducibility.

Figure 26:
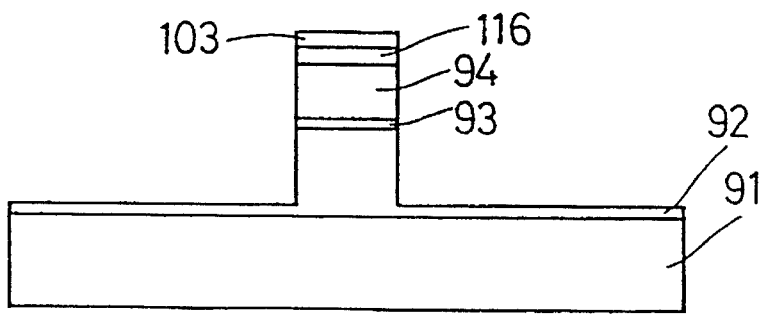
FIG. 26 is a sectional view illustrating a mesa structure in a method for fabricating a semiconductor laser according to a seventh embodiment of the present invention.

A description is given of a seventh embodiment of the present invention. FIG. 26 is a sectional view illustrating a mesa structure with a rectangular cross section formed by dry etching or the like. In the Figure, the same reference numerals as those in FIGS. 24(*a*)–24(*d*) designate the same parts. When mesa embedding crystal layers are successively grown on the p type InP buffer layer 92 contacting opposite side walls of the mesa, the growth proceeds as shown in FIGS. 29(*a*)–29(*d*).

Figure 29:
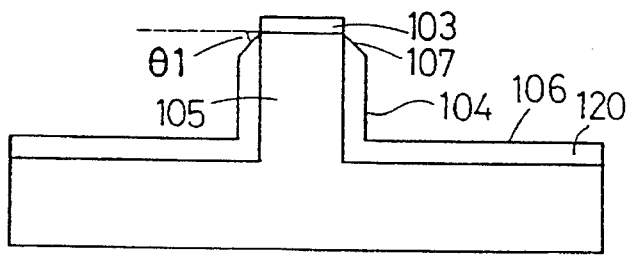
FIGS. 29(a)–29(d) are sectional views illustrating a growth mechanism of crystal layers for embedding the mesa structure of FIG. 28.
Figure 29:
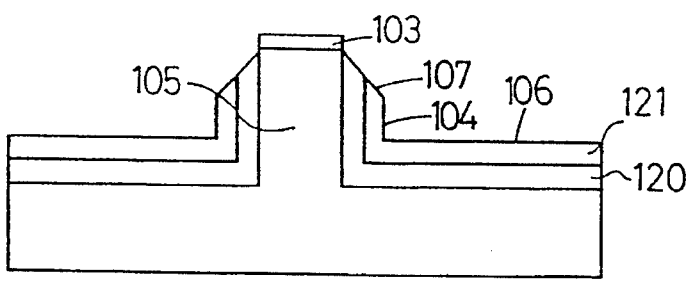
Figure 29:
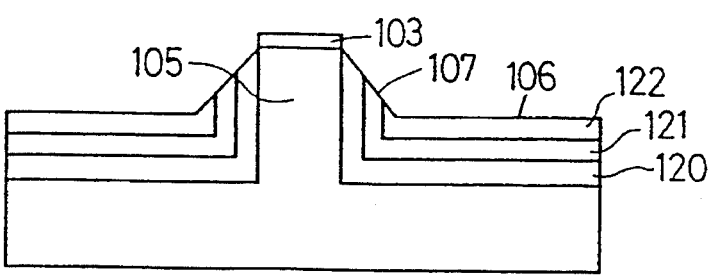
Figure 29:
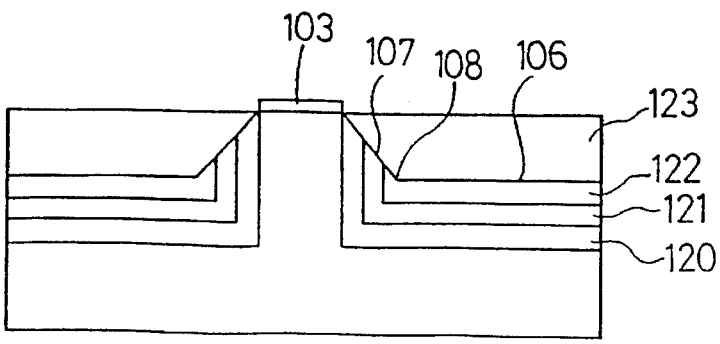
Figure 30:
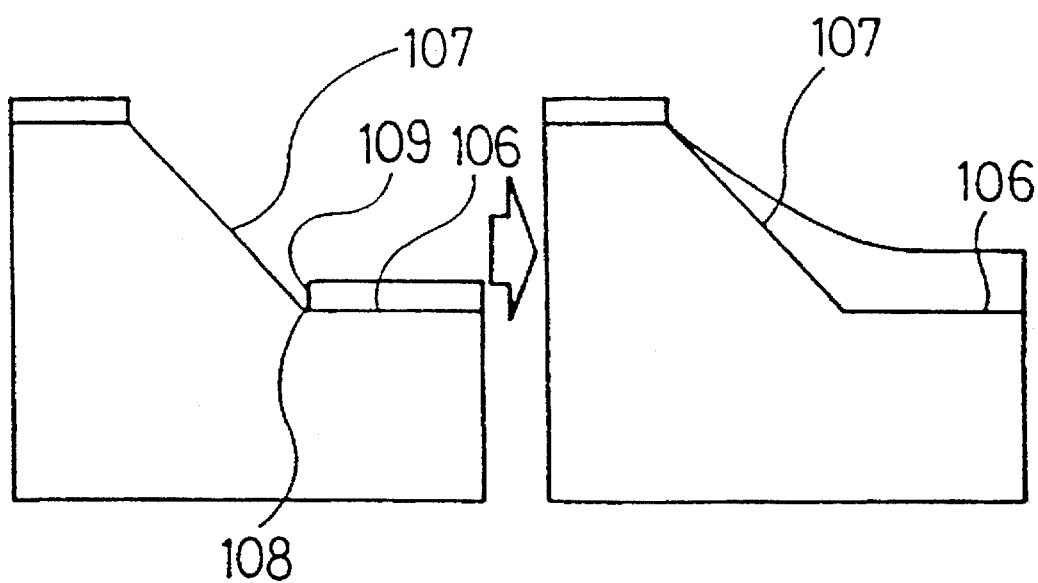
FIGS. 30(a) and 30(b) are diagrams for explaining crystal growth on a (111)B surface.

Initially, as the crystal layer 120 of FIG. 29(*a*), the p type InP layer 96 is grown forming the (111)B surface at opposite sides of the upper end of the mesa. Then, the n type InP layer 97 is grown as the crystal layers 121 and 122 of FIGS. 29(*b*) and 29(*c*). During the growth, the (111)B surface prevents the n type InP layer 97 from contacting the n type InP first upper cladding layer 94.

In this case, since the p type InP layer 96 is grown on a portion of the side wall of the mesa where the (111)B surface 107 is absent, the leakage current path width depends on the thickness of the p type InP layer 96, differently from the above-described sixth embodiment in which the growth of the layer 96 stops when the (221)B surface 112 is formed. Therefore, the leakage current path width is reduced by decreasing the thickness of the p type InP layer 96.

The controllability of the leakage current path width depends on grown layer thickness controllability using MOCVD. MOCVD provides a thin film of several Å thickness, a thickness distribution in a range of ±5% in a 2-inch wafer, and a thickness reproducibility in a range of ±5% in a 2-inch wafer. Therefore, if the average of the leakage current path widths is set to 0.1 μm, the controllability, including uniformity and reproducibility, of the leakage current path width in a wafer is in a range of ±0.01 μm, which means that the controllability is significantly improved. As the result, the reactive current is significantly reduced.

A description is now given of the shape of the mesa structure. If the side walls of a mesa structure slope downward with an angle smaller than 55° with respect to the surface of the substrate, a semiconductor layer grown on the side walls of the mesa does not form the (111)B surface. In this case, the effects of the present invention are not achieved. In the present invention, the shape of the mesa structure is restricted as follows.

(1) A mesa structure having side walls sloping downward with an angle in a range from 55° to 90° with respect to the surface of the substrate.

(2) A mesa structure having side walls, upper end parts of which form an angle in a range from 55° to 90° with respect to the surface of the substrate, and sloping downward in an arc in the vicinity of the bottom of the mesa.

(3) A mesa structure having an upper part and a lower part, in which side walls of the upper part form an angle in a range from 55° to 90° with respect to the surface of the substrate and side walls of the lower part slope downward with drawing an arc.

When the leakage current path width is controlled by forming the (221)B surface on the mesa structure shown in FIG. 31, if the inclination of the upper end part of the mesa with respect to the surface of the substrate is smaller than 70°, the (221)B surface is not formed. Therefore, the wet etching should be carried out so that the inclination may be larger than 70°.

Figure 27:
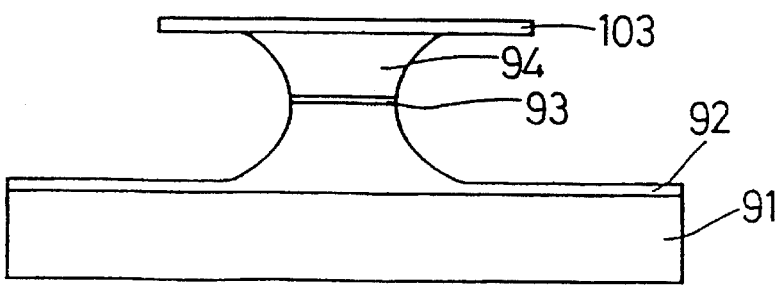
FIG. 27 is a sectional view illustrating a mesa structure in a method for fabricating a semiconductor laser according to an eighth embodiment of the present invention.

A description is given of an eighth embodiment of the present invention. FIG. 27 is a sectional view illustrating a reverse mesa structure formed using the $Br_2:CH_3OH$ system etchant. In the FIG., the same reference numerals as those in FIGS. 24(*a*)–24(*d*) designate the same parts. When mesa embedding crystal layers are successively grown on the p type InP buffer layer 92 contacting opposite sides of the mesa in the similar manner as described with respect to the sixth and seventh embodiments, the growth proceeds without forming the first reactive current path 230 shown in FIG. 53. In this method, however, since uneven surfaces are formed on opposite sides of the mesa as already described with respect to FIG. 34, the controllability of the leakage current path width is poor compared with those of the sixth and seventh embodiments.

However, the influence of the poor controllability of the leakage current path width on the laser characteristics, i.e., the influence of the second reactive current path, is less than the influence of the first reactive current path and, therefore, a semiconductor laser achieved in this seventh embodiment has better characteristics than the conventional semiconductor laser disclosed in Japanese Published Patent Application No. 63-169088.

While in the above-described embodiments InP and InGaAs or InP and InGaAsP are employed as materials of the semiconductor laser, other III-V compound semiconductors may be employed with the same effects as described above.

While in the above-described sixth embodiment a semiconductor laser employing a p type substrate is described, the crystal growth mechanism described in the sixth embodiment may be applied to a fabrication of a semiconductor laser employing an n type substrate.

FIGS. 37(*a*)–37(*e*) are sectional views illustrating process steps in a method for fabricating a semiconductor laser in accordance with a ninth embodiment of the present invention.

Initially, there are successively grown on an n type InP substrate 151 by MOCVD an n type InP cladding layer 152, an undoped InGaAsP active layer 153, a p type InP cladding layer 154, and a p type InGaAsP cap layer 155. Thereafter, an $SiO_2$ film 160 is deposited on the p type InGaAsP cap layer 155 by sputtering. The $SiO_2$ film 160 is formed in a stripe shape along the <110> direction using conventional photolithography and etching technique (FIG. 37(*a*)).

Figure 38:
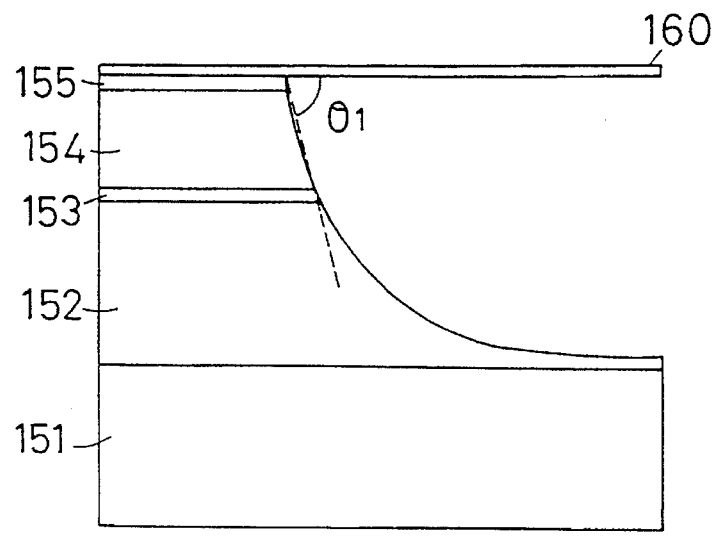
FIG. 38 is a diagram for explaining the shape of the mesa structure in the production method according to the ninth embodiment of the present invention.

Then, using the $SiO_2$ film 160 as a mask, the semiconductor layers are etched with a HBr system etchant, forming a mesa structure of FIG. 37(*b*). The angle ($\Theta_1$ shown in FIG. 38) between the $SiO_2$ film 160 and the side wall of the mesa is about 80°. This angle $\Theta_1$ gradually varies along the side wall of the mesa, and the side wall is parallel to the $SiO_2$ film 160 at the bottom of the mesa.

Then, the mesa structure is embedded with crystal layers grown by MOCVD. More specifically, a p type InP layer 156 and an n type InP layer 157 are successively grown on the n type InP cladding layer 152 contacting opposite sides of the mesa structure. These layers are grown under the same conditions as those in the mesa embedding growth mechanism described for the sixth embodiment of the present invention. The p type InP layer 156 grows forming the (111)B surface 165 and the (221)B surface 166 as shown in FIG. 37(*c*). The growth of the p type InP layer 156 is stopped before the (221)B surface 166 on the side surface of the active layer 153 disappears. Thereafter, the n type InP layer 157 is grown as shown in FIG. 37(*d*).

After removing the SiO₂ film 160 with HF and the p type InGaAsP cap layer 155 with HNO₃, a p type InP cladding layer 158 and a p type InGaAsP contact layer 159 are successively grown over the entire surface of the wafer by MOCVD.

Thereafter, ohmic electrodes 161 are formed on the p type InGaAsP contact layer 159 and on the rear surface of the substrate 151, and the wafer is cleaved so that the (110) surface is exposed at the resonator facet of the Fabry Perot resonator, completing a semiconductor laser. The fabricated semiconductor laser is illustrated in FIG. 39.

Figure 39:
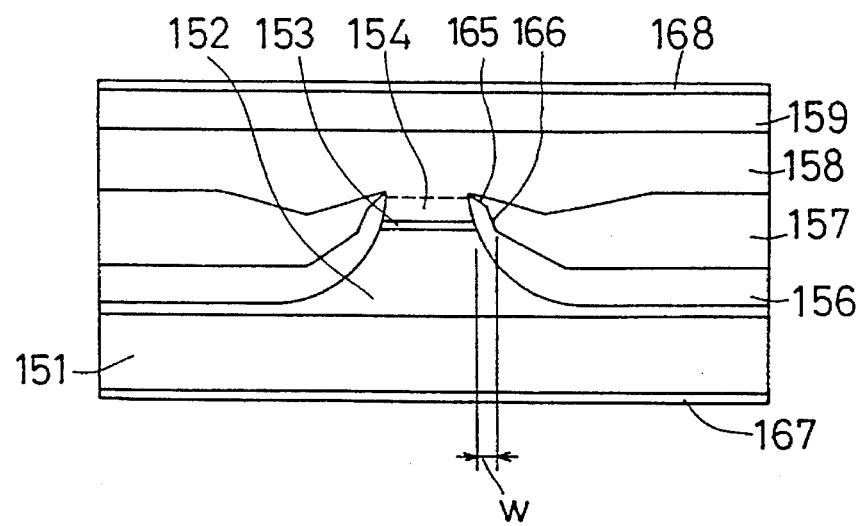
FIG. 39 is a sectional view illustrating a semiconductor laser fabricated according to the process steps illustrated in FIGS. 37(a)–37(e).

In the laser structure of FIG. 39, the width of the reactive current path depends on the width W of the p type InP current blocking layer 156 on the side of the InGaAsP active layer 153. In this ninth embodiment, since the growth of the p type InP current blocking layer 156 corresponds to the growths of the crystal layers 130 and 131 shown in FIGS. 32(*a*) and 32(*b*), the (221)B surface, on which the crystal growth hardly proceeds, is formed on opposite sides of the active layer. Therefore, the width W of the p type InP current blocking layer 156 at the side of the active layer 153 can be reduced to around 0.1 μm, resulting in a significant reduction of the reactive current. According to this ninth embodiment, a buried heterojunction type semiconductor laser employing an n type substrate and having improved characteristics at high power operation is fabricated with high reproducibility.

While in the above-described ninth embodiment the (221)B surface is formed on the side of the active layer, the crystal surface formed on the side of the active layer, on which no crystal growth proceeds, depends on the inclination angle of the side wall of the mesa and the like. If the inclination angle of the crystal surface, i.e., the angle formed between the crystal surface and the plane surface of the laminated structure, is larger than the inclination angle of the (111)B surface and smaller than 90°, the same effects as described above are attained.

While in the above-described ninth embodiment the trapezoidal mesa structure is employed, the rectangular mesa structure shown in FIG. 26(*a*) may be employed. In this case, the mesa embedding growth proceeds as illustrated in FIGS. 29(*a*)–29(*d*). Therefore, if the p type InP current blocking layer is grown in the step of growing the crystal layer 120 (FIG. 29(*a*)), the width of the p type InP current blocking layer at the side of the active layer can be reduced. As the result, a buried heterojunction semiconductor laser employing an n type substrate and having improved characteristics at the high power operation is fabricated with high reproducibility.

A description is given of a tenth embodiment of the present invention. In the above-described sixth embodiment, when the p type InP layer 96 is grown contacting the opposite sides of the mesa structure formed by etching, the substrate temperature is increased to the crystal growth temperature, i.e. 625° C. while adding only PH₃ to prevent the thermal deteriorations of the substrate and the cladding layers. This process adversely affects the side surfaces of the InGaAsP active layer 93 exposed at the side walls of the mesa structure, for example, desorption of As or substitution of As with P occurs. The thermally deteriorated side surfaces of the active layer adversely affect the qualities of the crystal layers, i.e., current blocking layers, grown thereon, producing reactive current that reduces the reliability of the laser.

In this tenth embodiment of the present invention, the thermal deterioration of the side surfaces of the active layer during heating the substrate is avoided to achieve a highly reliable semiconductor laser with improved characteristics. A method for fabricating such a laser is illustrated in FIGS. 40(*a*)–40(*d*).

Figure 40:
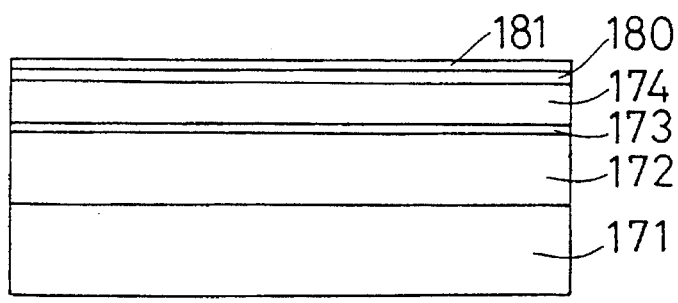
FIGS. 40(a)–40(d) are sectional views illustrating a method for fabricating a semiconductor laser in accordance with a tenth embodiment of the present invention.
Figure 40:
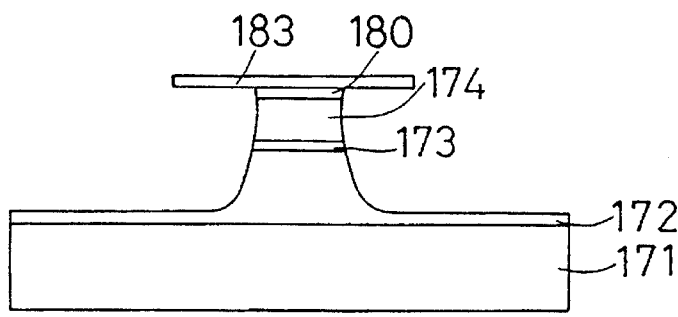
Figure 40:
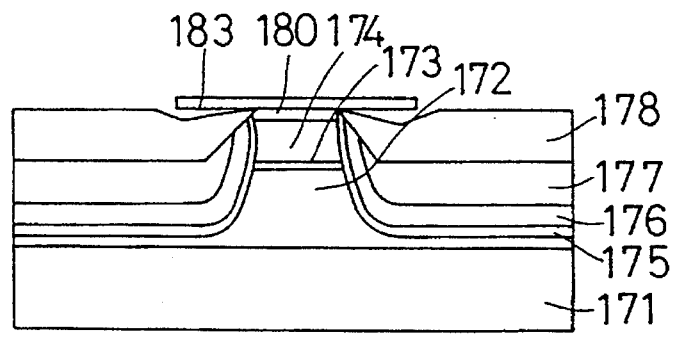
Figure 40:
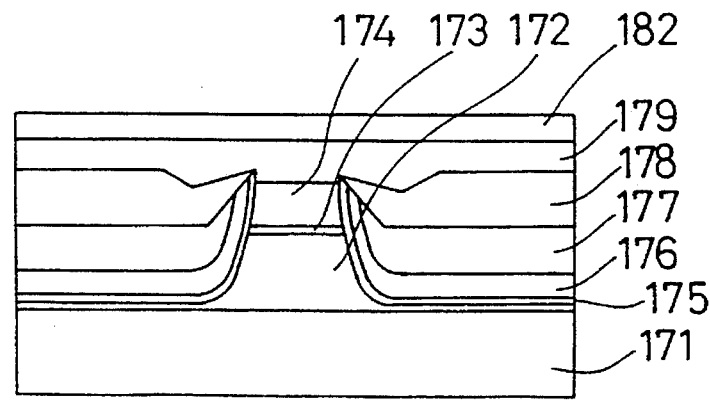

Initially, as illustrated in FIG. 40(*a*), there are successively grown on a p type InP substrate 171 (Zn doped, carrier concentration of $5\times10^{18}$ cm⁻³ (001) surface orientation) a p type InP buffer layer 172 (Zn doped, carrier concentration of $1\times10^{18}$ cm⁻³ 2 μm thick) an undoped InGaAsP active layer 173 (λ=1.3 μm, 0.1 μm thick), an n type InP first upper cladding layer 174 (S doped, carrier concentration of $1\times10^{18}$ cm⁻³, 0.7 μm thick) an n type InGaAs cap layer 180 (S doped, carrier concentration of $1\times10^{18}$ cm⁻³, 0.1 μm thick), and an n type InP cap layer 181 (S doped, carrier concentration of $1\times10^{18}$ cm⁻³, 0.1 μm thick).

These layers are grown by MOCVD. Trimethylindium (TMIn), triethylgallium (TEGa), phosphine (PH₃), arsine (ASH₃), hydrogen sulfide (H₂S), and diethylzinc (DEZn) are employed as source materials. The MOCVD growth is carried out at a growth temperature of 625° C. and a growth pressure of 50 torr. The ratio of V/III is 100.

After selectively removing the n type InP cap layer 181 using HCl, an SiO₂ film 183 is deposited on the n type InGaAs cap layer 180 by sputtering. Then, the SiO₂ film 183 is formed in a stripe shape having a width of 5 μm and extending along the <110> direction by conventional photolithographic techniques. Using the stripe-shaped SiO₂ film 103 as a mask, the wafer is etched with a mixture of HBr:H₂O₂:H₂O (=2:1:10), which is heated to 20° C., for 16 minutes, whereby a stripe-shaped mesa structure having a trapezoidal cross section and a depth of 2.5 μm is attained as shown in FIG. 40(*b*).

Thereafter, a mesa embedding growth is carried out by MOCVD (FIG. 40(*c*)). During the growth, the substrate is heated while adding PH₃ and, when the substrate temperature reaches 400° C., a p type InP layer 175 (Zn doped, carrier concentration of $0.8\times10^{18}$ cm⁻³, 0.05 μm thick on flat surface) is grown on the p type InP buffer layer 172 contacting opposite side walls of the mesa structure. When the substrate temperature reaches 625° C., a first p type InP layer 176 (Zn doped, carrier concentration of $0.8\times10^{18}$ cm⁻³, 0.7 μm thick on flat surface) an n type InP layer 177 (S doped, carrier concentration of $7\times10^{18}$ cm⁻³, 0.8 μm thick on flat surface), and a second p type InP layer 178 (Zn doped, carrier concentration of $0.8\times10^{18}$ cm⁻³, 1 μm thick on flat surface) are successively grown on the p type InP layer 175 at opposite sides of the mesa structure.

After removing the SiO₂ mask 183 with HF and the n type InGaAs cap layer 180 with HNO₃, an n type InP second upper cladding layer 179 (S doped, carrier concentration of $1\times10^{18}$ cm⁻³, 15 μm thick) and an n type InP contact layer 182 (S doped, carrier concentration of $7\times10^{18}$ cm⁻³, 0.5 μm thick) are deposited over the wafer to flatten the surface of the wafer (FIG. 40(*d*)).

Figure 41:
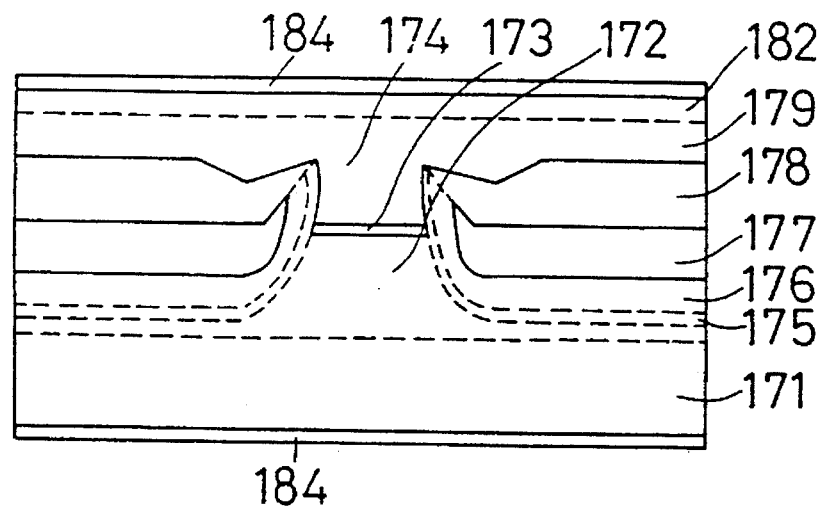
FIG. 41 is a sectional view illustrating a semiconductor laser fabricated according to the process steps illustrated in FIGS. 40(a)–40(d).

Thereafter, ohmic electrodes 184 are formed on the n type InP contact layer 182 and on the rear surface of the substrate 171, and the wafer is cleaved so that the (110) surface is exposed at the facet of the Fabry Perot resonator, completing the semiconductor laser. The fabricated laser is illustrated in FIG. 41.

A description is given of the operation. When a forward bias voltage is applied across the p type InP substrate 171 and the n type InP upper cladding layer 179, charge carriers in the respective layers 171 and 179, i.e., holes and electrons, are injected into the InGaAsP active layer 173 and recombine to generate light, resulting in laser oscillation. Since the first p type InP layer 176, the n type InP layer 177, and the second p type InP layer 178 are present on opposite sides of the mesa structure, both side walls of the InGaAsP active layer 173 are embedded with InP having a refractive index smaller than that of InGaAsP, so that the light generated in the active layer 173 is effectively confined in the active layer. In addition, since a reverse bias junction is formed by the n type InP layer 177 and the p type InP layer 178, the current path is narrowed and the charge carriers are injected in the active layer 203 with high efficiency.

Figure 42:
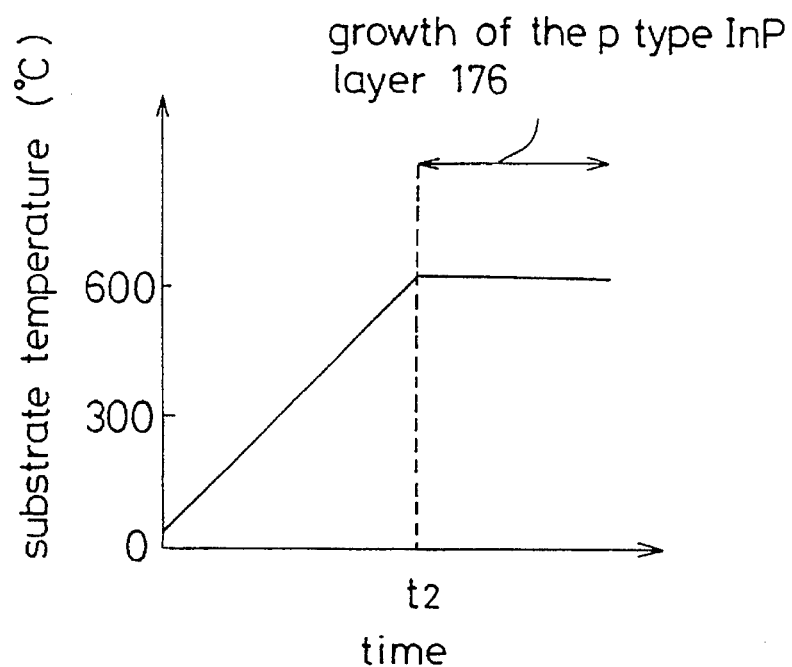
FIGS. 42(a) and 42(b) are diagrams illustrating mesa embedding growth sequences employed in the production methods of semiconductor lasers according to the sixth and tenth embodiments of the present invention, respectively.
Figure 42:
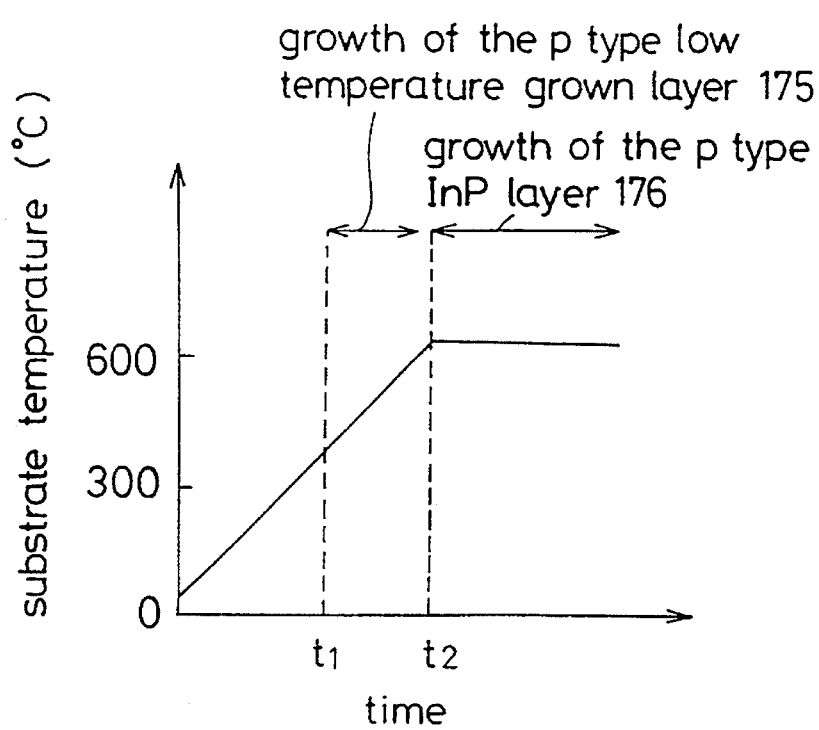

The effects of the tenth embodiment of the present invention will be described on the basis of the result of an experiment in which an InP layer is regrown on an InGaAsP layer which is grown on a (001) surface of an InP substrate according to different growth sequences by MOCVD. FIG. 42(*a*) illustrates a growth sequence of the mesa embedding growth according to the sixth embodiment of the present invention, and FIG. 42(*b*) illustrates a growth sequence of the mesa embedding growth according to the tenth embodiment of the present invention.

Figure 43:
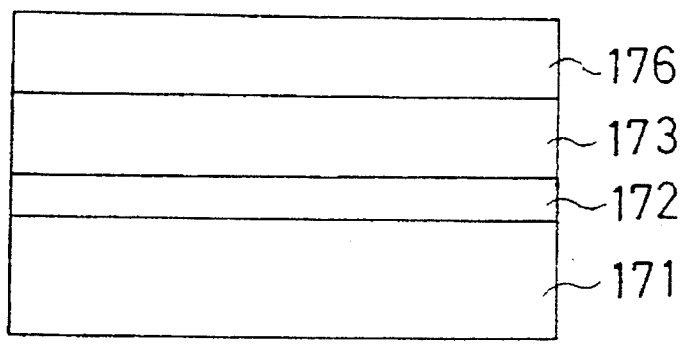
FIGS. 43(a)–43(d) are diagrams for explaining results of experiments in which an InP layer is grown on an InGaAsP layer according to the two different growth sequences shown in FIGS. 42(a) and 42(b).
Figure 43:
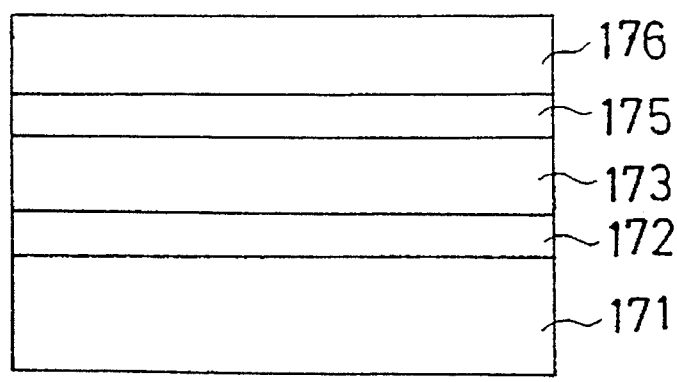
Figure 43B:
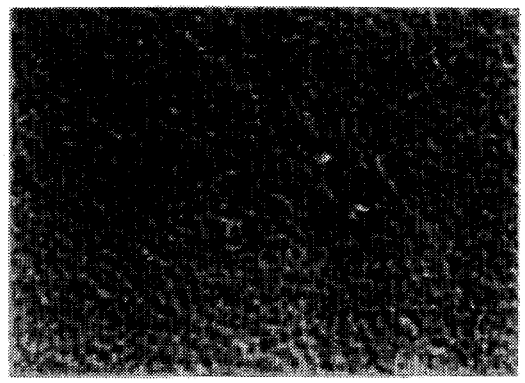
Figure 43D:
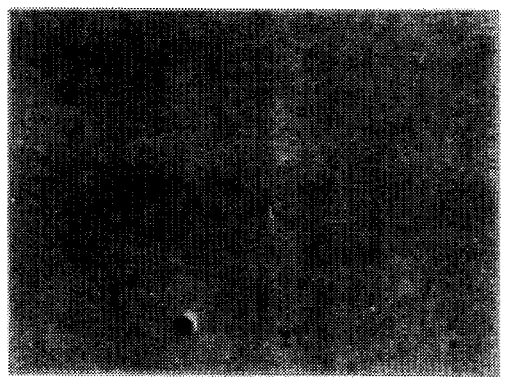

In the experiment, the regrowth of the InP layer on the InGaAsP layer is carried out according to the different sequences respectively shown in FIGS. 42(*a*) and 42(*b*). During rising of the temperature, only $PH_3$ is introduced into the reactor. FIGS. 43(*a*)–43(*d*) are diagrams for explaining the results of the experiment, in which FIGS. 43(*a*) and 43(*b*) show a sectional structure and a surface state of the regrown layer according to the growth sequence of FIG. 42(*a*) and FIGS. 43(*c*) and 43(*d*) show a sectional structure and a surface state of the regrown layer according to the growth sequence of FIG. 42(*b*).

When the regrowth is carried out according to the growth sequence of FIG. 42(*a*), the surface state of the regrown layer is cloudy as shown in FIG. 43(*b*), i.e., a specular surface is not attained. This is caused by the deteriorated surface of the InGaAsP layer due to the desorption of As or the substitution of As with P during the temperature rise in the $PH_3$ atmosphere. On the other hand, in the mesa embedding growth according to the growth sequence of FIG. 42(*b*), a specular surface of the regrown layer is attained as shown in FIG. 43(*d*), which means that the surface of the InGaAsP layer is not deteriorated during the temperature rise.

While in the above-described tenth embodiment the p type InP low temperature growth layer 175 is grown at the substrate temperature of 400°–625° C. to the thickness of 0.05 μm on the flat surface, the thickness may be in a range from 0.003 μm to 0.3 μm and the growth starting temperature may be in a range from 300° C. to 500° C. The lowest limit of the thickness is fixed at 0.003 μm that is equivalent to the thickness of 10 atomic layers because a 0.003 μm thick layer is enough to suppress the desorption of As from the active layer and the substitution of As with P. The upper limit of the thickness is fixed to 0.3 μm because an InP layer with relatively good crystallinity is attained with the thickness not exceeding 0.3 μm even in the low temperature growth. The lowest limit of the growth starting temperature is fixed to 300° C. because it is difficult to grow an InP layer with good crystallinity at the temperature below 300° C. The upper limit of the growth starting temperature is fixed to 500° C. because the surface of the active layer is not adversely affected very much if the temperature is below 500° C. In order to suppress the deposition of polycrystalline material on the $SiO_2$ film 183 during the low temperature growth, the layer 175 should be thin and the growth rate should be low.

In the above-described tenth embodiment, the low temperature growth layer 175 is started to grow at a substrate temperature of 400° C. and the growth is carried on until the temperature reaches 625° C., i.e., the growth temperature of the mesa embedding layer 176. After starting the growth of the layer 175 at 400° C., the growth may be stopped at the thickness of about 0.01 μm and suspended until the substrate temperature reaches 625° C. while flowing only $PH_3$.

During the growth, HCl gas of 1 SCCM may be added to the source gas to completely prevent the deposition of the polycrystalline material on the $SiO_2$ film 183.

While in the above-described tenth embodiment the p type InP low temperature growth layer 175 is grown by MOCVD, it may be grown by ALE (Atomic Layer Epitaxy) while alternatingly supplying TMIn and $PH_3$. In this case, the crystallinity of the layer 165 is improved.

A description is given of an eleventh embodiment of the present invention. In this eleventh embodiment, $AsH_3$ is introduced into the reactor with $PH_3$ during rising the substrate temperature to prevent the thermal deterioration of the side surfaces of the InGaAsP active layer.

Figure 44:
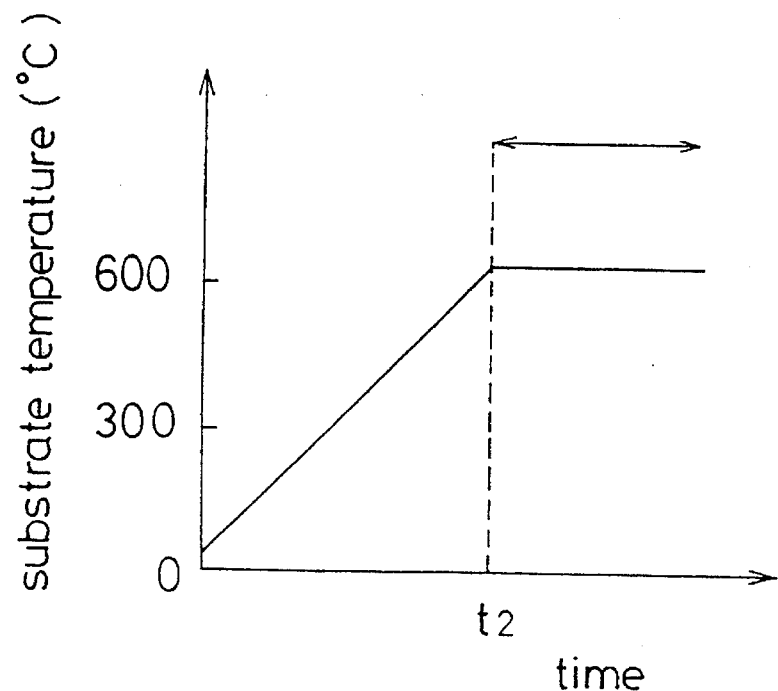
FIGS. 44(a) and 44(b) are diagrams for explaining a method for fabricating a semiconductor laser in accordance with an eleventh embodiment of the present invention.
Figure 44:
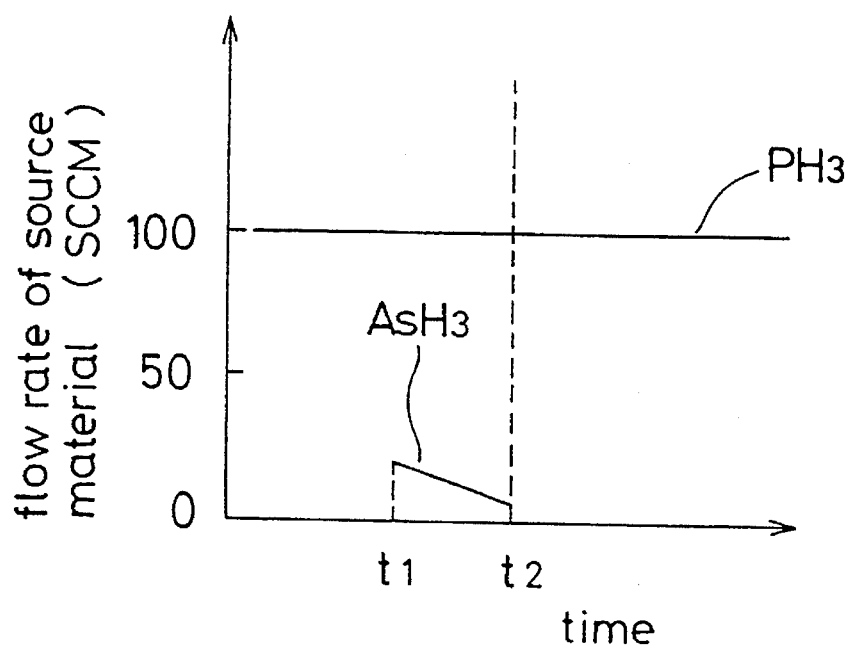
Figure 45:
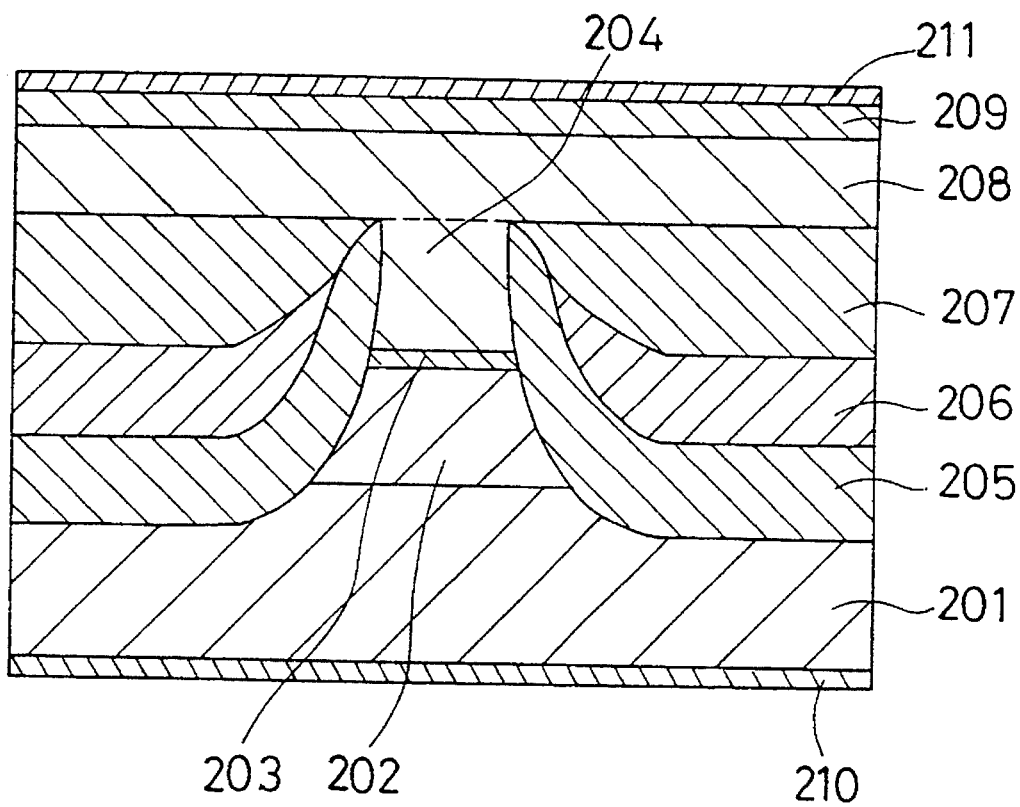
FIG. 45 is a sectional view illustrating a double-channel buried-heterojunction semiconductor laser according to the prior art.
Figure 46:
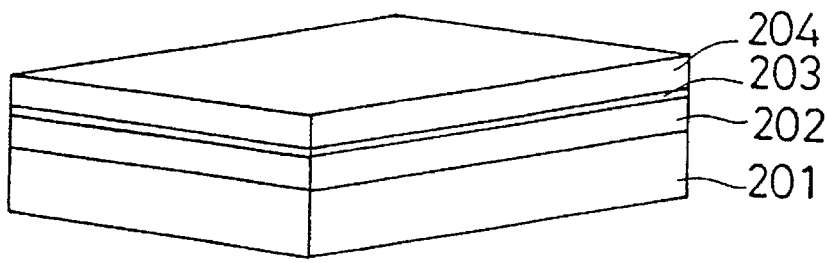
FIGS. 46(a)–46(d) are perspective views illustrating a method for fabricating the semiconductor laser of FIG. 45.
Figure 46:
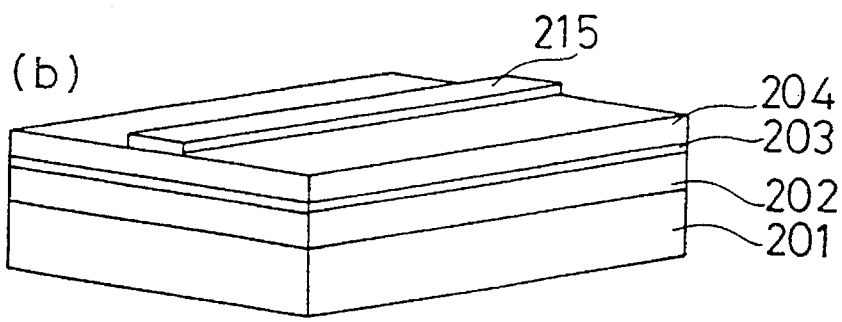
Figure 46:
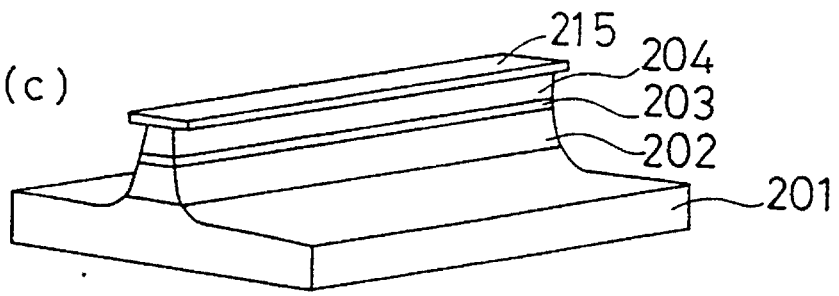
Figure 46:
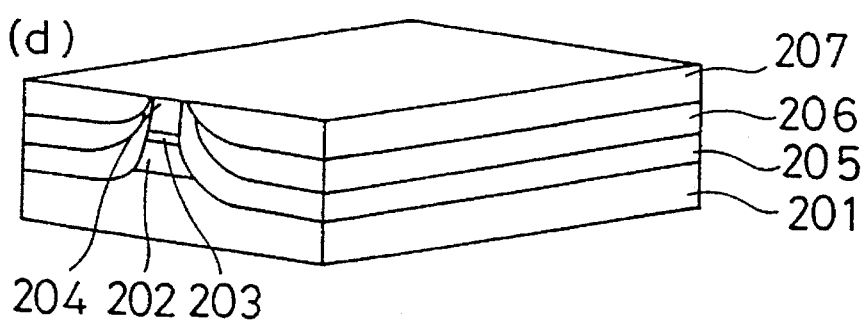
Figure 47:
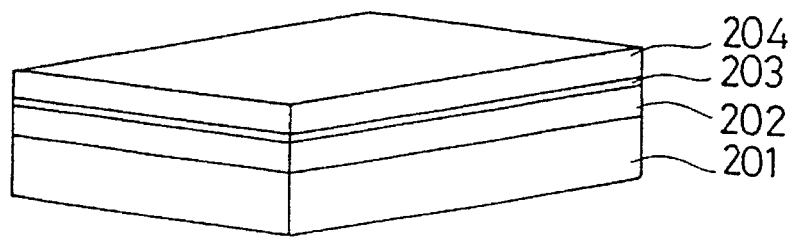
FIGS. 47(a)–47(d) are perspective views illustrating another method for fabricating the semiconductor laser of FIG. 45.
Figure 47:
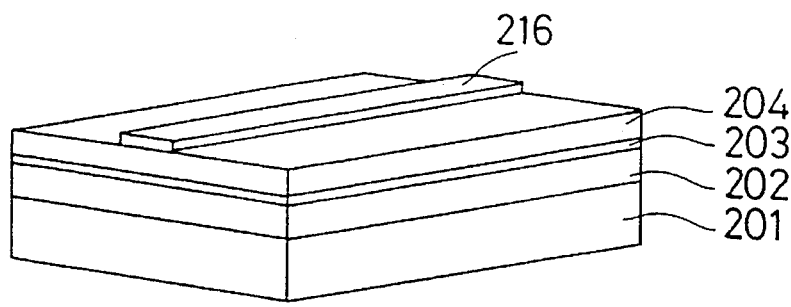
Figure 47:
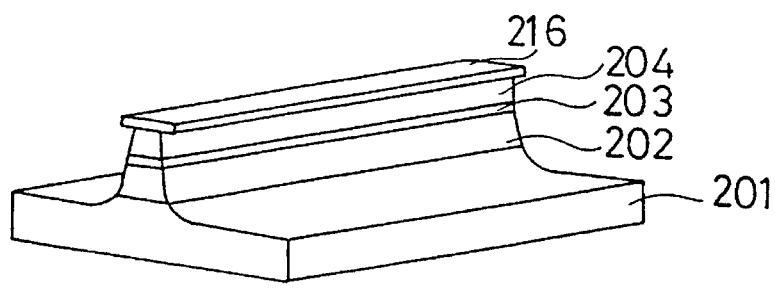
Figure 47:
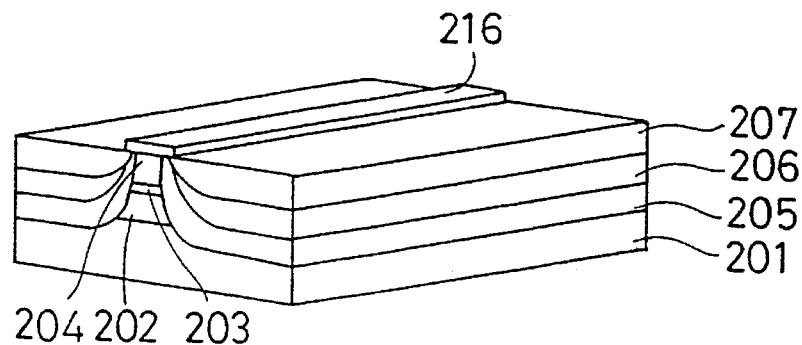

FIGS. 44(*a*) and 44(*b*) are diagrams for explaining a method for fabricating a semiconductor laser in accordance with the eleventh embodiment of the present invention. When the p type InP first mesa embedding layer is directly grown on the substrate or the cladding layer without interposing the p type InP low temperature growth layer as shown in FIG. 44(*a*), a group V source gas is added while raising the temperature as shown in FIG. 44(*b*), whereby not only the thermal deterioration of the InP substrate and cladding layer but also the thermal deterioration of the InGaAsP active layer is prevented. If $AsH_3$ is excessively supplied, the surface of the InP layer is deteriorated. Therefore, the supply of $AsH_3$ should be started from the temperature at which the desorption of As starts and should be stopped before the growth of the p type InP first embedding layer 176. The supply rate of $AsH_3$ to $PH_3$ should be lower than the supply rate for growing the InGaAsP active layer. Since the variation in the decomposition ratio of $PH_3$ due to the substrate temperature is different from that of $ASH_3$, in order to maintain a uniform ratio of P pressure to As pressure on the surface of the substrate, the supply rate of $PH_3$ to $AsH_3$ should be varied according to the substrate temperature. In FIG. 44(*b*), $PH_3$ is supplied at 100 SCCM from the start of the temperature rise. On the other hand, the supply of $AsH_3$ is started at 20 SCCM when the substrate temperature exceeds 400° C. ($t_1$), and it is carried on while gradually decreasing the supply rate of $AsH_3$ until the substrate temperature reaches the mesa embedding growth starting temperature, i.e., 625° C. ($t_2$). The supply rate of $AsH_3$ at $t_2$ is 10 SCCM.

While in the above-described tenth and eleventh embodiments the first p type InP layer 176, the n type InP layer 177, and the second p type InP layer 178 are grown in the mesa embedding growth, the methods of these embodiments may be applied to a growth of a semi-insulating layer or a growth of a plurality of layers including a semi-insulating layer.

While in the above-described tenth and eleventh embodiments the mesa structure with trapezoidal cross section is employed, the shape of the mesa structure is not restricted thereto. The rectangular mesa structure according to the seventh embodiment and the mesa structure with the reverse mesa-shaped upper portion according to the eighth embodiment may be employed.

While in a above-described tenth and eleventh embodiments the semiconductor laser fabricated on the p type InP substrate is employed, a semiconductor laser fabricated on an n type InP substrate may be employed with the same effects as described above.

What is claimed is:

1. A method for fabricating a semiconductor laser comprising:

successively growing semiconductor layers including an active layer on a p type semiconductor substrate with a substantially (100) surface orientation;

forming said semiconductor layers in a stripe mesa shape along a <110> direction;

growing a p type first semiconductor layer on opposite sides of said stripe mesa by MOCVD, forming a (111)B surface on opposite sides of an upper part of the mesa; and growing an n type second semiconductor layer on said first semiconductor layer so that the surface of said second semiconductor layer grown from the bottom of the stripe mesa is not in contact with said (111)B surface at the opposite sides of the stripe mesa.

2. The method of claim 1 wherein said stripe shape mesa is a mesa having side walls sloping downward with an angle in a range from 55° to 90° with respect to the surface of the substrate, or a mesa having side walls, upper end parts of which form an angle in a range from 55° to 90° with respect to the surface of the substrate, and sloping downward with drawing an arc, or a mesa having an upper part and a lower part in which side walls of the upper part form an angle in a range from 55° to 90° with respect to the surface of the substrate and side walls of the lower part slope downward with drawing an arc.

3. The method of claim 1 wherein said p type and n type semiconductor layers comprise InP and said active layer comprises one of InGaAsP and InGaAs.

4. The method of claim 2 wherein said p type and n type semiconductor layers comprise InP and said active layer comprises one of InGaAsP and InGaAs.

5. A method for fabricating a semiconductor laser comprising:

growing a plurality of semiconductor layers including an active layer on an n type semiconductor substrate with a substantially (100) surface orientation;

forming said semiconductor layers in a stripe mesa along a <110> direction;

growing a p type semiconductor layer on opposite sides of the mesa by MOCVD, said p type semiconductor layer having a (111)B surface at opposite sides of an upper part of the mesa structure forming a first angle with a plane surface of said mesa, and having a crystal surface at opposite sides of said active layer, the crystal surface forming a second angle with the plane surface of said mesa, said second angle being larger than said first angle and smaller than 90°.

6. The semiconductor laser of claim 5 wherein said stripe shape mesa is a mesa having side walls sloping downward with an angle in a range from 55° to 90° with respect to the surface of the substrate, or a mesa having side walls, upper end parts of which form an angle in a range from 55° to 90° with respect to the surface of the substrate, and sloping downward with drawing an arc, or a mesa having an upper part and a lower part in which side walls of the upper part form an angle in a range from 55° to 90° with respect to the surface of the substrate and side walls of the lower part slope downward with drawing an arc.

7. The method of claim 5 wherein said p type and n type semiconductors are InP and said active layer comprises one of InGaAsP and InGaAs.

8. The method of claim 6 wherein said p type and n type semiconductors are InP and said active layer comprises one of InGaAsP and InGaAs.

* * * * *